United States Patent
Yun et al.

(10) Patent No.: US 11,626,537 B2
(45) Date of Patent: Apr. 11, 2023

(54) PIXEL AND DISPLAY DEVICE HAVING THE SAME

(71) Applicant: Samsung Display Co., Ltd., Yongin-si (KR)

(72) Inventors: Hae Ju Yun, Yongin-si (KR); Yong Sub Shim, Yongin-si (KR); Sang Woo Ha, Yongin-si (KR); Jin Yool Kim, Yongin-si (KR); Min Seong Yi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 47 days.

(21) Appl. No.: 17/188,875

(22) Filed: Mar. 1, 2021

(65) Prior Publication Data

US 2021/0367104 A1   Nov. 25, 2021

(30) Foreign Application Priority Data

May 20, 2020   (KR) ......................... 10-2020-0060568

(51) Int. Cl.
*H01L 33/24*   (2010.01)
*H01L 33/38*   (2010.01)
*H01L 33/60*   (2010.01)

(52) U.S. Cl.
CPC ............ *H01L 33/24* (2013.01); *H01L 33/387* (2013.01); *H01L 33/60* (2013.01)

(58) Field of Classification Search
CPC ........ H01L 33/24; H01L 33/387; H01L 33/60
See application file for complete search history.

(56) References Cited

U.S. PATENT DOCUMENTS

| | | | |
|---|---|---|---|
| 9,245,463 B2 | 1/2016 | Lee et al. | |
| 2018/0012876 A1* | 1/2018 | Kim | ...................... H01L 33/325 |
| 2019/0086587 A1* | 3/2019 | Qu | ........................ G02B 5/0242 |
| 2019/0115508 A1* | 4/2019 | Lin | ...................... H01L 25/167 |
| 2019/0172819 A1* | 6/2019 | Bae | ......................... H01L 33/20 |
| 2020/0020741 A1* | 1/2020 | Woo | .................... H01L 25/0753 |
| 2021/0327862 A1 | 10/2021 | Bae et al. | |

FOREIGN PATENT DOCUMENTS

| | | |
|---|---|---|
| JP | 2014-75550 A | 4/2014 |
| KR | 10-2018-0007025 A | 1/2018 |
| KR | 10-2020-0008075 A | 1/2020 |
| KR | 10-2021-0129790 A | 10/2021 |

* cited by examiner

*Primary Examiner* — Mark W Tornow
(74) *Attorney, Agent, or Firm* — Lewis Roca Rothgerber Christie LLP

(57) ABSTRACT

A display device includes a pixel located in a display area, the pixel including: a first electrode and a second electrode spaced from each other on a base layer; a first insulating layer and a second insulating layer sequentially stacked on the first electrode and the second electrode; a light emitting element on the second insulating layer and located between the first electrode and the second electrode; and a light control layer interposed between the first insulating layer and the second insulating layer and overlapping the light emitting element.

17 Claims, 28 Drawing Sheets

FIG. 3A
FIG. 3B
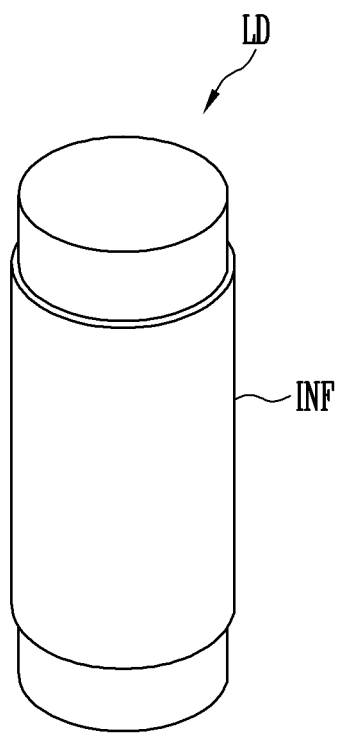
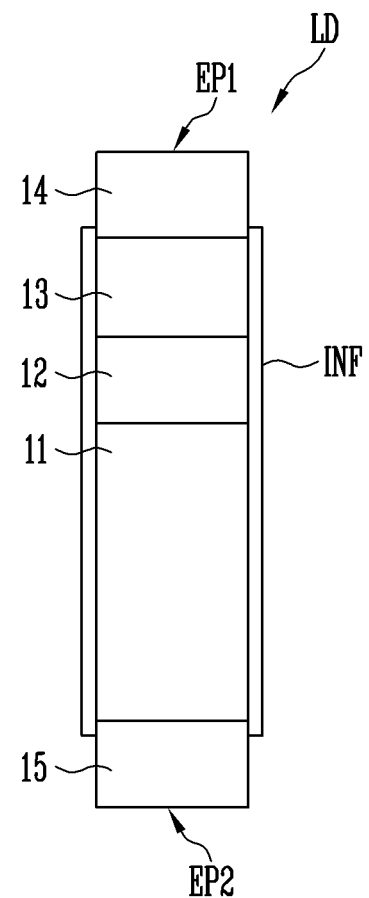

FIG. 4A
FIG. 4B
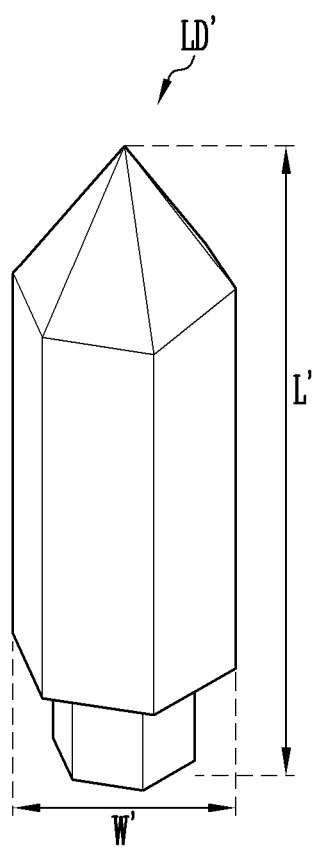
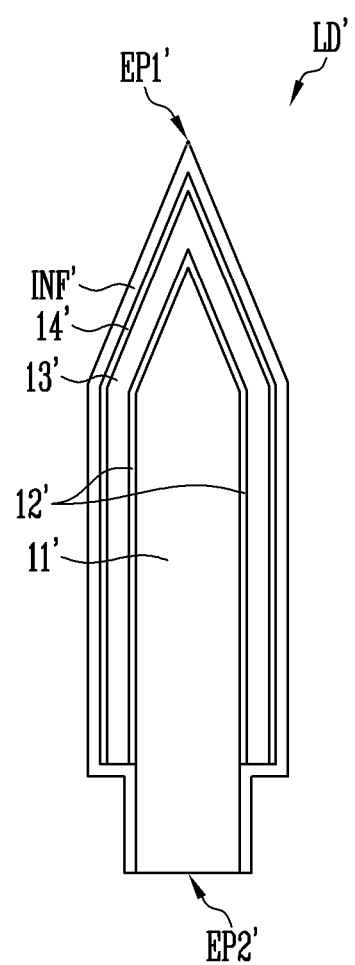

PIXEL AND DISPLAY DEVICE HAVING THE SAME

CROSS-REFERENCE TO RELATED APPLICATION

This application claims priority to and the benefit of Korean Patent Application No. 10-2020-0060568, filed on, May 20, 2020, the content of which in its entirety is herein incorporated by reference.

BACKGROUND

1. Field

The disclosure relates to a pixel and a display device including the same.

2. Description of the Related Art

In recent years, a technology of manufacturing a micro light emitting element using a material of an inorganic crystal structure having high reliability, and manufacturing a light emitting device using the light emitting element is being developed. For example, a technology of manufacturing a plurality of micro light emitting elements having a size as small as nano scale to micro scale and configuring a light source of various light emitting devices including a pixel of a display device using the micro light emitting elements is being developed.

SUMMARY

A technical aspect of the disclosure is to provide a pixel including a light emitting element, and a display device including the same.

A display device according to one or more example embodiments of the disclosure includes a pixel located in a display area. The pixel includes a first electrode and a second electrode spaced from each other on a base layer, a first insulating layer and a second insulating layer sequentially stacked on the first electrode and the second electrode, a light emitting element on the second insulating layer and located between the first electrode and the second electrode, and a light control layer interposed between the first insulating layer and the second insulating layer and overlapping the light emitting element.

The light control layer may be located under the light emitting element and overlapping at least an active layer of the light emitting element.

The light control layer may have a width greater than a distance between the first electrode and the second electrode.

The second insulating layer may have a thickness equal to or greater than a thickness of the light control layer, the second insulating layer may completely cover the light control layer.

The light control layer may include a reflective layer.

The reflective layer may include a floated metal pattern.

The reflective layer may include at least one of aluminum (Al), gold (Au), and silver (Ag).

The light control layer may include a scattering layer including at least one type of light scattering particles.

The light control layer may include a reflective layer on the first insulating layer, and a scattering layer on the reflective layer.

The light emitting element may include a first end portion adjacent to the first electrode and a second end portion adjacent to the second electrode, wherein the pixel may further include a third electrode connecting the first end portion of the light emitting element to the first electrode, and a fourth electrode connecting the second end portion of the light emitting element to the second electrode.

The display device may further include at least one of a third insulating layer locally placed on one area of the light emitting element to expose the first end portion and the second end portion of the light emitting element, a fourth insulating layer on the third insulating layer and the fourth electrode, and a fifth insulating layer on the first to fourth electrodes and the light emitting element.

The display device may further include at least one of a first bank under one area of each of the first electrode and the second electrode, and a second bank surrounding an emission area of the pixel, the light emitting element being in the emission area.

The display device may further include a circuit layer interposed between the base layer and the first and second electrodes, the circuit layer including a circuit element connected to the light emitting element.

A pixel according to an embodiment of the disclosure includes a first electrode and a second electrode spaced from each other, a first insulating layer and a second insulating layer sequentially stacked on the first electrode and the second electrode, a light emitting element on the second insulating layer and located between the first electrode and the second electrode, and a light control layer interposed between the first insulating layer and the second insulating layer and overlapping the light emitting element.

The light control layer may include a reflective layer.

The light control layer may include a scattering layer including at least one type of light scattering particles.

The light control layer may include a reflective layer on the first insulating layer, and a scattering layer on the reflective layer.

The pixel according to various embodiments of the disclosure includes the light control layer under the light emitting element so as to overlap the light emitting element. The light control layer recycles light so that the light emitted to a lower portion of the light emitting element may be emitted in an upper direction of the pixel. According to the pixel and the display device including the same, light efficiency of the pixel may be improved.

BRIEF DESCRIPTION OF THE DRAWINGS

The above and other features of the disclosure will become more apparent by describing in further detail embodiments thereof with reference to the accompanying drawings, in which:

FIGS. 3A and 3B are a perspective view and a cross-sectional view illustrating a light emitting element according to one or more example embodiments of the present disclosure;

FIGS. 4A and 4B are a perspective view and a cross-sectional view illustrating a light emitting element according to one or more example embodiments of the present disclosure;

DETAILED DESCRIPTION

Figure 1A:
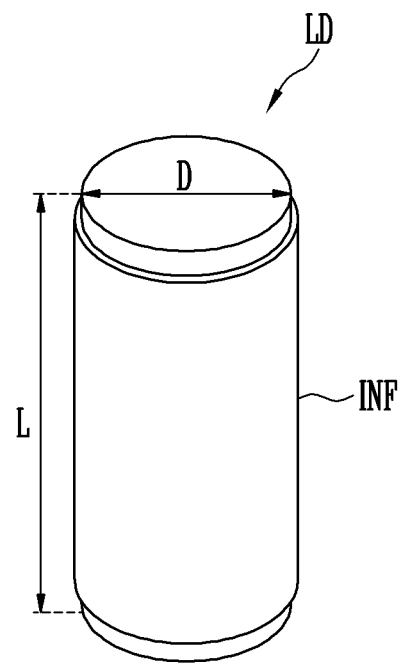
FIGS. 1A and 1B are a perspective view and a cross-sectional view illustrating a light emitting element according to one or more example embodiments of the present disclosure.

The disclosure may be modified in various ways and may have various forms, and specific embodiments will be illustrated in the drawings and described in detail herein. In the following description, the singular forms also include the plural forms unless the context clearly includes the singular.

Meanwhile, the disclosure is not limited to the embodiments disclosed below, and may be modified in various forms and may be implemented. In addition, each of the embodiments disclosed below may be implemented alone or in combination with at least one of other embodiments.

In the drawings, some components which are not directly related to a characteristic of the disclosure may be omitted to clearly represent the disclosure. In addition, some components in the drawings may be shown to be exaggerated in size or proportion. Throughout the drawings, the same or similar components will be given by the same reference numerals and symbols as much as possible even though they are shown in different drawings, and repetitive descriptions will be omitted.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

In some embodiments, one or more outputs of the different embodiments of the methods and systems of the present disclosure may be transmitted to an electronics device coupled to or having a display device for displaying the one or more outputs or information regarding the one or more outputs of the different embodiments of the methods and systems of the present disclosure.

FIGS. 1A and 1B, 2A and 2B, and 3A and 3B are perspective views and cross-sectional views, respectively, illustrating a light emitting element LD according to one or more example embodiments of the present disclosure. FIGS. 1A-3B illustrate a rod-shaped light emitting element LD having a circular column shape, but a type and/or a shape of the light emitting element LD according to the disclosure are/is not limited thereto.

Referring to FIGS. 1A-3B, the light emitting element LD includes a first semiconductor layer 11 and a second semiconductor layer 13, and an active layer 12 interposed between the first and second semiconductor layers 11 and 13. For example, the light emitting element LD may include the first semiconductor layer 11, the active layer 12, and the second semiconductor layer 13 sequentially stacked along a length L direction.

The light emitting element LD may be provided in a rod shape extending along one direction. When an extension direction of the light emitting element LD is the length L direction, the light emitting element LD may have a first end portion EP1 and a second end portion EP2 along the length L direction.

One of the first and second semiconductor layers 11 and 13 may be disposed on the first end portion EP1 of the light emitting element LD. In addition, the other one of the first and second semiconductor layers 11 and 13 may be disposed on the second end portion EP2 of the light emitting element LD.

According to some embodiments, the light emitting element LD may be a rod-shaped light emitting element (also referred to as a "rod-shaped light emitting diode") manufactured in a rod shape through an etching method or the like. In the present disclosure, the term "rod-shaped" encompasses a rod-like shape or a bar-like shape that is long (i.e., a shape having an aspect ratio greater than 1) in the length L direction, such as a circular column or a polygonal column, and a shape of a cross section thereof is not particularly limited. For example, the length L of the light emitting element LD may be greater than a diameter D (or a width of the cross section) thereof.

The light emitting element LD may have a size as small as nano scale to micro scale. For example, the light emitting element LD may have the diameter D (or width D) and/or the length L in a nano-scale to micro scale range. However, a size of the light emitting element LD is not limited thereto in the disclosure. For example, the size of the light emitting element LD may be variously changed according to design condition of various devices using a light emitting device using the light emitting element LD as a light source, for example, a display device.

The first semiconductor layer 11 may be a semiconductor layer of a first conductivity type. For example, the first semiconductor layer 11 may include at least one N-type semiconductor layer. For example, the first semiconductor layer 11 may include any one semiconductor material from among InAlGaN, GaN, AlGaN, InGaN, AlN, and InN, and may include an N-type semiconductor layer doped with a first conductive dopant such as Si, Ge, or Sn. However, the material configuring the first semiconductor layer 11 is not limited thereto, and various materials in addition to the above-described materials may configure the first semiconductor layer 11.

The active layer 12 may be disposed on the first semiconductor layer 11 and may be formed in a single or multi-quantum well structure. A position of the active layer 12 may be variously changed according to the type of the light emitting element LD. The active layer 12 may emit light having a wavelength of 400 nm to 900 nm, and may use a double heterostructure.

A clad layer (not shown) doped with a conductive dopant may be formed on and/or under the active layer 12. For example, the clad layer may be formed of an AlGaN layer or an InAlGaN layer. According to some embodiments, a material such as AlGaN or AlInGaN may be used to form the active layer 12, and various materials in addition to the above-described materials may configure the active layer 12.

The second semiconductor layer 13 may be disposed on the active layer 12 and may include a semiconductor layer of a type different from that of the first semiconductor layer 11. For example, the second semiconductor layer 13 may include at least one P-type semiconductor layer. For example, the second semiconductor layer 13 may include at least one semiconductor material from among InAlGaN, GaN, AlGaN, InGaN, AlN, and InN, and may include a P-type semiconductor layer doped with a second conductivity type dopant such as Mg. However, the material configuring the second semiconductor layer 13 is not limited thereto, and various materials in addition to the above-described materials may configure the second semiconductor layer 13.

Figure 1B:
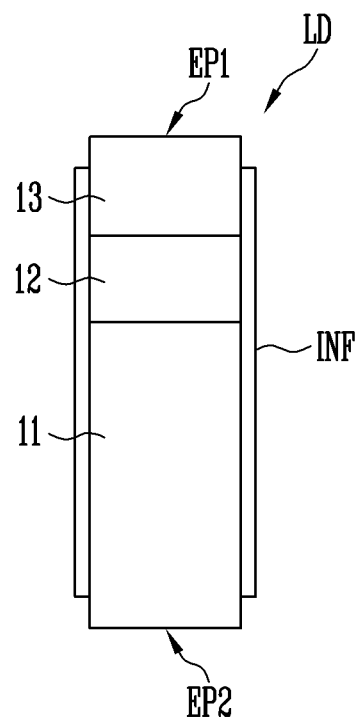

In some embodiments, the first semiconductor layer 11 and the second semiconductor layer 13 may have different lengths (or thicknesses) in the length L direction of the light emitting element LD. For example, the first semiconductor layer 11 may have a length (or a thickness) longer (or thicker) than that of the second semiconductor layer 13 along the length L direction of the light emitting element LD. Accordingly, the active layer 12 of the light emitting element LD may be positioned closer to the first end portion EP1 than the second end portion EP2 as shown in FIGS. 1A and 1B.

When a voltage equal to or greater than a threshold voltage is applied between both end portions of the light emitting element LD, the light emitting element LD emits light while electron-hole pairs are combined in the active layer 12. By controlling light emission of the light emitting element LD using such a principle, the light emitting element LD may be used as a light source of various light emitting devices including a pixel of a display device.

In some embodiments, the light emitting element LD may further include an additional component in addition to the first semiconductor layer 11, the active layer 12, the second semiconductor layer 13 and/or an insulating film INF. For example, the light emitting element LD may additionally include one or more phosphor layers, active layers, semiconductor layers, and/or electrode layers disposed on one end side of the first semiconductor layer 11, the active layer 12, and/or the second semiconductor layer 13.

Figure 2A:
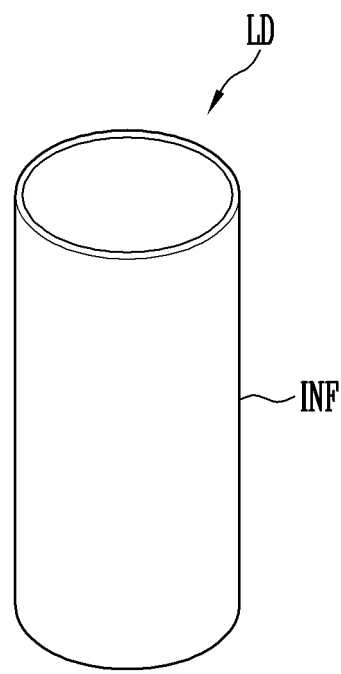
FIGS. 2A and 2B are a perspective view and a cross-sectional view illustrating a light emitting element according to one or more example embodiments of the present disclosure.
Figure 2B:
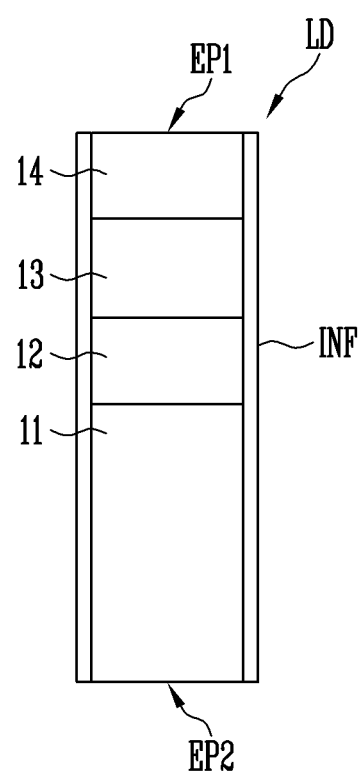

For example, the light emitting element LD may further include an electrode layer 14 disposed on one end side of the second semiconductor layer 13 as shown in FIGS. 2A and 2B. In this case, the electrode layer 14 may be positioned at the first end portion EP1 of the light emitting element LD.

In some embodiments, the light emitting element LD may further include another electrode layer 15 disposed on one end side of the first semiconductor layer 11 as shown in FIGS. 3A and 3B. For example, respective electrode layers 14 and 15 may be disposed on the first and second end portions EP1 and EP2 of the light emitting element LD.

The electrode layers 14 and 15 may be ohmic contact electrodes, but are not limited thereto. For example, the electrode layers 14 and 15 may be Schottky contact electrodes.

In addition, the electrode layers 14 and 15 may include metal or metal oxide. For example, the electrode layers 14 and 15 are formed by chromium (Cr), titanium (Ti), aluminum (Al), gold (Au), nickel (Ni), oxide or alloy thereof, ITO, or the like alone or in combination. The materials included in each of the electrode layers 14 and 15 may be the same or different from each other.

The electrode layers 14 and 15 may be substantially transparent or translucent. Accordingly, light generated in the light emitting element LD may pass through the electrode layers 14 and 15 and may be emitted to the outside of the light emitting element LD. In another embodiment, when the light generated in the light emitting element LD does not pass through the electrode layers 14 and 15 and is emitted to the outside of the light emitting element LD through an area excluding both end portions of the light emitting element LD, the electrode layers 14 and 15 may include an opaque metal.

In some embodiments, the light emitting element LD may further include the insulating film INF provided on a surface. The insulating film INF may be formed on the surface of the light emitting element LD so as to surround at least an outer peripheral surface (e.g., an outer circumferential surface) of the active layer 12, and may further surround one area of the first and second semiconductor layers 11 and 13.

When the light emitting element LD includes the electrode layers 14 and 15, the insulating film INF may at least partially surround an outer peripheral surface (e.g., an outer circumferential surface) of the electrode layers 14 and 15, or may not surround the outer peripheral surface (e.g., an outer circumferential surface) of the electrode layers 14 and 15. As such, the insulating film INF may be selectively formed on the surface of the electrode layers 14 and 15.

The insulating film INF may expose the both end portions of the light emitting element LD on the length L direction of the light emitting element LD. For example, the insulating film INF may expose at least one of the first and second semiconductor layers 11 and 13 and electrode layers 14 and 15 at the first and second end portions EP1 and EP2 of the light emitting element LD. In another embodiment, the insulating film INF may not be provided in the light emitting element LD.

When the insulating film INF is provided to cover the surface of the light emitting element LD, particularly the outer peripheral surface (e.g., an outer circumferential surface) of the active layer 12, the active layer 12 may be prevented from being short-circuited with at least one electrode (for example, a first or second electrode of a pixel) or the like which is not shown. Accordingly, electrical stability of the light emitting element LD may be secured. In describing each embodiment of the disclosure, a term "connection (or access)" may comprehensively mean a physical and/or electrical connection (or access). In addition, this may comprehensively mean a direct or indirect connection (or access) and an integral or non-integral connection (or access).

The insulating film INF may include a transparent insulating material. For example, the insulating film INF may include at least one insulating material from among $SiO_2$ or silicon oxide (SiOx) which is not confirmed thereto, $Si_3N_4$ or silicon nitride (SiNx) which is not confirmed thereto, aluminum oxide ($Al_2O_3$), and titanium dioxide ($TiO_2$), but is not limited thereto. As such, a configuration material of the insulating film INF is not particularly limited, and the insulating film INF may be configured of various insulating materials.

When the insulating film INF is provided on the surface of the light emitting element LD, a surface defect of the light emitting element LD may be reduced or minimized, and thus life and efficiency may be improved. In addition, when the insulating film INF is formed on each light emitting element LD, even though a plurality of light emitting elements LD are disposed close to each other, occurrence of an unwanted short circuit between the light emitting elements LD may be prevented.

In some embodiments of the disclosure, the light emitting element LD may be manufactured through a surface treatment. For example, the surface treatment may be performed on each light emitting element LD (e.g., surface treatment may be performed to make the surface of the light emitting element LD hydrophilic or hydrophobic) so that when a plurality of light emitting elements LD are mixed in a fluid solution (or solvent) and supplied to each emission area (for example, an emission area of each pixel), the light emitting elements LD may be uniformly dispersed in the solution without being non-uniformly aggregated.

As a non-limiting embodiment related to this, the insulating film INF itself may be formed as a hydrophobic film using a hydrophobic material, or a hydrophobic film formed of a hydrophobic material may be additionally formed on the insulating film INF. According to some embodiments, the hydrophobic material may be a material containing fluorine to exhibit hydrophobicity. According to another embodiment, the hydrophobic material may be applied to the light emitting elements LD in a form of a self-assembled monolayer (SAM). In this case, the hydrophobic material may include octadecyl trichlorosilane, fluoroalkyl trichlorosilane, perfluoroalkyl triethoxysilane, or the like. In addition, the hydrophobic material may be a commercially available fluorine-containing material such as polytetrafluoroethylene (e.g., TEFLON®) or fluoropolymer resins (e.g., CYTOP®), or a material corresponding thereto, and TEFLON® is a registered trademark of The Chemours Company FC, LLC Limited Liability Company Delaware and CYTOP® is a registered trademark of AGC INC. CORPORATION, Japan.

A light emitting device including the light emitting element LD may be used in various types of devices that require a light source, including a display device. For example, a plurality of light emitting elements LD may be disposed in an emission area of each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

FIGS. 4A and 4B are a perspective view and a cross-sectional view illustrating a light emitting element LD' according to one or more example embodiments of the present disclosure. According to some embodiments, FIGS. 4A and 4B show the light emitting element LD' of a structure different from that of the light emitting elements LD shown in FIGS. 1A-3B, for example, a light emitting element of a core-shell structure. For example, in the disclosure, the type, structure, and/or shape of the light emitting element LD/LD' may be variously changed. In the embodiment of FIGS. 4A and 4B, the same or similar reference numerals are assigned to components (for example, corresponding components) similar to or the same as those of the embodiments of FIGS. 1A-3B, and detailed description thereof will be omitted.

Referring to FIGS. 4A and 4B, the light emitting element LD' includes the first semiconductor layer 11', the second semiconductor layer 13', and the active layer 12' interposed between the first and second semiconductor layers 11' and 13'. According to some embodiments, the first semiconductor layer 11' may be disposed in a center area of the light emitting element LD', and the active layer 12' may be disposed on a surface of the first semiconductor layer 11' to surround at least one area of the first semiconductor layer 11'. For example, the active layer 12' may be disposed along the edge or peripheral surface of the first semiconductor layer 11' to surround at least one area of the first semiconductor layer 11'. In addition, the second semiconductor layer 13' may be disposed on a surface of the active layer 12' to surround at least one area of the active layer 12'. For example, the second semiconductor layer 13' may be disposed along the edge or peripheral surface of the active layer 12' to surround at least one area of the active layer 12'.

In addition, the light emitting element LD' selectively may further include the electrode layer 14' surrounding at least one area of the second semiconductor layer 13' and/or the insulating film INF' disposed on the outermost surface of the light emitting element LD'. For example, the light emitting element LD' may further include the electrode layer 14' disposed on a surface (e.g., a peripheral surface) of the second semiconductor layer 13' to surround at least one area of the second semiconductor layer 13', and the insulating film INF' disposed on a surface (e.g., a peripheral surface) of the electrode layer 14' to surround at least one area of the electrode layer 14'.

According to some embodiments, the insulating film INF' may be provided on a surface of the light emitting element LD' to cover a portion of an outer peripheral surface (e.g., an outer circumferential surface) of the first semiconductor layer 11' and an outer peripheral surface (e.g., an outer circumferential surface) of the electrode layer 14'. In some embodiments, the insulating film INF' may be first formed to cover the entire outer peripheral surface (e.g., an outer circumferential surface) of the electrode layer 14' included in the light emitting element LD', and then, the insulating film INF' may be partially removed to expose one area of the electrode layer 14' for electrical connection with an electrode (for example, the first electrode of the pixel) which is not shown. The insulating film INF' may include a transparent insulating material.

The light emitting element LD' according to the above-described embodiment may be a light emitting element of a core-shell structure (also referred to as a "core-shell light emitting diode") manufactured through a growth method or the like. For example, the light emitting element LD' may have a core-shell structure in which the first semiconductor layer 11', the active layer 12', the second semiconductor layer 13', the electrode layer 14', and the insulating film INF' are sequentially disposed from a center in an outer direction. According to another embodiment, the light emitting element LD' may not include at least one of the electrode layer 14' and the insulating film INF'.

In some embodiments, the light emitting element LD' may include a polygonal horn shape extending along any one direction. For example, at least one area of the light emitting element LD' may have a hexagonal horn shape. However, the shape of the light emitting element LD' may be variously changed according to some embodiments.

When the extension direction of the light emitting element LD' is the length L' direction, the light emitting element LD' may have the first end portion EP1' and the second end portion EP2' along the length L' direction. One of the first and second semiconductor layers 11' and 13' (or an electrode layer surrounding any one of the first and second semiconductor layers 11' and 13') may be disposed at the first end portion EP1' of the light emitting element LD', and the other one of the first and second semiconductor layers 11' and 13' (or an electrode layer surrounding the other one of the first and second semiconductor layers 11' and 13') may be disposed at the second end portion EP2' of the light emitting element LD'.

In some embodiments, the light emitting element LD' may be a light emitting diode having a core-shell structure in which the first end portion EP1' protrudes in a shape of a polygonal horn (for example, a hexagonal horn) and may be a micro light emitting diode. For example, the light emitting element LD' may have a shape in which a hexagonal horn and a hexagonal column are combined, and may have a size as small as nano scale to micro scale, for example, the width W and/or the length L' in a nano scale or micro scale range. However, the size, the shape, and the like of the light emitting element LD' may be variously changed according to design condition of various devices using the light emitting element LD' as a light source, for example, a display device.

In some embodiments, both end portions of the first semiconductor layer 11' may have a shape protruding along the length L' direction of the light emitting element LD'. The protruding shape of the both end portions of the first semiconductor layer 11' may be different from each other. For example, one end portion disposed on an upper side of the both end portions of the first semiconductor layer 11' may have a horn shape (for example, a hexagonal horn shape) contacting one vertex as a width narrows toward an upper portion. In addition, the other end portion disposed on a lower side of the first semiconductor layer 11' may have a polygonal column shape (for example, a hexagonal column shape) having a constant width, but is not limited thereto. For example, in another embodiment of the disclosure, the first semiconductor layer 11' may have a cross section, such as a polygonal shape or a step shape of which a width narrows toward a lower portion. The shapes of the both end portions of the first semiconductor layer 11' may be variously changed according to some embodiments.

The first semiconductor layer 11' may be positioned at a core, that is, a center (or a center area) of the light emitting element LD'. In addition, the light emitting element LD' may be provided in a shape corresponding to the shape of the first semiconductor layer 11'. For example, when the first semiconductor layer 11' has a hexagonal horn shape at one end portion of the upper side, the light emitting element LD' may have a hexagonal horn shape at one end portion (for example, the first end portion EP1') of the upper side.

The active layer 12' may be provided and/or formed in a shape surrounding an outer peripheral surface of the first semiconductor layer 11'. For example, the active layer 12' may be provided and/or formed in a shape surrounding the remaining areas except for one side end portion (for example, one end portion of the lower side) of the first semiconductor layer 11' in the length L' direction of the light emitting element LD'.

The second semiconductor layer 13' may be provided and/or formed in a shape surrounding an outer peripheral surface (e.g., an outer circumferential surface) of the active layer 12' and may include a semiconductor layer of a type different from that of the first semiconductor layer 11'. For example, when the first semiconductor layer 11' includes an N-type semiconductor layer, the second semiconductor layer 13' may include a P-type semiconductor layer.

In some embodiments, the light emitting element LD' may further include the electrode layer 14' surrounding an outer peripheral surface (e.g., an outer circumferential surface) of the second semiconductor layer 13'. The electrode layer 14' may be an ohmic contact electrode or a Schottky contact electrode electrically connected to the second semiconductor layer 13', but is not limited thereto.

As described above, the light emitting element LD' may be formed in the core-shell structure having a shape in which the both end portions protrude, and includes the first semiconductor layer 11' provided at the center thereof, the active layer 12' surrounding the first semiconductor layer 11', and the second semiconductor layer 13' surrounding the active layer 12'. In addition, the light emitting element LD' may further include the electrode layer 14' surrounding the second semiconductor layer 13' along an outer peripheral surface (e.g., an outer circumferential surface) of the second semiconductor layer 13'. One end of the electrode layer 14' may be disposed at the first end portion EP1' of the light emitting element LD', and one end of the first semiconductor layer 11' may be disposed at the second end portion EP2' of the light emitting element LD'.

The above-described light emitting element LD/LD' may be used in various types of devices that require a light source, including a display device. For example, at least one light emitting element LD/LD' may be disposed in each pixel of a display panel to be used as a light source.

In some embodiments, each pixel may include at least one rod-shaped light emitting element LD or at least one light emitting element LD' of the core-shell structure, or may include the rod-shaped light emitting element LD or the light emitting element LD' of the core-shell structure in combination. In another embodiment, each pixel may include another light emitting element of a type and/or a shape different from that of the rod-shaped light emitting element LD or the light emitting element LD' of the core-shell structure.

Figure 5:
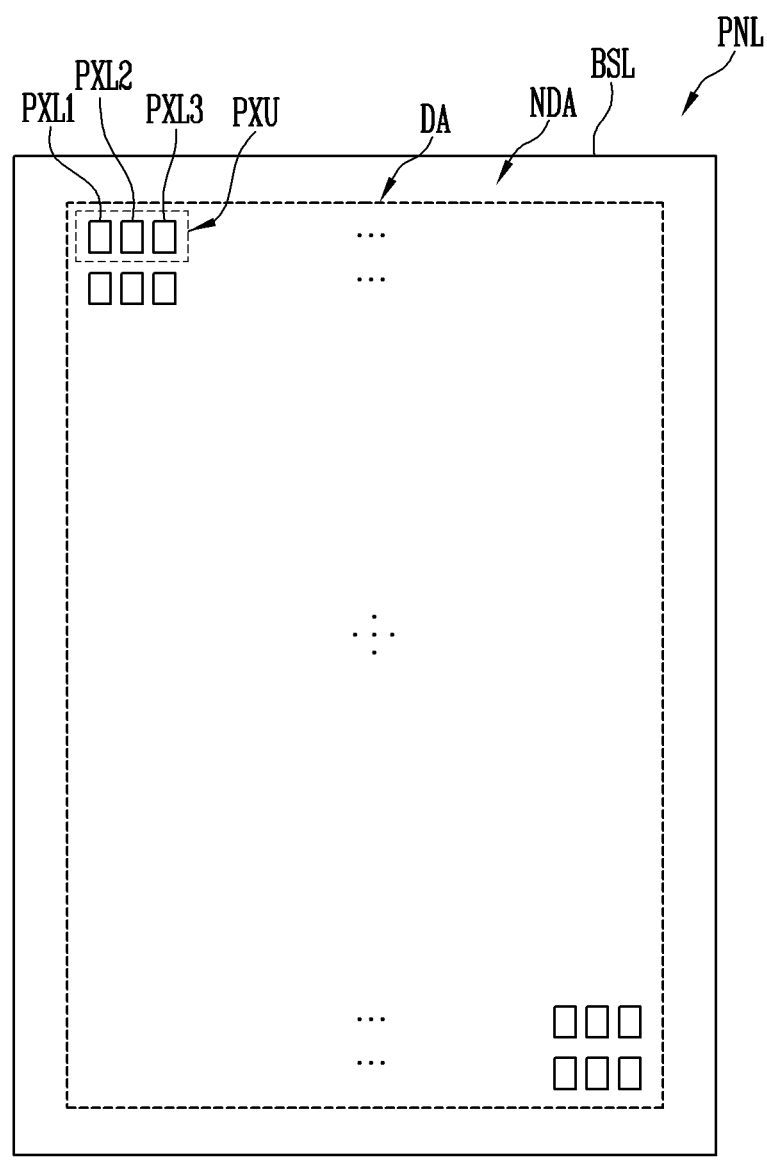
FIG. 5 is a plan view illustrating a display device according to one or more example embodiments of the disclosure.

FIG. 5 is a plan view illustrating a display device according to one or more example embodiments of the present disclosure. FIG. 5 shows a display device, in particular, a display panel PNL included in the display device, as an example of an electronic device that may use the light emitting element LD described in the embodiments of FIGS. 1A-4B as a light source. For example, each pixel unit PXU of the display panel PNL and each pixel configuring the pixel unit PXL may include at least one light emitting element LD.

For convenience, in FIG. 5, a structure of the display panel PNL is briefly shown centering on a display area DA. However, according to some embodiments, at least one driving circuit unit (for example, a scan driver), lines and/or pads, which are not shown, may be further disposed on the display panel PNL.

Referring to FIG. 5, the display panel PNL according to some embodiments of the disclosure may include a base layer BSL and pixels disposed on the base layer BSL. The pixels may include first color pixels PXL1, second color pixels PXL2, and/or third color pixels PXL3. Hereinafter, when one or more pixels of the first color pixels PXL1, the second color pixels PXL2, and the third color pixels PXL3 are arbitrarily referred to, or when two or more types of pixels are collectively referred to, the one or more pixels or two or more types of pixels will be referred to as a "pixel PXL" or "pixels PXL".

The display panel PNL and the base layer BSL for forming the display panel PNL may include the display area DA for displaying an image, and a non-display area NDA excluding the display area DA, where the non-display area NDA may surround the display area DA along the edge or periphery of the display area DA. In addition, the pixels PXL may be disposed in the display area DA on the base layer BSL.

The display area DA may be disposed in a center area of the display panel PNL, and the non-display area NDA may be disposed in an edge area of the display panel PNL to surround the display area DA. However, positions of the display area DA and the non-display area NDA are not limited thereto, and the positions of the display area DA and the non-display area NDA may be changed. The display area DA may configure a screen on which the image is displayed, and the non-display area NDA may be a remaining area except for the display area DA.

The base layer BSL may configure a base member of the display panel PNL, and may be a rigid or flexible substrate or film. For example, the base layer BSL may be a rigid substrate formed of glass or tempered glass, a flexible substrate (or a thin film) of a material of plastic or metal, or at least one insulating film. The material and/or physical properties of the base layer BSL are not particularly limited.

In some embodiments, the base layer BSL may be substantially transparent. Here, substantially transparent may mean that light may be transmitted at a suitable transmittance (e.g., a predetermined transmittance) or more. In another embodiment, the base layer BSL may be translucent or opaque. In addition, according to an embodiment, the base layer BSL may include a reflective material.

One area on the base layer BSL may be defined as the display area DA and the pixels PXL may be disposed in the display area DA, and the remaining areas on the base layer BSL may be defined as the non-display area NDA. For example, the base layer BSL may include the display area DA including a plurality of pixel areas in which each pixel PXL is formed, and the non-display area NDA disposed outside the display area DA. Various lines, pads, and/or built-in circuit units connected to the pixels PXL of the display area DA may be disposed in the non-display area NDA.

The pixels PXL may be arranged in the display area DA. For example, the pixels PXL may be regularly arranged in the display area DA according to a stripe or pen-tile arrangement structure. However, an arrangement structure of the pixels PXL is not limited thereto, and the pixels PXL may be arranged in the display area DA in various structures and/or methods.

According to some embodiments, two or more types of pixels PXL emitting light of different colors may be disposed in the display area DA. For example, in the display area DA, first color pixels PXL1 that emit light of a first color, second color pixels PXL2 that emit light of a second color, and third color pixels PXL3 that emit light of a third color may be arranged. In some embodiments, the at least one first color pixel PXL1, second color pixel PXL2, and third color pixel PXL3 disposed to be adjacent to each other may configure one pixel unit PXU capable of emitting light of various colors.

According to some embodiments, the first color pixel PXL1 may be a red pixel that emits red light, the second color pixel PXL2 may be a green pixel that emits green light, and the third color pixel PXL3 may be a blue pixel that emits blue light. In some embodiments, the first color pixel PXL1, the second color pixel PXL2, and the third color pixel PXL3 may include a light emitting element of a first color, a light emitting element of a second color, and a light emitting element of a third color as a light source, to emit light of the first color, the second color, and the third color, respectively. In another embodiment, the first color pixel PXL1, the second color pixel PXL2, and the third color pixel PXL3 may include light emitting elements of the same color, and may emit light of the first color, the second color, and the third color, respectively, by including a color light conversion layer and/or a color filter of different colors disposed on the respective light emitting elements.

However, the color, type, and/or number of pixels PXL configuring each pixel unit PXU is not particularly limited. For example, the color of light emitted by each pixel PXL may be variously changed.

Each pixel PXL may include at least one light source driven by a control signal (for example, a predetermined control signal, e.g., a scan signal and a data signal) and/or power (for example, a predetermined power, e.g., a first power and/or a second power). In some embodiments, the light source may include at least one light emitting element LD according to any one of the embodiments of FIGS. 1A-3B, for example, at least one micro rod-shaped light emitting element LD having a size as small as nano scale to micro scale and/or at least one light emitting element LD' according to the embodiment of FIGS. 4A and 4B, for example, at least one light emitting element LD' of a micro core-shell structure having a size as small as nano scale to micro scale. In addition, various types of light emitting elements LD may be used as the light source of the pixels PXL.

In addition, each pixel PXL may have a structure according to at least one of various embodiments described below. For example, each pixel PXL may have a structure according to any one of the embodiments disclosed in FIGS. 6A-12B, or may have a structure in which at least two embodiments of the above-described embodiments are combined.

In some embodiments, each pixel PXL may be configured as an active pixel. However, a type, a structure, and/or a driving method of the pixels PXL that may be applied to the display device of the disclosure are not particularly limited. For example, each pixel PXL may be configured as a pixel of a passive or active light emitting display device of various structures and/or driving methods.

FIGS. 6A-6G are circuit diagrams illustrating the pixel PXL according to one or more example embodiments of the present disclosure, respectively. For example, FIGS. 6A-6G show different embodiments of the pixel PXL that may be applied to an active display device. However, types of the pixel PXL and the display device to which the embodiment of the disclosure may be applied are not limited thereto.

According to some embodiments, each pixel PXL shown in FIGS. 6A-6G may be any one of the first color pixel PXL1, the second color pixel PXL2, and the third color pixel PXL3 included in the display panel PNL of FIG. 5. In addition, the first color pixel PXL1, the second color pixel PXL2, and the third color pixel PXL3 may have structures substantially the same as or similar to each other.

Figure 6A:
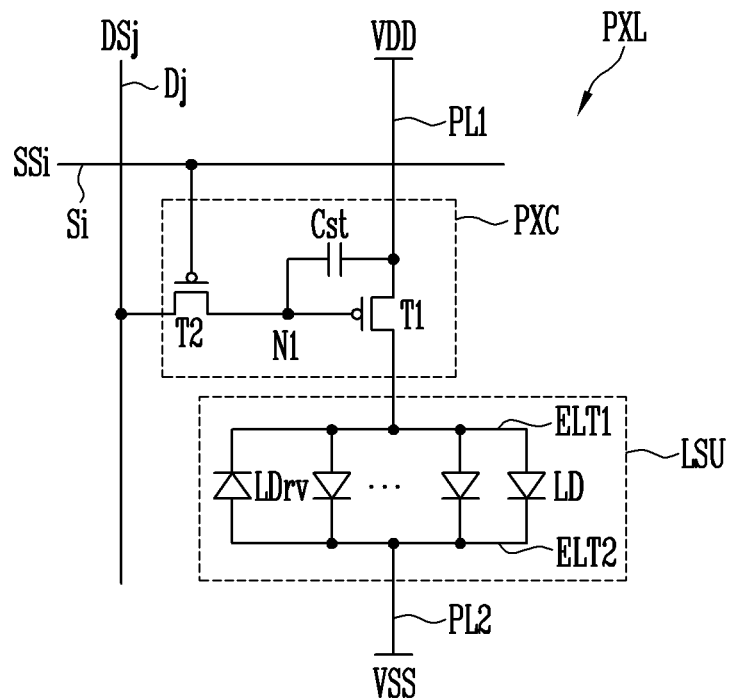
FIGS. 6A-6G are circuit diagrams illustrating a pixel according to one or more example embodiments of the present disclosure.

First, referring to FIG. 6A, the pixel PXL includes a light source unit LSU for generating light of a luminance corresponding to a data signal. In addition, the pixel PXL may selectively further include a pixel circuit PXC for driving the light source unit LSU.

The light source unit LSU may include at least one light emitting element LD, for example, a plurality of light emitting elements LD, connected between first power VDD and second power VSS. For example, the light source unit LSU may include a first electrode ELT1 (also referred to as a "first pixel electrode" or a "first alignment electrode") connected to the first power VDD via the pixel circuit PXC and a first power line PL1, a second electrode ELT2 (also referred to as a "second pixel electrode" or a "second alignment electrode") connected to the second power VSS through a second power line PL2, and the plurality of light emitting elements LD connected in parallel in the same direction between the first and second electrodes ELT1 and ELT2. In some embodiments, the first electrode ELT1 may be an anode electrode, and the second electrode ELT2 may be a cathode electrode.

Each of the light emitting elements LD may include the first end portion (for example, a P-type end portion) connected to the first power VDD through the first electrode ELT1 and/or the pixel circuit PXC, and a second end portion (for example, an N-type end portion) connected to the second power VSS through the second electrode ELT2. That is, the light emitting elements LD may be connected in parallel in a forward direction between the first and second electrodes ELT1 and ELT2. Each light emitting element LD connected in the forward direction between the first power VDD and the second power VSS may configure each effective light source, and the effective light sources may be collected to form the light source unit LSU of the pixel PXL.

The first power VDD and the second power VSS may have different potentials so that the light emitting elements LD emit light. For example, the first power VDD may be set as a high potential power, and the second power VSS may be set as a low potential power. At this time, a potential difference between the first power VDD and the second power VSS may be set to be equal to or greater than a threshold voltage of the light emitting elements LD during an emission period of the pixel PXL.

One end portion (for example, the P-type end portion) of the light emitting elements LD configuring each light source unit LSU may be common connected to the pixel circuit PXC through one electrode (for example, the first electrode ELT1 of each pixel PXL) of the light source unit LSU, and may be connected to the first power VDD through the pixel circuit PXC and the first power line PL1. In addition, the other end portion (for example, the N-type end portion) of the light emitting elements LD may be commonly connected to the second power VSS through another electrode (for example, the second electrode ELT2 of each pixel PXL) of the light source unit LSU and the second power line PL2.

The light emitting elements LD may emit light at a luminance corresponding to a driving current supplied through a corresponding pixel circuit PXC. For example, during each frame period, the pixel circuit PXC may supply a driving current corresponding to a grayscale value to be expressed in a corresponding frame to the light source unit LSU. The driving current supplied to the light source unit LSU may be divided and flow to the light emitting elements LD connected parallel to each other in the forward direction. Accordingly, while each light emitting element LD emits light at a luminance corresponding to the current flowing therein, the light source unit LSU may emit light of a luminance corresponding to the driving current.

In some embodiments, the light source unit LSU may further include at least one ineffective light source in addition to the light emitting elements LD configuring each effective light source. For example, at least one reverse light emitting element LDrv may be further connected between the first and second electrodes ELT1 and ELT2.

Each reverse light emitting element LDrv may be connected in parallel between the first and second electrodes ELT1 and ELT2 together with the light emitting elements LD configuring the effective light sources, and may be connected between the first and second electrodes ELT1 and ELT2 in a direction opposite to that of the light emitting elements LD. For example, an N-type end portion of the reverse light emitting element LDrv may be connected to the first power VDD via the first electrode ELT1 and the pixel circuit PXC, and a P-type end portion of the reverse light emitting element LDrv may be connected to the second power VSS through the second electrode ELT2. The reverse light emitting element LDrv may maintain a deactivated state (e.g., reverse biased state) even though a driving voltage (for example, a predetermined driving voltage or a driving voltage of the forward direction) is applied between the first and second electrodes ELT1 and ELT2, and thus the reverse light emitting element LDrv may substantially maintain a non-emission state.

In addition, according to some embodiments, at least one pixel PXL may further include at least one ineffective light source (not shown) that is not completely connected between the first and second electrodes ELT1 and ELT2. For example, at least one pixel PXL may further include at least one ineffective light emitting element positioned in the light source unit LSU and having first and second end portions EP1 and EP2 which are not completely connected to the first and second electrodes ELT1 and ELT2.

The pixel circuit PXC is connected between the first power VDD and the first electrode ELT1. The pixel circuit PXC may be connected to a scan line Si and a data line Dj of a corresponding pixel PXL. For example, when the pixel PXL is disposed on an i-th (i is a natural number) horizontal line (row) and j-th (j is a natural number) vertical line (column) of the display area DA, the pixel circuit PXC of the pixel PXL may be connected to an i-th scan line Si and a j-th data line Dj of the display area DA.

According to some embodiments, the pixel circuit PXC may include a plurality of transistors and at least one capacitor. For example, the pixel circuit PXC may include a first transistor T1, a second transistor T2, and a storage capacitor Cst.

The first transistor T1 is connected between the first power VDD and the light source unit LSU. For example, a first electrode (for example, a source electrode) of the first transistor T1 may be connected to the first power VDD, and a second electrode (for example, a drain electrode) of the first transistor T1 may be connected to the first electrode ELT1. In addition, a gate electrode of the first transistor T1 is connected to a first node N1. The first transistor T1 controls a driving current supplied to the light source unit LSU in correspondence with a voltage of the first node N1. That is, the first transistor T1 may be a driving transistor that controls a driving current of the pixel PXL.

The second transistor T2 is connected between the data line Dj and the first node N1. For example, a first electrode (for example, a source electrode) of the second transistor T2 may be connected to the data line Dj, and a second electrode (for example, a drain electrode) of the second transistor T2 may be connected to the first node N1. In addition, a gate electrode of the second transistor T2 is connected to the scan line Si. The second transistor T2 is turned on when a scan signal SSi of a gate-on voltage (for example, a low level voltage) is supplied from the scan line Si, to electrically connect the data line Dj and the first node N1.

For each frame period, a data signal DSj of a corresponding frame is supplied to the data line Dj, and the data signal DSj is transferred to the first node N1 through the turned on second transistor T2 during a period in which the scan signal SSi of the gate-on voltage is supplied. That is, the second transistor T2 may be a switching transistor for transferring each data signal DSj to the inside of the pixel PXL.

One electrode of the storage capacitor Cst is connected to the first power VDD, and another electrode is connected to the first node N1. The storage capacitor Cst charges a voltage (e.g., store charges or voltage) corresponding to the data signal DSj supplied to the first node N1 during each frame period.

In FIG. 6A, transistors included in the pixel circuit PXC, for example, both of the first and second transistors T1 and T2 are P-type transistors, but the disclosure is not limited thereto. That is, at least one of the first and second transistors T1 and T2 may be changed to an N-type transistor.

Figure 6B:
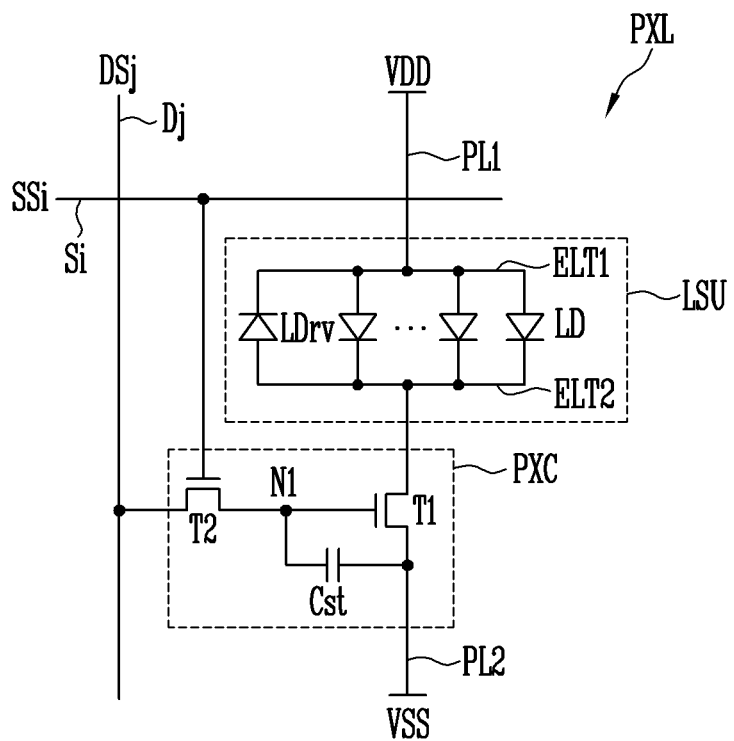

For example, as shown in FIG. 6B, each of the first and second transistors T1 and T2 may be an N-type transistor. In this case, the gate-on voltage of the scan signal SSi for writing the data signal DSj supplied to the data line Dj to each pixel may be a high level voltage (also referred to as a "gate-high voltage"). Similarly, the voltage of the data signal DSj for turning on the first transistor T1 may be a voltage of a level opposite to that of the embodiment of FIG. 6A. For example, in the embodiment of FIG. 6A, as a grayscale value to be expressed increases, the voltage of the supplied data signal DSj may decrease. In contrast, in the embodiment of FIG. 6B, as the grayscale value to be expressed increases, the voltage of the supplied data signal DSj may increase. In another embodiment, the first and second transistors T1 and T2 may be transistors of different conductive types. For example, one of the first and second transistors T1 and T2 may be a P-type transistor, and the other one may be an N-type transistor.

In some embodiments, an interconnection position of the pixel circuit PXC and the light source unit LSU may be changed. For example, as shown in FIG. 6B, when both of the first and second transistors T1 and T2 configuring the pixel circuit PXC are N-type transistors, the pixel circuit PXC may be connected between the light source unit LSU and the second power VSS, and the storage capacitor Cst may be connected between the first node N1 and the second power VSS. However, the disclosure is not limited thereto. For example, in another embodiment, even though the pixel circuit PXC is configured of N-type transistors, the pixel circuit PXC may be connected between the first power VDD and the light source unit LSU, and/or the storage capacitor Cst may be connected between the first power VDD and the first node N1.

A configuration and an operation of the pixel PXL shown in FIG. 6B is substantially similar to those of the pixel PXL of FIG. 6A except that a connection position of some circuit elements and a voltage level of control signals (for example, the scan signal SSi and the data signal DSj) are changed according to a type change of the first and second transistors T1 and T2. Therefore, detailed description of the pixel PXL of FIG. 6B is omitted.

A structure of the pixel circuit PXC is not limited to the embodiments shown in FIGS. 6A and 6B. For example, the pixel circuit PXC may be configured as in an embodiment shown in FIG. 6C or 6D. In addition, the pixel circuit PXC may be configured of a pixel circuit of various structures and/or driving methods.

Figure 6C:
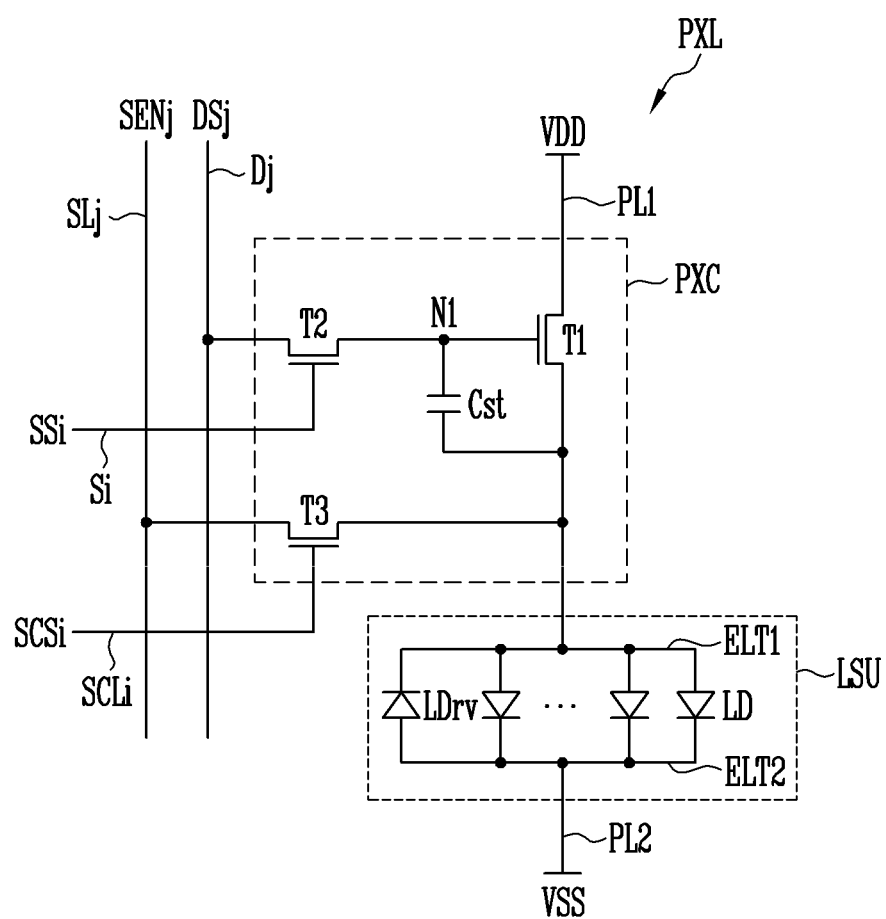

Referring to FIG. 6C, the pixel circuit PXC may be further connected to a sensing control line SCLi and a sensing line SLj. For example, the pixel circuit PXC of the pixel PXL disposed on the i-th horizontal line and the j-th vertical line of the display area DA may be connected to an i-th sensing control line SCLi and a j-th sensing line SLj of the display area DA. The pixel circuit PXC may further include a third transistor T3. In another embodiment, the sensing line SLj may be omitted, and a characteristic of the pixel PXL may be detected by detecting a sensing signal SENj through the data line Dj of a corresponding pixel PXL (or adjacent pixel).

The third transistor T3 is connected between the first transistor T1 and the sensing line SLj. For example, one electrode of the third transistor T3 may be connected to the one electrode (for example, the source electrode) of the first transistor T1 connected to the first electrode ELT1, and another electrode of the third transistor T3 may be connected to the sensing line SLj. When the sensing line SLj is omitted, another electrode of the third transistor T3 may be connected to the data line Dj.

A gate electrode of the third transistor T3 is connected to the sensing control line SCLi. When the sensing control line SCLi is omitted, the gate electrode of the third transistor T3 may be connected to the scan line Si. The third transistor T3 may be turned on by a sensing control signal SCSi of a gate-on voltage (for example, a high level voltage) supplied to the sensing control line SCLi during a sensing period (e.g., a predetermined sensing period), to electrically connect the sensing line SLj and the first transistor T1.

According to some embodiments, the sensing period may be a period for extracting a characteristic (for example, a threshold voltage or the like of the first transistor T1) of each of the pixels PXL disposed in the display area DA. During the sensing period, the first transistor T1 may be turned on by supplying a reference voltage (e.g., a predetermined reference voltage) to the first node (N1) through the data line Dj and the second transistor T2 to turn on the first transistor T1, or by connecting each pixel PXL to a current source or the like. In addition, the first transistor T1 may be connected to the sensing line SLj when the sensing control signal SCSi of the gate-on voltage is supplied to the gate electrode of the third transistor T3 to turn on the third transistor T3. Thereafter, the sensing signal SENj may be obtained through the sensing line SLj, and the characteristic of each pixel PXL, including the threshold voltage or the like of the first transistor T1, may be detected using the sensing signal SENj. Information on the characteristic of each pixel PXL may be used to convert image data so that a characteristic variation between the pixels PXL disposed in the display area DA may be compensated.

FIG. 6C discloses an embodiment in which all of the first, second, and third transistors T1, T2, and T3 are N-type transistors, but the disclosure is not limited thereto. For example, at least one of the first, second, and third transistors T1, T2, and T3 may be changed to a P-type transistor. In addition, FIG. 6C also discloses an embodiment in which the light source unit LSU is connected between the pixel circuit PXC and the second power VSS, but the disclosure is not limited thereto. For example, in another embodiment, the light source unit LSU may be connected between the first power VDD and the pixel circuit PXC.

Figure 6D:
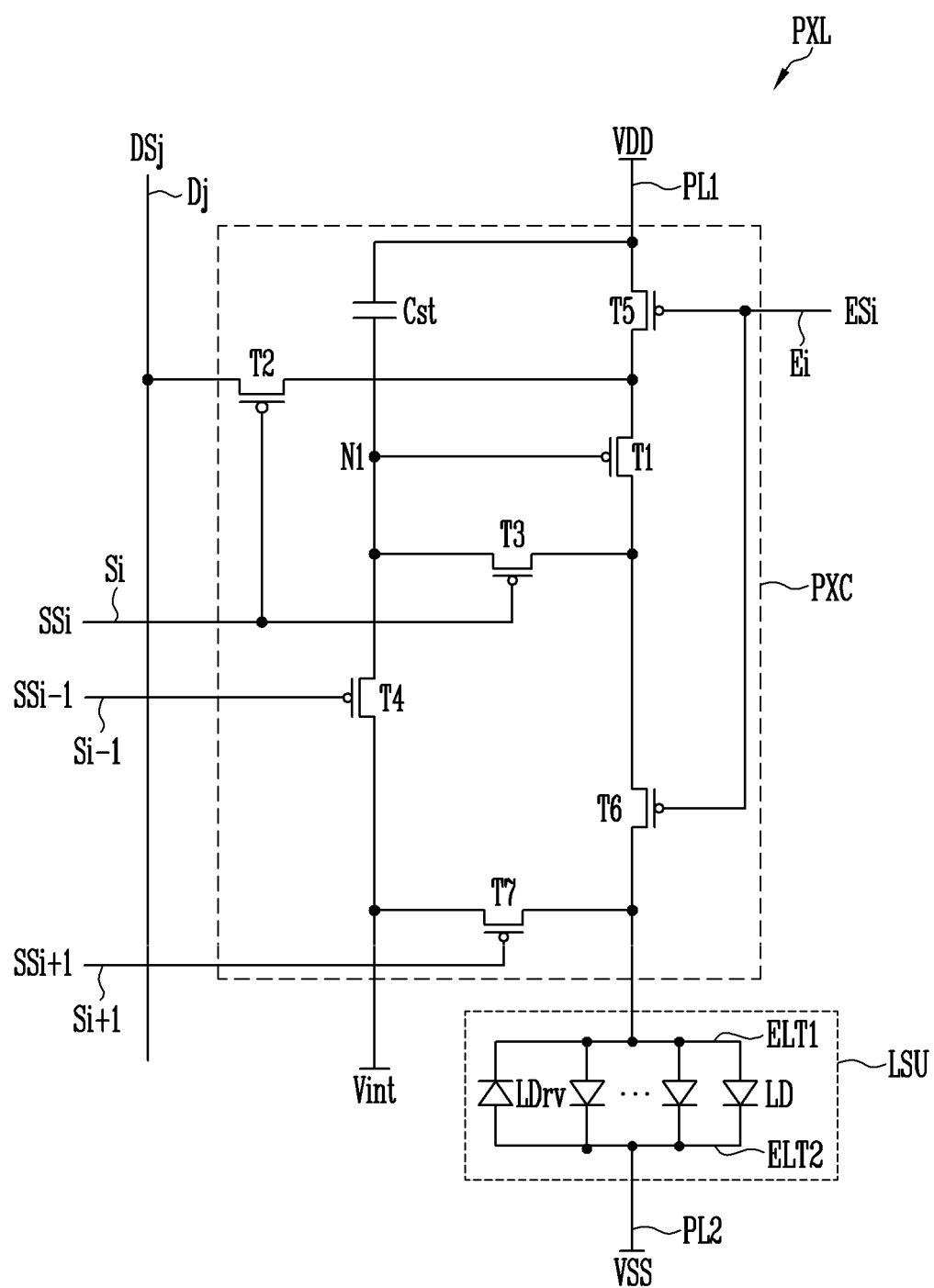

Referring to FIG. 6D, the pixel circuit PXC may be further connected to at least another scan line or control line in addition to the scan line Si of a corresponding horizontal line. For example, the pixel circuit PXC of the pixel PXL disposed on the i-th horizontal line of the display area DA may be further connected to an (i−1)-th scan line Si−1 (e.g., a previous scan line) and/or an (i+1)-th scan line Si+1 (e.g., a next scan line). In addition, the pixel circuit PXC may be further connected to another power in addition to the first power VDD and the second power VSS. For example, the pixel circuit PXC may also be connected to an initialization power Vint. In some embodiments, the pixel circuit PXC may include first to seventh transistors T1 to T7 and a storage capacitor Cst.

The first transistor T1 is connected between the first power VDD and the light source unit LSU. For example, one electrode (for example, a source electrode) of the first transistor T1 may be connected to the first power VDD through the fifth transistor T5, and another electrode (for example, a drain electrode) of the first transistor T1 may be connected to one electrode (for example, the first electrode ELT1) of the light source unit LSU via the sixth transistor T6. In addition, a gate electrode of the first transistor T1 is connected to the first node N1. The first transistor T1 controls the driving current supplied to the light source unit LSU in correspondence with the voltage of the first node N1.

The second transistor T2 is connected between the data line Dj and the one electrode (for example, the source electrode) of the first transistor T1. In addition, a gate electrode of the second transistor T2 is connected to a corresponding scan line Si. The second transistor T2 is turned on when the scan signal SSi of the gate-on voltage (e.g., a low level voltage) is supplied from the scan line Si, to electrically connect the data line Dj to the one electrode (for example, the source electrode) of the first transistor T1. Therefore, when the second transistor T2 is turned on, the data signal DSj supplied from the data line Dj is transferred to the first transistor T1.

The third transistor T3 is connected between another electrode (for example, a drain electrode) of the first transistor T1 and the first node N1. In addition, a gate electrode of the third transistor T3 is connected to a corresponding scan line Si. The third transistor T3 is turned on when the scan signal SSi of the gate-on voltage (e.g., a low level voltage) is supplied from the scan line Si, to connect the first transistor T1 in a diode form (e.g., diode-connected). Therefore, the first transistor T1 is turned on in a diode-connected form during a period in which the scan signal SSi of the gate-on voltage is supplied, and thus the data signal DSj from the data line Dj is supplied to the first node N1 via the second transistor T2, the first transistor T1, and the third transistor T3 sequentially. Accordingly, the storage capacitor Cst is charged to a voltage corresponding to the data signal DSj and the threshold voltage of the first transistor T1.

The fourth transistor T4 is connected between the first node N1 and the initialization power Vint. In addition, a gate electrode of the fourth transistor T4 is connected to a previous scan line, for example, the (i−1)-th scan line Si−1. The fourth transistor T4 is turned on when a scan signal SSi−1 of a gate-on voltage (e.g., a low level voltage) is supplied to the (i−1)-th scan line Si−1, to transfer a voltage of the initialization power Vint to the first node N1.

According to some embodiments, the voltage of the initialization power Vint may be equal to or less than the lowest voltage of the data signal DSj. Before the data signal DSj of a corresponding frame is supplied to each pixel PXL, the first node N1 is initialized to the voltage of the initialization power Vint by the scan signal SSi−1 of the gate-on voltage supplied to the (i−1)-th scan line Si−1. Accordingly, regardless of the voltage of the data signal DSj of a previous frame, the first transistor T1 is diode-connected in the forward direction during the period in which the scan signal SSi of the gate-on voltage is supplied to the i-th scan line Si. Therefore, the data signal DSj of the corresponding frame may be transferred to the first node N1.

The fifth transistor T5 is connected between the first power VDD and the first transistor T1. In addition, a gate electrode of the fifth transistor T5 is connected to a corresponding emission control line, for example, an i-th emission control line Ei. The fifth transistor T5 is turned off when an emission control signal ESi of a gate-off voltage (for example, a high level voltage) is supplied to the emission control line Ei, and is turned on in other cases.

The sixth transistor T6 is connected between the first transistor T1 (e.g., drain electrode of the first transistor T1) and the light source unit LSU. In addition, a gate electrode of the sixth transistor T6 is connected to a corresponding emission control line, for example, the i-th emission control line Ei. The sixth transistor T6 is turned off when the emission control signal ESi of the gate-off voltage (for example, a high level voltage) is supplied to the emission control line Ei, and is turned on in other cases.

The fifth and sixth transistors T5 and T6 may control an emission period of the pixel PXL. For example, when the fifth and sixth transistors T5 and T6 are turned on, a current path, through which a driving current may flow from the first power VDD to the second power VSS via the fifth transistor T5, the first transistor T1, the sixth transistor T6, and the light source unit LSU sequentially, may be formed. In some embodiments, when the fifth and/or sixth transistors T5 and/or T6 are/is turned off, emission of the pixel PXL may be prevented while the current path is blocked.

The seventh transistor T7 is connected between one electrode (for example, the first electrode ELT1) of the light source unit LSU and the initialization power Vint. In addition, a gate electrode of the seventh transistor T7 is connected to a scan line for selecting pixels PXL of a next horizontal line, for example, the (i+1)-th scan line Si+1. The seventh transistor T7 is turned on when a scan signal SSi+1 of a gate-on voltage is supplied to the (i+1)-th scan line Si+1 (e.g., the next scan line), to supply the voltage of the initialization power Vint to the one electrode (for example, the first electrode ELT1) of the light source unit LSU. Accordingly, during each initialization period in which the voltage of the initialization power Vint is transferred to the light source unit LSU, a voltage of the one electrode (for example, the first electrode ELT1) of the light source unit LSU is initialized.

The control signal and/or the initialization power Vint for controlling an operation of the seventh transistor T7 may be variously changed. For example, in another embodiment, the gate electrode of the seventh transistor T7 may be connected to a scan line of a corresponding horizontal line, that is, the i-th scan line Si or a scan line of a previous horizontal line, for example, the (i−1)-th scan line Si−1. In this case, the seventh transistor T7 may be turned on when the scan signal SSi or SSi−1 of the gate-on voltage is supplied to the i-th scan line Si or the (i−1)-th scan line Si−1, to supply the voltage of the initialization power Vint to the one electrode of the light source unit LSU. Accordingly, during each frame period, the pixel PXL may emit light at a more uniform luminance in correspondence with the data signal DSj. According to another embodiment, the fourth transistor T4 and the seventh transistor T7 may be connected to respective initialization power having different potentials. That is, according to some embodiments, a plurality of initialization power may be supplied to the pixel, and the first node N1 and the first electrode ELT1 may be initialized by initialization power of different potentials.

The storage capacitor Cst is connected between the first power VDD and the first node N1. The storage capacitor Cst stores the data signal DSj supplied to the first node N1 and a voltage corresponding to the threshold voltage of the first transistor T1 in each frame period.

FIG. 6D shows that all transistors included in the pixel circuit PXC, for example, the first to seventh transistors T1 to T7 are P-type transistors, but the disclosure is not limited thereto. For example, at least one of the first to seventh transistors T1 to T7 may be changed to an N-type transistor.

Figure 6E:
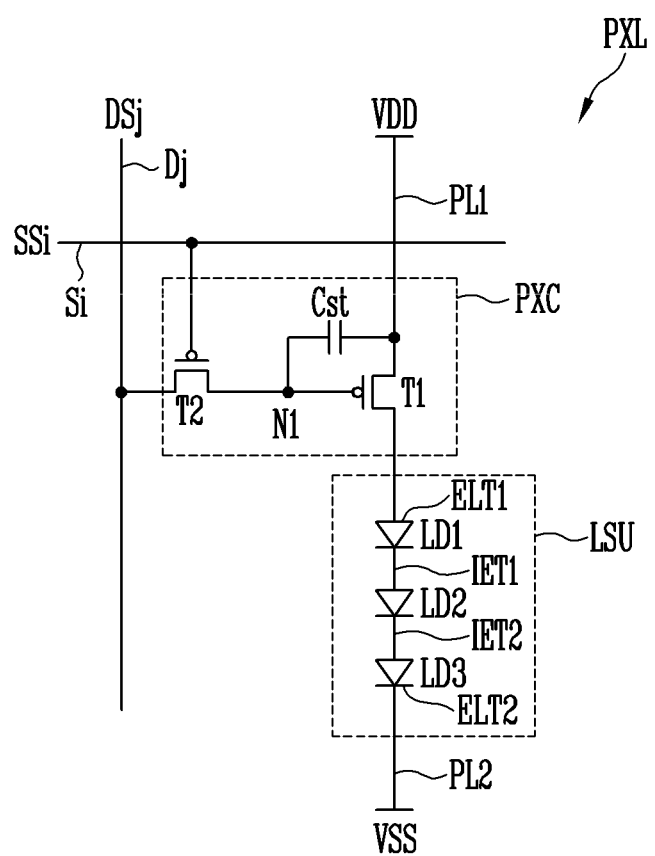
Figure 6F:
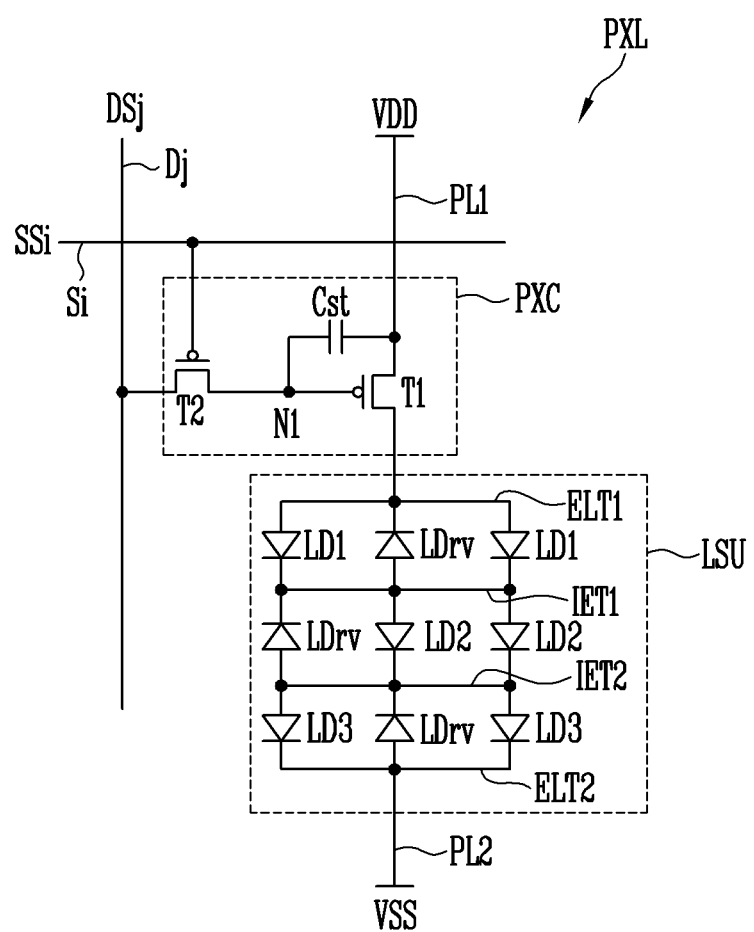
Figure 6G:
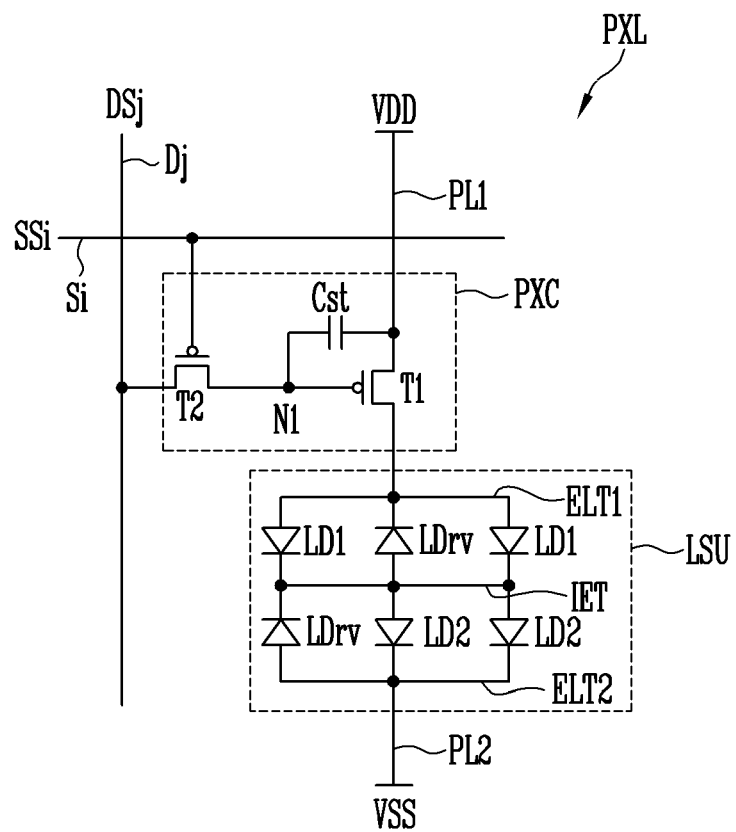

In some embodiments, FIGS. 6A-6D show an embodiment in which the effective light sources configuring each light source unit LSU, that is, all light emitting elements LD are connected in parallel, but the disclosure is not limited thereto. For example, in another embodiment of the disclosure, as shown in FIGS. 6E-6G, the light source unit LSU of each pixel PXL may be configured to include a serial structure of at least two stages. In describing embodiments of FIGS. 6E-6G, detailed description of a configuration (for example, the pixel circuit PXC) similar to or the same as that of the embodiments of FIGS. 6A-6D will be omitted.

Referring to FIG. 6E, the light source unit LSU may include at least two light emitting elements connected in series with each other. For example, the light source unit LSU may include a first light emitting element LD1, a second light emitting element LD2, and a third light emitting element LD3 connected in series in the forward direction between the first power VDD and the second power VSS. Each of the first, second, and third light emitting elements LD1, LD2, and LD3 may configure respective effective light sources.

Hereinafter, when a specific light emitting element is referred to from among the first, second, and third light emitting elements LD1, LD2, and LD3, a corresponding light emitting element may be referred to as the "first light emitting element LD1", the "second light emitting element LD2", or the "third light emitting element LD3". In some embodiments, when at least one of the first, second, and third light emitting elements LD1, LD2, and LD3 is arbitrary referred to, or the first, second, and third light emitting elements LD1, LD2, and LD3 are collectively referred to, at least one of the first, second, and third light emitting elements LD1, LD2, and LD3 or the first, second, and third light emitting elements LD1, LD2, and LD3 will be referred to as the "light emitting element LD" or "light emitting elements LD".

A first end portion (for example, a P-type end portion) of the first light emitting element LD1 is connected to the first power VDD via the first electrode (i.e., the first electrode ELT1) or the like of the light source unit LSU. In addition, a second end portion (for example, an N-type end portion) of the first light emitting element LD1 is connected to a first end portion (for example, a P-type end portion) of the second light emitting element LD2 through a first intermediate electrode IET1.

The first end portion of the second light emitting element LD2 is connected to the second end portion of the first light emitting element LD1. In addition, a second end portion (for example, an N-type end portion) of the second light emitting element LD2 is connected to a first end portion (for example, a P-type end portion) of the third light emitting element LD3 through a second intermediate electrode IET2.

The first end portion of the third light emitting element LD3 is connected to the second end portion of the second light emitting element LD2. In addition, a second end portion (for example, an N-type end portion) of the third light emitting element LD3 may be connected to the second power VSS via the second electrode (i.e., the second electrode ELT2) or the like of the light source unit LSU. In the above-described method, the first, second, and third light emitting elements LD1, LD2, LD3 may be sequentially connected in series between the first and second electrodes ELT1 and ELT2 of the light source unit LSU.

FIG. 6E shows an embodiment in which the light emitting elements LD are connected in a three-stage series structure, but the disclosure is not limited thereto. For example, in another embodiment of the disclosure, two light emitting elements LD may be connected in a two-stage series structure, or four or more light emitting elements LD may be connected in a four-stage or more series structure.

Assuming that the same luminance is expressed using light emitting elements LD of the same condition (for example, the same size and/or number), in the light source unit LSU of a structure in which the light emitting elements LD are connected in series, a voltage applied between the first and second electrodes ELT1 and ELT2 may be increased and a magnitude of the driving current flowing through the light source unit LSU may be decreased compared to the light source unit LSU of a structure in which the light emitting elements LD are connected in parallel. Therefore, when the light source unit LSU of each pixel PXL is configured by applying the series structure, a panel current flowing through the display panel PNL may be reduced.

In some embodiments, at least one series stage may include a plurality of light emitting elements LD connected in parallel to each other. In this case, the light source unit LSU may be configured as a serial/parallel mixed structure. For example, the light source unit LSU may be configured as in an embodiment of FIG. 6F or 6G.

Referring to FIG. 6F, at least one series stage configuring the light source unit LSU may include a plurality of light emitting elements LD connected in parallel in the forward direction. For example, the light source unit LSU may include at least one first light emitting element LD1 disposed in a first series stage (also referred to as a "first stage"), at least one second light emitting element LD2 disposed in a second series stage (also referred to as a "second stage") subsequent to the first series stage, and at least one third light emitting element LD3 disposed in a third series stage (also referred to as a "third stage") subsequent to the second series stage. In addition, at least one of the first, second, and third series stages may include a plurality of light emitting elements LD connected in the forward direction.

FIG. 6F shows the light source unit LSU configured of the light emitting elements LD disposed in three series stages, but the disclosure is not limited thereto. For example, as shown in FIG. 6G, the light source unit LSU may include a plurality of light emitting elements LD disposed in only two series stages (i.e., a first series stage and a second series stage). For example, the light source unit LSU may include at least one first light emitting element LD1 disposed at the first series stage and having a first end portion (for example, a P-type end portion) and a second end portion (for example, an N-type end portion) respectively connected to the first electrode ELT1 and the intermediate electrode IET, and at least one second light emitting element LD2 disposed at the second series stage and having a first end portion (for example, a P-type end portion) and a second end portion (for example, an N-type end portion) respectively connected to the intermediate electrode IET and the second electrode ELT2. In addition, at least one of the first and second series stages may include a plurality of light emitting elements LD connected in the forward direction.

In some embodiments, the number of series stages configuring the light source unit LSU may be variously changed. For example, the light source unit LSU may include a plurality of light emitting elements LD distributed in four or more series stages. In addition, the number of light emitting elements LD connected to each series stage in the forward direction may be variously changed.

According to some embodiments, the pixels PXL disposed in the display area DA may include light emitting elements LD of the same or similar numbers. For example, in supplying the light emitting elements LD to each pixel PXL, the light emitting elements LD may be aligned by controlling a light emitting element ink (e.g., also referred to as "light emitting element solution") including the light emitting elements LD to be applied in a uniform amount to the emission area of each pixel PXL and controlling a uniform electric field to be applied to each pixel PXL. Accordingly, the light emitting elements LD may be relatively uniformly supplied to the pixels PXL and aligned in the pixels PXL.

In some embodiments, each pixel PXL may further include at least one reverse light emitting element LDrv disposed in at least one series stage, as shown in FIGS. 6F and 6G. For example, at least one of the plurality of series stages may further include at least one reverse light emitting element LDrv connected in a direction opposite to that of the light emitting elements LD.

However, even though the reverse light emitting element LDrv is connected to at least one series stage, when at least one effective light source (for example, the first, second and/or third light emitting element LD1, LD2, and/or LD3) connected in the forward direction to the series stage are disposed, the driving current of the pixel PXL flows sequentially through each series stage. Accordingly, the light source unit LSU emits light at a luminance corresponding to the driving current.

As in the above-described embodiments, each light source unit LSU may include a plurality of light emitting elements LD connected in the forward direction between the first power VDD and the second power VSS to configure each effective light source. In addition, a connection structure between the light emitting elements LD may be variously changed according to some embodiments. For example, the light emitting elements LD may be connected to each other only in series or in parallel, or may be connected in a series/parallel mixed structure.

As described above, the pixel PXL may include the pixel circuit PXC and/or the light source unit LSU of various structures. In addition, the structure of the pixel PXL that may be applied to the disclosure is not limited to the embodiments shown in FIGS. 6A-6G, and each pixel PXL may have various structures in addition to the above-described structure. In some embodiments, when each pixel PXL is configured in a passive light emitting display device or the like, the pixel circuit PXC may be omitted, and each of the first and second electrodes ELT1 and ELT2 may be directly connected to the scan line Si, the data line Dj, the first power line PL1, the second power line PL2, other signal lines or power lines, or the like.

Figure 7A:
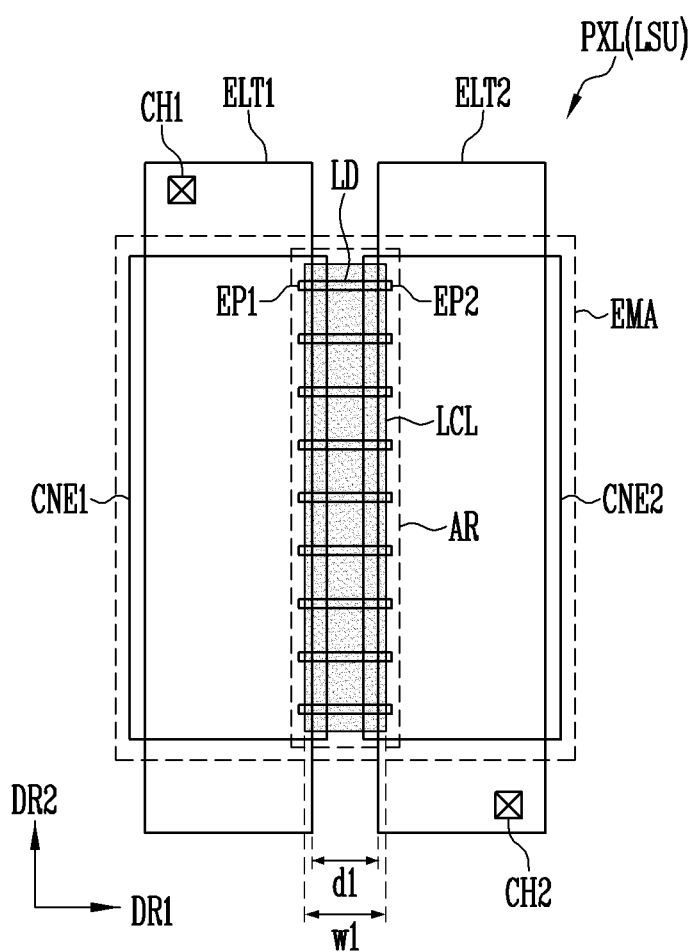
FIGS. 7A-7D are plan views illustrating a pixel according to one or more example embodiments of the present disclosure.
Figure 7B:
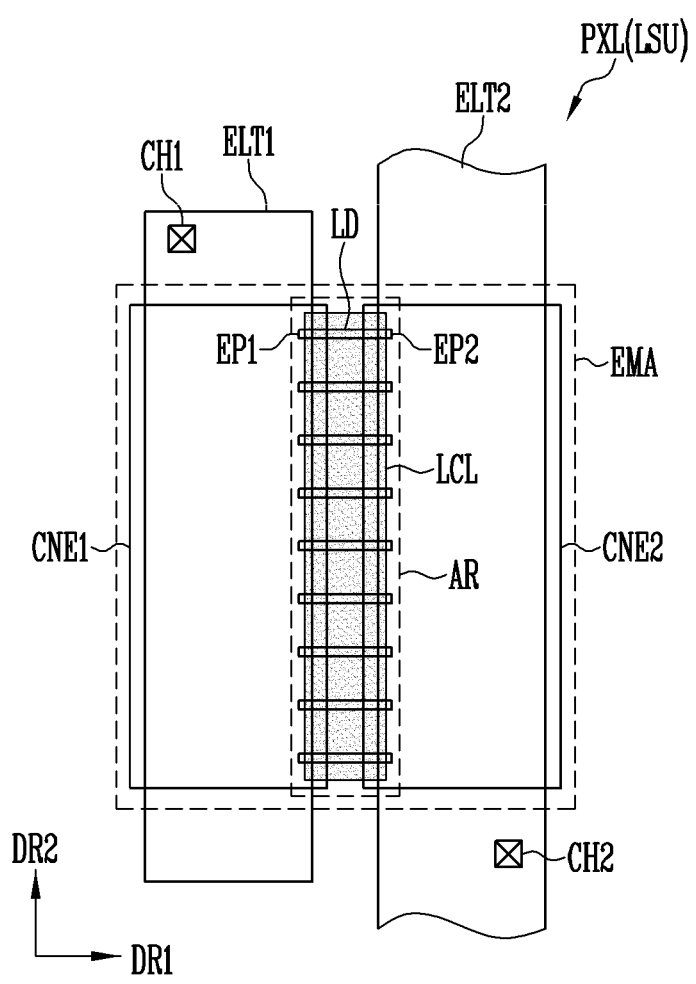
Figure 7C:
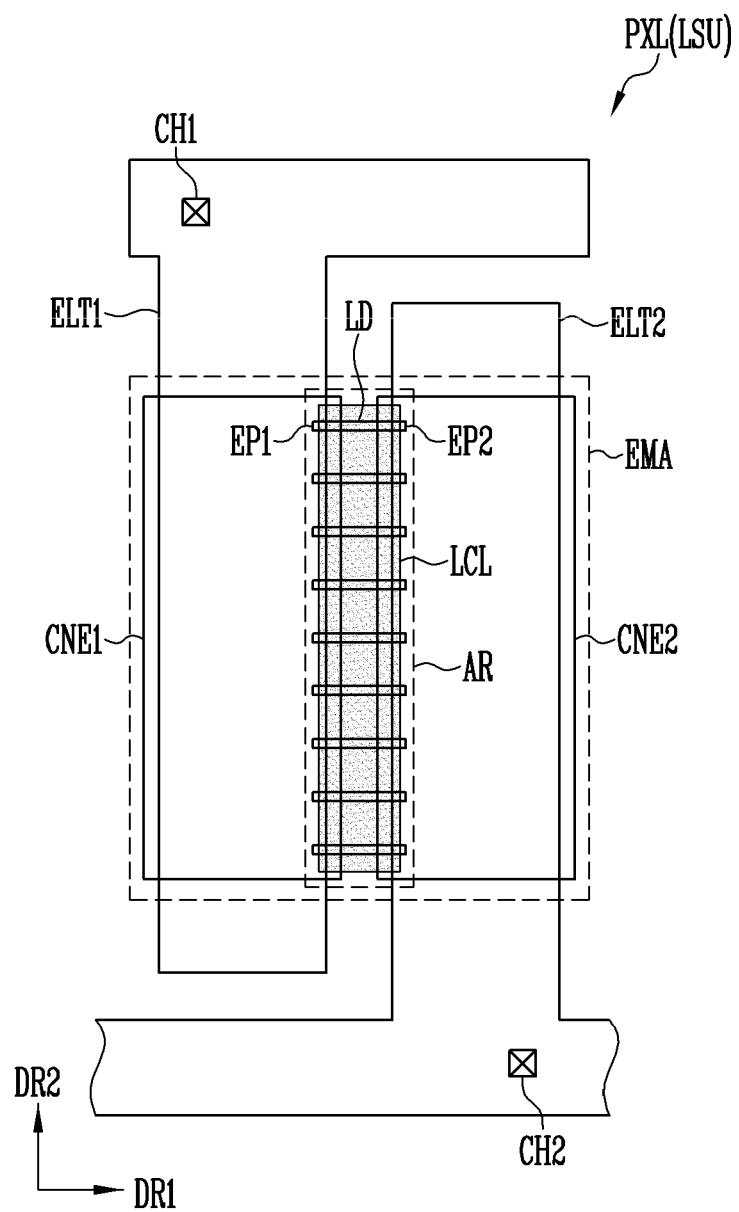
Figure 7D:
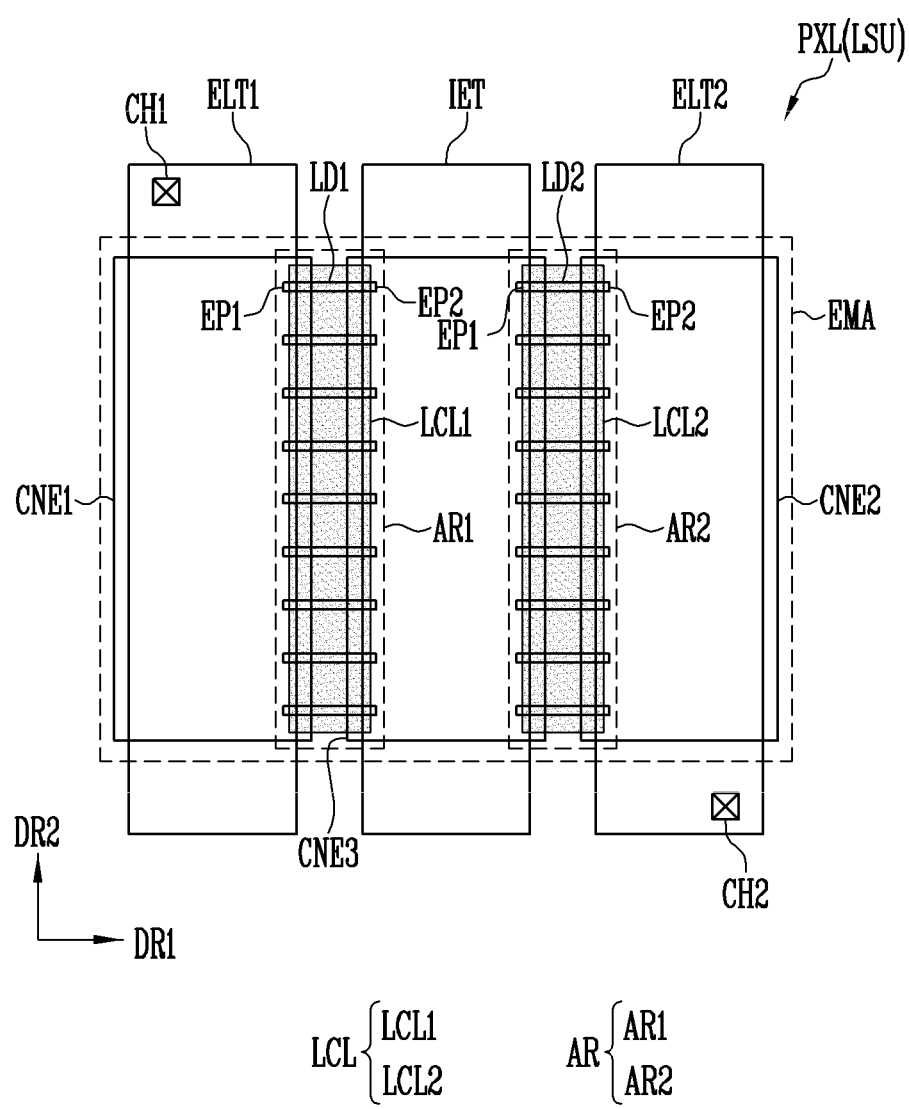

FIGS. 7A-7D are plan views illustrating a pixel PXL according to some embodiments of the disclosure, respectively. For example, FIGS. 7A-7C illustrate embodiments of the pixel PXL including the light source unit LSU of the parallel structure, and illustrate different embodiments in relation to a shape of the first and second electrodes ELT1 and ELT2. In addition, FIG. 7D shows an embodiment of the pixel PXL including the light source unit LSU of the series/parallel mixed structure.

FIGS. 7A-7D show the structure of the pixel PXL centering on the light source unit LSU of each pixel PXL. However, according to some embodiments, each pixel PXL may selectively further include circuit elements (for example, a plurality of circuit elements configuring each pixel circuit PXC) connected to the light source unit LSU.

FIGS. 7A-7D show an embodiment in which each light source unit LSU is connected to a power line (for example, a predetermined power line, e.g., the first and/or second power line PL1 and/or PL2) through first and second contact holes CH1 and CH2, a circuit element (for example, at least one circuit element configuring the pixel circuit PXC) and/or the signal line (for example, the scan line Si and/or the data line Dj). However, the disclosure is not limited thereto. For example, in another embodiment, at least one of the first and second electrodes ELT1 and ELT2 of each pixel PXL may be directly connected to the power line (e.g., the predetermined power line) and/or the signal line without passing through a contact hole, an intermediate line, and/or the like.

First, referring to FIGS. 5-7C, the pixel PXL may include the first electrode ELT1 and the second electrode ELT2 disposed in each emission area EMA of a pixel (PXL), and at least one light emitting element LD (for example, a plurality of light emitting elements LD connected in parallel between the first and second electrodes ELT1 and ELT2) disposed between the first electrode ELT1 and the second electrode ELT2. In addition, the pixel PXL may selectively further include a first contact electrode CNE1 (also referred to as a "third electrode") and a second contact electrode CNE2 (also referred to as a "fourth electrode") that electrically connects the light emitting element LD between the first and second electrodes ELT1 and ELT2 with the first and second electrodes ELT1 and ELT2. The pixel PXL according to some embodiments of the disclosure further includes a light control layer LCL disposed under the light emitting elements LD so as to overlap the light emitting elements LD.

The first electrode ELT1 and the second electrode ELT2 may be disposed in each pixel area in which each pixel PXL is provided and/or formed. For example, the first electrode ELT1 and the second electrode ELT2 may be disposed in the emission area EMA of each pixel PXL.

According to some embodiments, each pixel area may comprehensively mean a pixel circuit area in which circuit elements for configuring a corresponding pixel PXL are disposed and the emission area EMA in which the light source unit LSU of the pixel PXL is disposed. In addition, the emission area EMA may be an area in which the light emitting elements LD (in particular, the effective light sources connected in the forward direction between the first and second electrodes ELT1 and ELT2) configuring the light source unit LSU of each pixel PXL are disposed. In addition, in the emission area EMA, electrodes (for example, predetermined electrodes, e.g., the first and second electrodes ELT1 and ELT2, and/or the first and second contact electrodes CNE1 and CNE2) connected to the light emitting elements LD, or one area of the electrodes may be disposed.

The emission area EMA may be surrounded by a light-blocking and/or reflective bank structure (for example, a pixel defining film and/or a black matrix) formed between the pixels PXL to define each pixel area and the emission area EMA therein. For example, a bank structure (corresponding to a "second bank BNK2" of FIGS. 8A and 8B) surrounding the emission area EMA may be disposed around the emission area EMA.

The first and second electrodes ELT1 and ELT2 may be disposed to be spaced from each other. For example, the first and second electrodes ELT1 and ELT2 may be disposed side by side to be spaced at a distance (e.g., a predetermined distance) along a first direction DR1 in each emission area EMA. In some embodiments, the first direction DR1 may be a horizontal direction (or a row direction), but is not limited thereto.

According to some embodiments, the first and/or second electrodes ELT1 and ELT2 may have a pattern separated for each pixel PXL or a pattern commonly connected in a plurality of pixels PXL. For example, as shown in FIG. 7A, the first and second electrodes ELT1 and ELT2 may have an independent pattern of which both end portions are cut outside a corresponding emission area EMA or inside the emission area EMA. In another embodiment, as shown in FIGS. 7B and 7C, the first electrode ELT1 may have an independent pattern that is cut outside a corresponding emission area EMA or inside the emission area EMA, and one end portion of the second electrode ELT2 may extend along the first direction DR1 or a second direction DR2 and thus the second electrode ELT2 may be integrally connected to the second electrode ELT2 of an adjacent pixel PXL along the first direction DR1 or the second direction DR2. In some embodiments, the second direction DR2 may be a vertical direction (or a column direction), but is not limited thereto.

Before a process of forming the pixel PXL, in particular, an alignment of the light emitting elements LD, is completed, the first electrodes ELT1 of the pixels PXL (e.g., adjacent pixels) disposed in the display area DA may be connected to each other, and the second electrodes ELT2 of the pixels PXL (e.g., adjacent pixels) may be connected to each other. The first and second electrodes ELT1 and ELT2 may receive a first alignment signal (or a first alignment voltage) and a second alignment signal (or a second alignment voltage) in aligning the light emitting elements LD, respectively. For example, one of the first and second electrodes ELT1 and ELT2 may receive an alignment signal of an alternating current type, and the other one of the first and second electrodes ELT1 and ELT2 may receive an alignment voltage (for example, a ground voltage) having a constant voltage level.

That is, an alignment signal (e.g., a predetermined alignment signal) may be applied to the first and second electrodes ELT1 and ELT2 in aligning the light emitting elements LD. Accordingly, an electric field may be formed between the first and second electrodes ELT1 and ELT2. The light emitting elements LD supplied to each pixel area (in particular, the emission area EMA of each pixel PXL) may be self-aligned between the first and second electrodes ELT1 and ELT2 by the electric field. After the alignment of the light emitting elements LD is completed, the pixels PXL may be individually driven by disconnecting at least the first electrodes ELT1 between the pixels PXL (e.g., adjacent pixels).

The first and second electrodes ELT1 and ELT2 may have various shapes. For example, as shown in FIGS. 7A and 7B, each of the first and second electrodes ELT1 and ELT2 may have a bar shape extending in one direction. For example, each of the first and second electrodes ELT1 and ELT2 may have a bar shape extending along the second direction DR2 crossing (for example, orthogonal to) the first direction DR1.

In another embodiment, as shown in FIG. 7C, the first and second electrodes ELT1 and ELT2 may have a bar shape extending along the second direction DR2 in the emission area EMA and may extend along the first direction DR1 outside or around the emission area EMA. For example, the first electrode ELT1 may have a structure that is bent so as to extend along the first direction DR1 from an upper end of the emission area EMA, and the second electrode ELT2 may have a structure that is bent so as to extend along the first direction DR1 from a lower end of the emission area EMA.

In some embodiments, the shape and/or structure of the first and second electrodes ELT1 and ELT2 may be variously changed. For example, the first electrode ELT1 and/or the second electrode ELT2 may be formed as a spiral or circular electrode.

FIGS. 7A-7C disclose an embodiment in which one first electrode ELT1 and one second electrode ELT2 is disposed in each emission area EMA, but the number and/or a mutual disposition structure of the first and second electrodes ELT1 and ELT2 disposed in each pixel PXL may be variously changed. For example, in another embodiment, a plurality of first electrodes ELT1 and/or second electrodes ELT2 may be disposed in the emission area EMA of each pixel PXL.

When a plurality of first electrodes ELT1 are disposed in one pixel PXL, the first electrodes ELT1 may be integrally or non-integrally connected to each other. For example, the first electrodes ELT1 may be integrally connected or may be connected to each other by a bridge pattern positioned on a layer (for example, a circuit layer on which the pixel circuit PXC is disposed) different from that of the first electrodes ELT1. Similarly, when a plurality of second electrodes ELT2 are disposed in one pixel PXL, the second electrodes ELT2 may be integrally or non-integrally connected to each other. For example, the second electrodes ELT2 may be integrally connected or may be connected to each other by a bridge pattern positioned on a layer different from the second electrodes ELT2.

That is, in the disclosure, the shape, number, arrangement direction, mutual disposition relationship, and/or the like of the first and second electrodes ELT1 and ELT2 disposed in each pixel PXL may be variously changed.

The first electrode ELT1 may be electrically connected to a circuit element (for example, a predetermined circuit element, e.g., at least one transistor configuring the pixel circuit PXC) through a first contact hole CH1, a power line (for example, the first power line PL1), and/or the signal line (for example, the scan line Si, the data line Dj, or a predetermined control line). However, the disclosure is not limited thereto. For example, in another embodiment, the first electrode ELT1 may be directly connected to a power line or a signal line (e.g., a predetermined power line or signal line).

In some embodiments, the first electrode ELT1 may be electrically connected to a circuit element (e.g., a predetermined circuit element) disposed under the first electrode ELT1 through the first contact hole CH1 and may be electrically connected to a first line through the circuit element. The first line may be the first power line PL1 for supplying the first power VDD, but is not limited thereto. For example, the first line may be a signal line supplied with a first driving signal (for example, a predetermined first driving signal, e.g., a scan signal, a data signal, or a predetermined control signal).

The second electrode ELT2 may be electrically connected to a circuit element (for example, a predetermined circuit element, e.g., at least one transistor configuring the pixel circuit PXC), a power line (for example, the second power line PL2), and/or a signal line (for example, the scan line Si, the data line Dj, or a predetermined control line) through the second contact hole CH2. However, the disclosure is not limited thereto. For example, in another embodiment, the second electrode ELT2 may be directly connected to a power line or a signal line (e.g., a predetermined power line or signal line).

In some embodiments, the second electrode ELT2 may be electrically connected to a second line disposed under the second electrode ELT2 through the second contact hole CH2. The second line may be the second power line PL2 for supplying the second power VSS, but is not limited thereto. For example, the second line may be a signal line supplied with a second driving signal (for example, a predetermined second driving signal, e.g., a scan signal, a data signal, or a predetermined control signal).

Each of the first and second electrodes ELT1 and ELT2 may be configured of a single layer or multiple layers. For example, the first electrode ELT1 may include a reflective electrode layer of at least one layer including a reflective conductive material (for example, metal), and may selectively further include a transparent electrode layer and/or a conductive capping layer of at least one layer. Similarly, the second electrode ELT2 may include a reflective electrode layer of at least one layer including a reflective conductive material, and may selectively further include a transparent electrode layer and/or a conductive capping layer of at least one layer.

The light emitting elements LD may be disposed between the first electrode ELT1 and the second electrode ELT2. For example, the light emitting elements LD may be connected in parallel between the first electrode ELT1 and the second electrode ELT2. For example, each light emitting element LD may be aligned in the first direction DR1 between the first electrode ELT1 and the second electrode ELT2, and may be electrically connected between the first and second electrodes ELT1 and ELT2.

FIGS. 7A-7D show that all light emitting elements LD are uniformly aligned in the first direction DR1, but the disclosure is not limited thereto. For example, at least one of the light emitting elements LD may be aligned in a diagonal direction or the like inclined with respect to the first and second directions DR1 and DR2 between the first and second electrodes ELT1 and ELT2.

According to some embodiments, each light emitting element LD may be a micro light emitting element of a small size as small as, for example, a nano scale to a micro scale, using a material of an inorganic crystal structure. For example, each light emitting element LD may be a micro light emitting element having a size in a nano scale to micro scale range, as shown in FIGS. 1A-4B. However, the type and/or size of the light emitting element LD may be variously changed according to design condition of each light emitting device using the light emitting element LD as a light source, for example, the pixel PXL.

Each light emitting element LD may include the first end portion EP1 disposed toward the first electrode ELT1, and the second end portion EP2 disposed toward the second electrode ELT2. In some embodiments, each light emitting element LD may overlap the first electrode ELT1 and/or the second electrode ELT2, or may not overlap the first electrode ELT1 and/or the second electrode ELT2. For example, the first end portion EP1 of the light emitting element LD may or may not overlap the first electrode ELT1. Similarly, the second end portion EP2 of the light emitting element LD may or may not overlap the second electrode ELT2.

According to some embodiments, the first end portion EP1 of each of the light emitting elements LD may be connected to the first electrode ELT1, and the second end portion EP2 of each of the light emitting elements LD may be connected to the second electrode ELT2. For example, the first end portion EP1 of each of the light emitting elements LD may be electrically connected to the first electrode ELT1 through the first contact electrode CNE1, and the second end portion EP2 of each of the light emitting elements LD may be electrically connected to the second electrode ELT2 through the second contact electrode CNE2. In another embodiment, the first end portion EP1 of each of the light emitting elements LD may be electrically connected to the first electrode ELT1 by directly contacting the first electrode ELT1. Similarly, the second end portion EP2 of each of the light emitting elements LD may be electrically connected to the second electrode ELT2 by directly contacting the second electrode ELT2. In this case, the first contact electrode CNE1 and/or the second contact electrode CNE2 may be selectively formed.

According to some embodiments, the light emitting elements LD may be prepared in a form dispersed in a solution (e.g., a predetermined solution), and may be supplied to each pixel area (in particular, the emission area EMA of each pixel PXL) through various methods including an inkjet method or a slit coating method. For example, the light emitting elements LD may be mixed with a volatile solvent and supplied to the emission area EMA of each pixel PXL. At this time, when an alignment voltage (or a predetermined alignment voltage or an alignment signal) is applied to the first and second electrodes ELT1 and ELT2 of the pixels PXL, an electric field is formed between the first and second electrodes ELT1 and ELT2, and thus the light emitting elements LD are aligned between the first and second electrodes ELT1 and ELT2. After the light emitting elements LD are aligned, the light emitting elements LD may be stably arranged between the first and second electrodes ELT1 and ELT2 by volatilizing the solvent or removing the solvent in other methods.

According to some embodiments, the first contact electrode CNE1 and the second contact electrode CNE2 may be formed on the both end portions of the light emitting elements LD, for example, the first and second end portions EP1 and EP2, respectively. In some embodiments, the first contact electrode CNE1 and the second contact electrode CNE2 may be formed on the first and second electrodes ELT1 and ELT2, respectively, to connect the first and second end portions EP1 and EP2 of the light emitting elements LD to the first and second electrodes ELT1 and ELT2, respectively. Accordingly, the light emitting elements LD may be more stably connected between the first and second electrodes ELT1 and ELT2.

The first contact electrode CNE1 may be disposed on the first electrode ELT1 and the first end portion EP1 of the light emitting element LD so as to overlap the first electrode ELT1 and the first end portion EP1 of at least one light emitting element LD adjacent to the first electrode ELT1. For example, the first contact electrode CNE1 may be disposed on the first electrode ELT1 and the first end portions EP1 of the light emitting elements LD so as to overlap the first electrode ELT1 and the first end portions EP1 of the plurality of light emitting elements LD adjacent to the first electrode ELT1.

The first contact electrode CNE1 may connect the first electrode ELT1 and the first end portions EP1 of the light emitting elements LD. In addition, the first contact electrode CNE1 may stably fix the first end portions EP1 of the light emitting elements LD. In another embodiment, when the first contact electrode CNE1 is not formed, the first end portions EP1 of the light emitting elements LD may be disposed to overlap the first electrode ELT1 adjacent to the first end portions EP1, and may be directly connected to the first electrode ELT1.

The second contact electrode CNE2 may be disposed on the second electrode ELT2 and the second end portion EP2 of the light emitting element LD so as to overlap the second electrode ELT2 and the second end portion EP2 of at least one light emitting element LD adjacent to the second electrode ELT2. For example, the second contact electrode CNE2 may be disposed on the second electrode ELT2 and the second end portions EP2 of the light emitting elements LD so as to overlap the second electrode ELT2 and the second end portions EP2 of the plurality of light emitting elements LD adjacent to the second electrode ELT2.

The second contact electrode CNE2 may connect the second electrode ELT2 and the second end portions EP2 of the light emitting elements LD. In addition, the second contact electrode CNE2 may stably fix the second end portions EP2 of the light emitting elements LD. In another embodiment, when the second contact electrode CNE2 is not formed, the second end portions EP2 of the light emitting elements LD may be disposed to overlap the second electrode ELT2 adjacent to the second end portions EP2, and may be directly connected to the second electrode ELT2.

When the light source unit LSU includes at least two series stages, at least one additional electrode may be further formed in the emission area EMA of each pixel PXL. For example, when the light source unit LSU of the pixel PXL is configured of a series/parallel mixed structure including two series stages, the pixel PXL may further include the intermediate electrode IET disposed between the first and second electrodes ELT1 and ELT2 as shown in FIG. 7D. The intermediate electrode IET may be disposed to be spaced from the first and second electrodes ELT1 and ELT2 between the first and second electrodes ELT1 and ELT2. The intermediate electrode IET may be electrically connected to the first electrode ELT1 and the second electrode ELT2 through at least one first light emitting element LD1 and second light emitting element LD2, respectively. In addition, the pixel PXL may selectively further include a third contact electrode CNE3 for stably connecting the intermediate electrode IET to the second end portions EP2 of the first light emitting elements LD1 and the first end portions EP1 of the second light emitting elements LD2.

In the above-described embodiments, each light emitting element LD connected in the forward direction between the first and second electrodes ELT1 and ELT2 may configure the effective light source of a corresponding pixel PXL. In some embodiments, the effective light sources may be collected to form the light source unit LSU of the corresponding pixel PXL.

For example, when the first power VDD (e.g., a predetermined first control signal including the scan signal, the data signal, or the like) is applied to the first end portions EP1 of the light emitting elements LD via the first power line PL1, the first electrode ELT1, the first contact electrode CNE1, and/or the like, and the second power VSS (or a predetermined second control signal including the scan signal, the data signal, or the like) is applied to the second end portions EP2 of the light emitting elements LD via the second power line PL2, the second electrode ELT2, the second contact electrode CNE2, and/or the like, the light emitting elements LD connected in the forward direction between the first and second electrodes ELT1 and ELT2 emit light. Accordingly, light is emitted from the pixel PXL.

The light control layer LCL may be disposed under the light emitting elements LD so as to overlap at least one area of the light emitting elements LD. For example, the light control layer LCL may be disposed in an area AR in which the light emitting elements LD are arranged so as to overlap the active layer (for example, the active layer 12 of FIGS. 1A-4B) of at least each of the light emitting elements LD. To this end, the light control layer LCL may have a width w1 equal to or greater than a width, a thickness, or a height of the active layer of each of the light emitting elements LD.

For example, in the pixel PXL according to the embodiments of FIGS. 7A-7C, the light control layer LCL may be disposed to correspond to an area between the first and second electrodes ELT1 and ELT2 and have a size corresponding to the area AR in which the light emitting elements LD may be arranged. As in the embodiment of FIG. 7D, when the pixel PXL includes a plurality of series stages (or serial states), the light control layer LCL may be disposed in each of a plurality of areas AR1 and AR2 to have a size corresponding to each of the plurality of areas AR1 and AR2 in which light emitting elements LD (for example, the first light emitting elements LD1 and the second light emitting elements LD2) of each series stage may be aligned. For example, the light control layer LCL may include a first light control layer LCL1 disposed in a first area AR1 in which the first light emitting elements LD1 are arranged, and a second light control layer LCL2 disposed in a second area AR2 in which the second light emitting elements LD2 are arranged.

In some embodiments, the light control layer LCL may have the width w1 greater than a distance dl between the first electrode ELT1 and the second electrode ELT2 (or the light control layer LCL may have the width greater than a distance between the first electrode ELT1 and the intermediate electrode IET and/or the intermediate electrode IET and the second electrode ELT2). Accordingly, the light control layer LCL may be more stably overlap the active layer of each of the light emitting elements LD.

In some embodiments, the light control layer LCL may or may not overlap the first end portion EP1 and/or the second end portion EP2 of each of the light emitting elements LD. That is, the light control layer LCL may be formed to completely cover a lower portion of the light emitting elements LD or to partially cover only a lower portion of one area including the active layer of the light emitting elements LD.

In some embodiments, a size and/or a position of the light control layer LCL may be determined in consideration of various factors. For example, the size and/or the position of the light control layer LCL may be determined in consideration of an effect that the light control layer LCL may have on the electric field formed between the first and second electrodes ELT1 and ELT2 in an alignment process of the light emitting elements LD, or the like.

The light control layer LCL changes a progression path and/or direction of light emitted from the light emitting elements LD downwardly. For example, the light control layer LCL may change the progression path and/or direction of the light so that at least some of the light is emitted from the pixel PXL upwardly, by recirculating the light emitted from the light emitting elements LD downwardly. Here, "light is emitted from the pixel PXL upwardly" may mean that the light is emitted in a front direction of the display panel PNL at an angle belonging to a viewing angle range (e.g., a predetermined viewing angle range) from each pixel PXL.

In order to induce recirculation of light, the light control layer LCL may include a reflective layer and/or a scattering layer. For example, the light control layer LCL may be configured of the reflective layer or the scattering layer, or multiple layers including the reflective layer and the scattering layer.

According to the pixel PXL and the display device including the same according to the above-described embodiments, the light emitted from the light emitting elements LD downwardly may be recirculated to emit the light in the front direction of the display panel PNL. Accordingly, light efficiency of the pixel PXL may be improved.

Figure 8A:
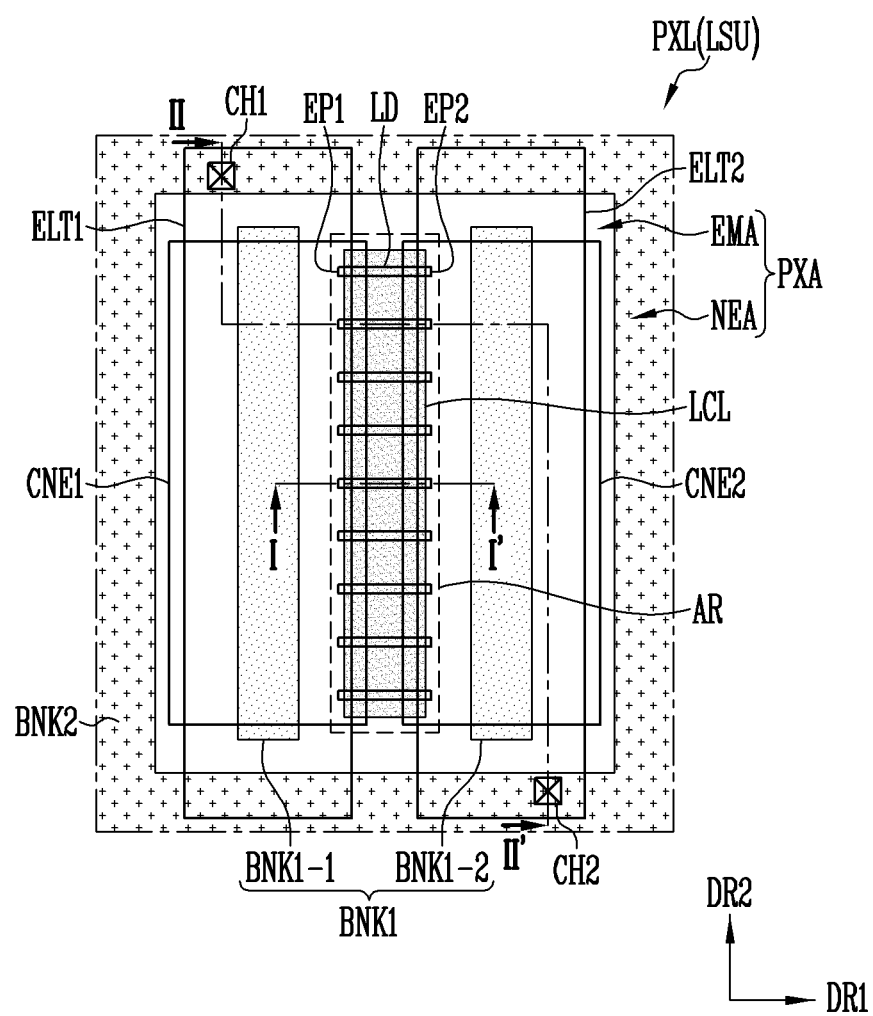
FIGS. 8A and 8B are plan views illustrating a pixel according to one or more example embodiments of the present disclosure.
Figure 8B:
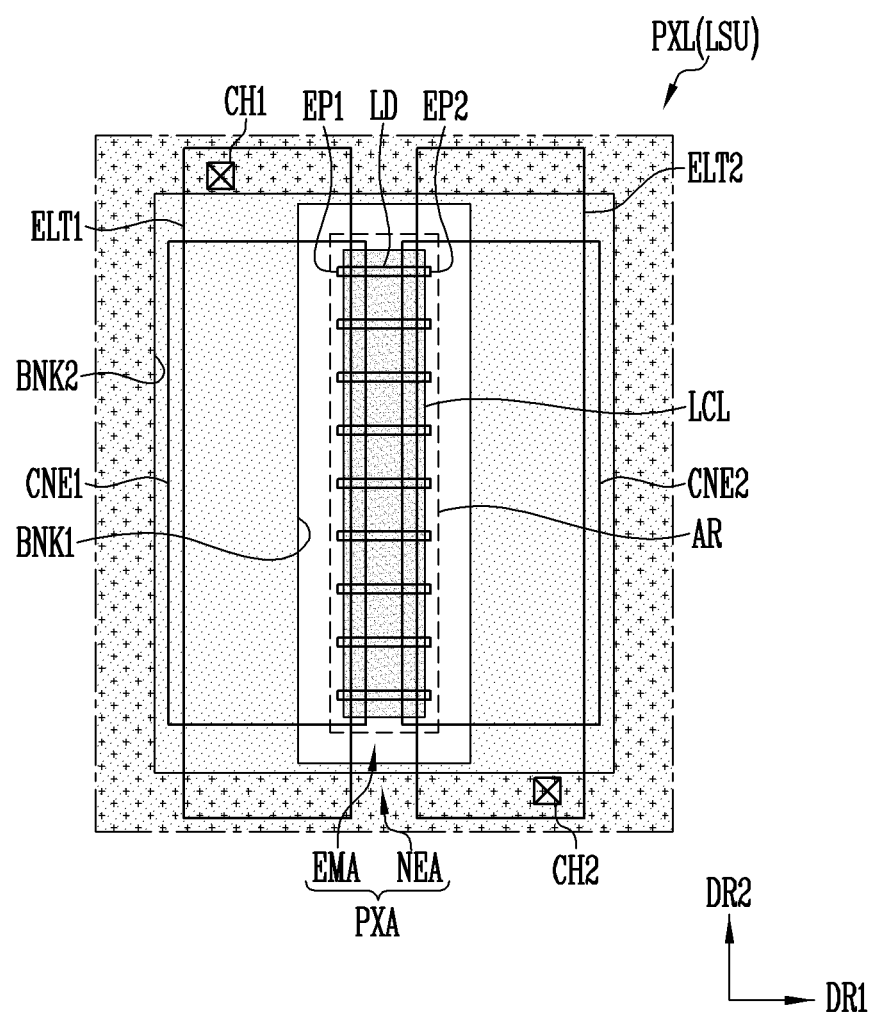

FIGS. 8A and 8B are plan views illustrating a pixel PXL according to some embodiments of the disclosure, respectively. For example, FIGS. 8A and 8B disclose a pixel PXL further including a first bank BNK1 and a second bank BNK2. For example, FIGS. 8A and 8B illustrate different embodiments with respect to a shape and/or a position of the first bank BNK1.

FIGS. 8A and 8B disclose a modified embodiment of the pixel PXL of FIG. 7A, but the pixel PXL to which the first and second banks BNK1 and BNK2 may be applied is not limited thereto. For example, the first and second banks BNK1 and BNK2 of FIGS. 8A and 8B may be applied to the pixels PXL of FIGS. 7B-7D, or other pixels PXL having a different structure.

Referring to FIGS. 7A-8B, each pixel PXL may further include the first bank BNK1 overlapping the first and second electrodes ELT1 and ELT2, and the second bank BNK2 surrounding each emission area EMA along the edge or periphery of the emission area EMA.

The first bank BNK1 (e.g., also referred to as a "partition wall") between two adjacent pixels) may be disposed under the first and second electrodes ELT1 and ELT2. For example, the first bank BNK1 may be disposed under the first and second electrodes ELT1 and ELT2 so as to overlap one area of each of the first and second electrodes ELT1 and ELT2.

The first bank BNK1 may be for forming a wall structure around the light emitting elements LD, and may be formed in a separate or integral pattern. For example, as shown in FIG. 8A, the first bank BNK1 may include a first-first bank BNK1-1 disposed under the first electrode ELT1 so as to overlap one area of the first electrode ELT1, and a first-second bank BNK1-2 disposed under the second electrode ELT2 so as to overlap one area of the second electrode ELT2 and separated from the first-first bank BNK1-1.

In another embodiment, as shown in FIG. 8B, the first bank BNK1 may include an opening or a groove corresponding to an area in which the light emitting elements LD are disposed so as to overlap one area of each of the first and second electrodes ELT1 and ELT2 and the second bank BNK2 and to surround the area in which the light emitting elements LD are disposed. In this case, the first bank BNK1 may be formed in at least a portion of the emission area EMA, and an area including and a non-emission area NEA around the emission area EMA. Here, the non-emission area NEA may refer to a remaining area of each pixel area PXA except for the emission area EMA.

As the first bank BNK1 is disposed under one area of each of the first and second electrodes ELT1 and ELT2, the first and second electrodes ELT1 and ELT2 may protrude in an upward direction in the area in which the first bank BNK1 is formed. The first bank BNK1 may be configured as a reflective bank (also referred to as a "reflective partition wall") together with the first and second electrodes ELT1 and ELT2. For example, the first and second electrodes ELT1 and ELT2 and/or the first bank BNK1 may be formed of a reflective material, or at least one reflective material layer may be formed on the first and second electrodes ELT1 and ELT2 and/or a protruding sidewall of the first bank BNK1. Accordingly, light emitted from the first and second end portions EP1 and EP2 of the light emitting elements LD facing the first and second electrodes ELT1 and ELT2 may be induced to be more directed to a front direction of the display panel PNL. As described above, when one area of the first and second electrodes ELT1 and ELT2 is protruded in the upward direction using the first bank BNK1, a ratio of light facing the front direction of the display panel PNL from among the light generated in the pixel PXL may be increased, and thus light efficiency of the pixel PXL may be improved.

According to some embodiments, the pixel PXL may not include the first bank BNK1. In this case, the first and second electrodes ELT1 and ELT2 may be formed to be substantially flat or to have an uneven surface. For example, one area of the first and second electrodes ELT1 and ELT2 may be protruded in the upward direction by forming each of the first and second electrodes ELT1 and ELT2 in a different thickness for each area to form the uneven surface. Accordingly, the light emitted from the light emitting elements LD may be induced to be more directed to the front direction of the display panel PNL.

The second bank BNK2 may be a structure that defines the emission area EMA of each pixel PXL, and may be, for example, a pixel defining film. For example, the second bank BNK2 may be disposed in a boundary area of each pixel area PXA in which the pixel PXL is provided and/or an area between adjacent pixels PXL to surround the emission area EMA of each pixel PXL along the edge or periphery of the emission area EMA.

The second bank BNK2 may partially overlap the first and/or second electrodes ELT1 and ELT2 or may not overlap the first and/or second electrodes ELT1 and ELT2. For example, the first electrode ELT1 and/or the second electrode ELT2 may extend to the non-emission area NEA so as to overlap the second bank BNK2, or may be disconnected within the emission area EMA so as not to overlap the second bank BNK2.

In addition, the second bank BNK2 may or may not overlap the first contact hole CH1 and/or the second contact hole CH2. For example, the first contact hole CH1 and/or the second contact hole CH2 may be formed in the non-emission area NEA so as to overlap the second bank BNK2, or may be formed in the emission area EMA so as not to overlap the second bank BNK2.

The second bank BNK2 may be configured to include at least one light-blocking and/or reflective material to prevent light leakage between adjacent pixels PXL. For example, the second bank BNK2 may include at least one black matrix material (for example, at least one suitable light-blocking material that is known to one or ordinary skill in the art) of various types of black matrix materials, a color filter material of a specific color, and/or the like. For example, the second bank BNK2 may be formed of a black opaque pattern to block light transmission. In some embodiments, a reflective film which is not shown may be formed on a surface (for example, a sidewall) of the second bank BNK2 to further improve the light efficiency of the pixel PXL.

In some embodiments, in supplying the light emitting elements LD to each pixel PXL, the second bank BNK2 may function as a dam structure defining each emission area EMA to which the light emitting elements LD is to be supplied. For example, each emission area EMA may be partitioned by the second bank BNK2, and thus a light emitting element ink (e.g., an ink including light emitting elements) of a suitable type and/or amount may be supplied to the emission area EMA.

In some embodiments, the second bank BNK2 may be concurrently (e.g., simultaneously) formed at the same layer as the first banks BNK1 in a process of forming the first banks BNK1 of the pixels PXL. In another embodiment, the second bank BNK2 may be formed at a layer that is the same as or different from that of the first banks BNK1 through a process separate from the process of forming the first banks BNK1. For example, the second bank BNK2 may be formed on the first banks BNK1.

Figure 9A:
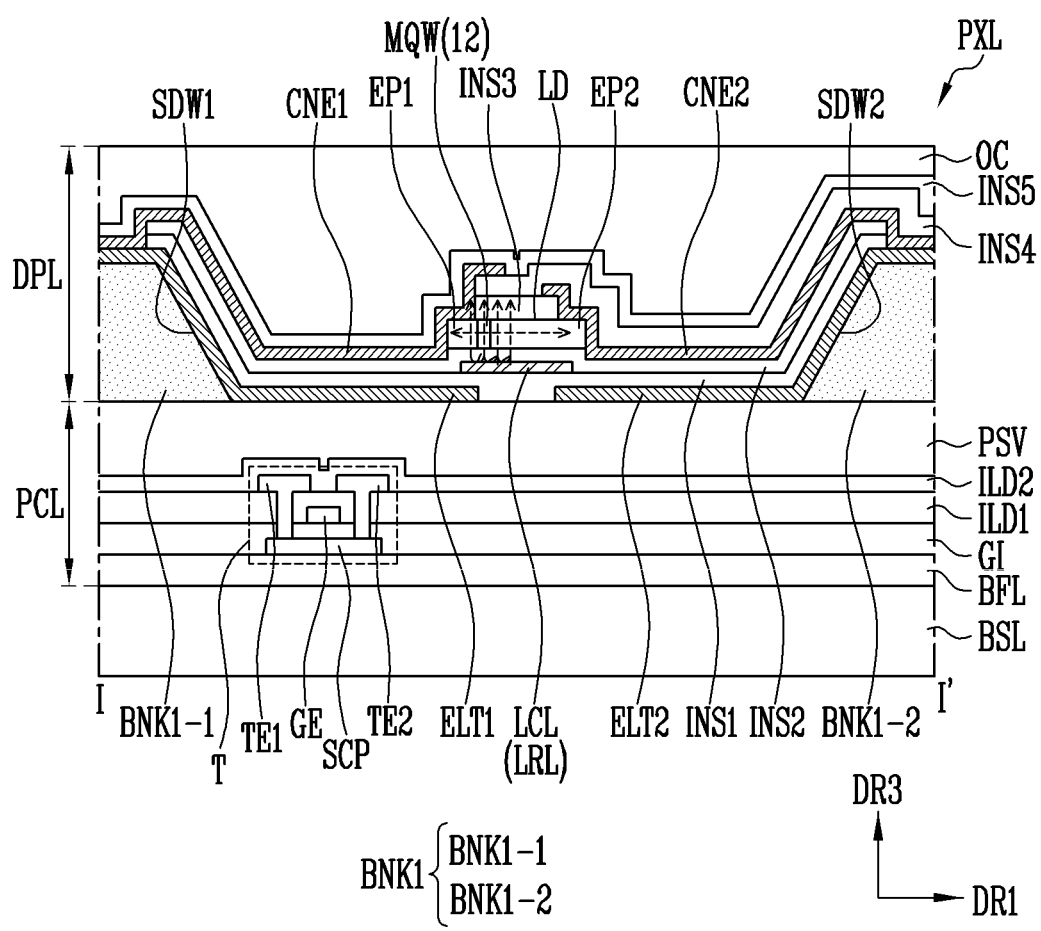
FIGS. 9A-9C are cross-sectional views illustrating a pixel according to one or more example embodiments of the present disclosure.
Figure 9B:
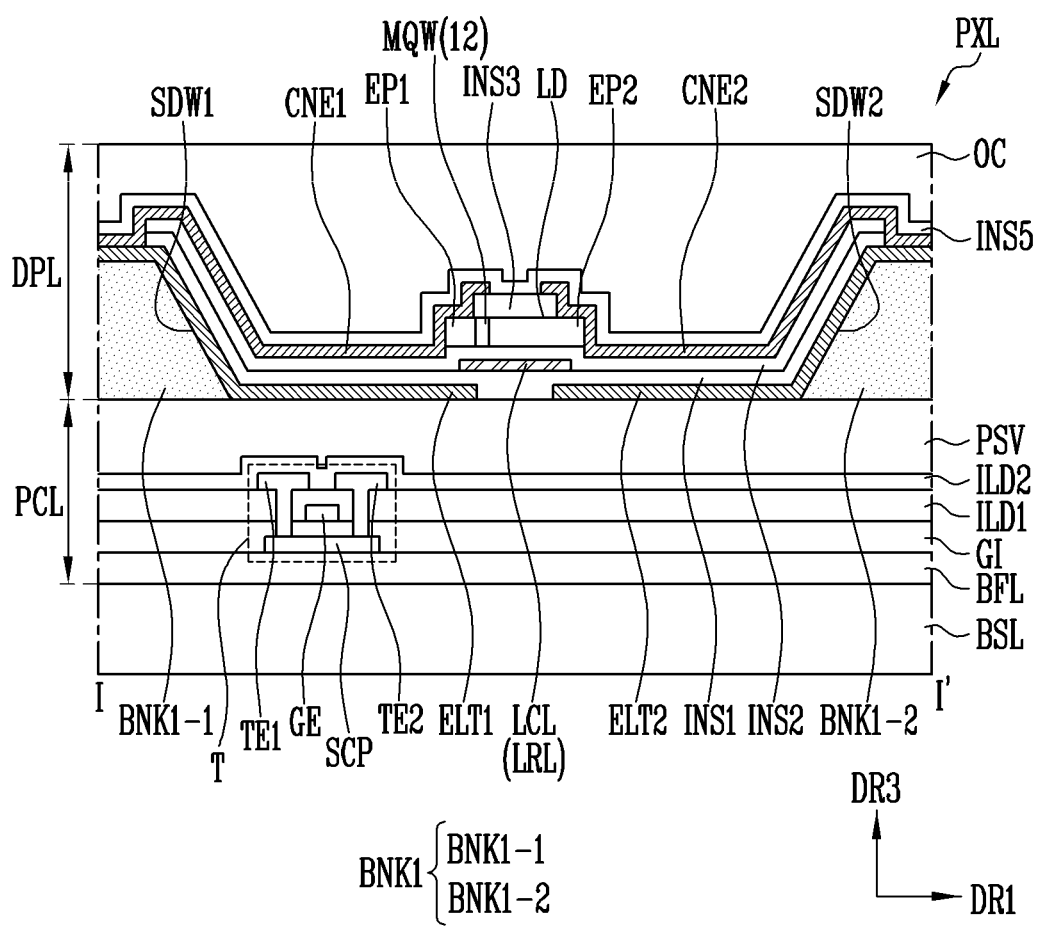
Figure 9C:
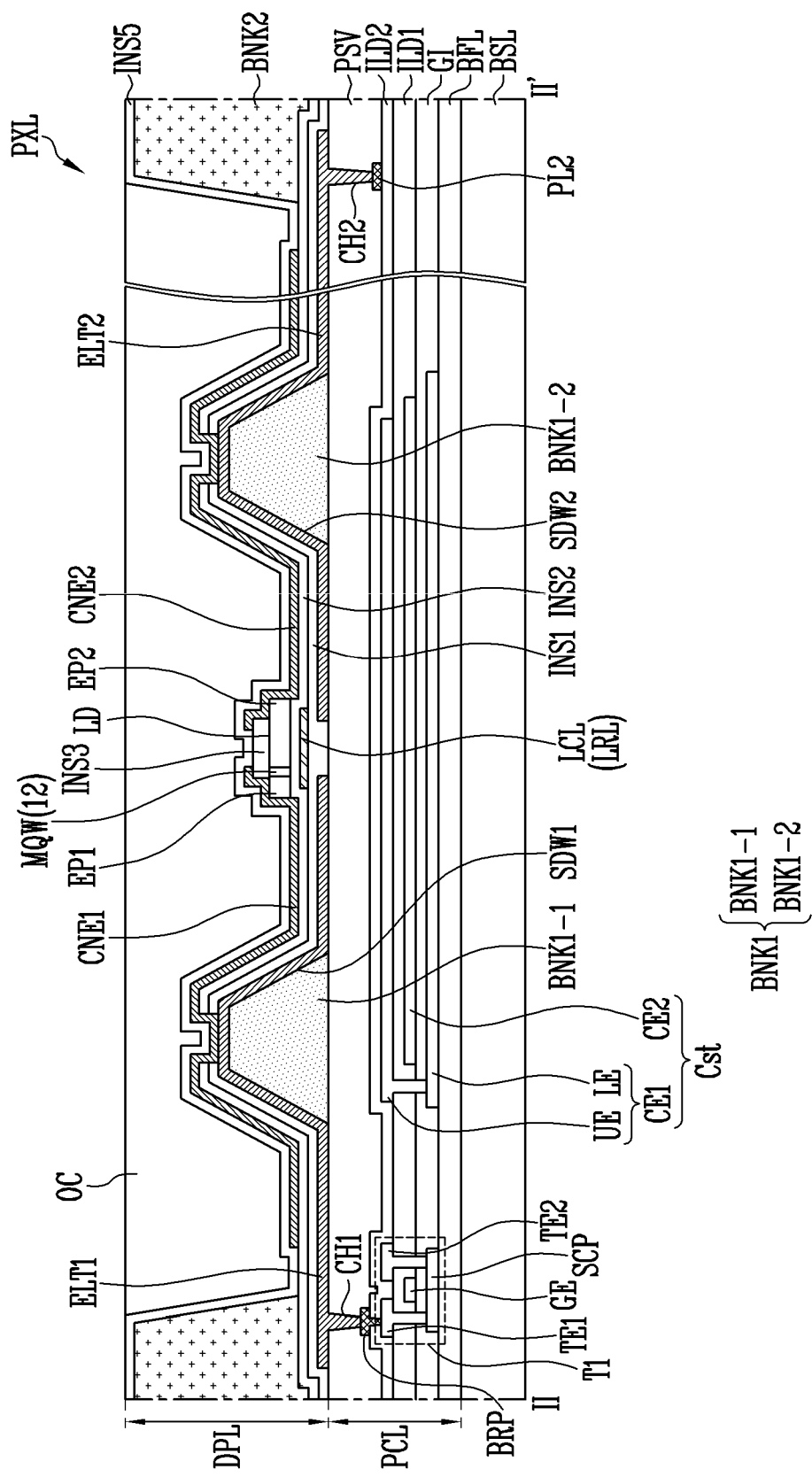

FIGS. 9A-9C are cross-sectional views illustrating a pixel PXL according to one or more example embodiments of the present disclosure. For example, FIGS. 9A and 9B illustrate different embodiments of the cross section of the pixel PXL along the line I-I' of FIG. 8A, and FIG. 9C illustrates an embodiment of the cross section of the pixel PXL along the line II-II' of FIG. 8A. In some embodiments, the pixels PXL disposed in the display area DA may have substantially the same or similar cross-sectional structures.

In order to show various circuit elements configuring the pixel circuit PXC, FIGS. 9A and 9B show any transistor T from among the circuit elements, and FIG. 9C shows a transistor (for example, the first transistor T1 of FIGS. 6A and 6B) connected to the first electrode ELT1, and the storage capacitor Cst, from among the circuit elements. Hereinafter, when it is not necessary to specify the first transistor T1 separately, the first transistor T1 will also be collectively referred to as a "transistor T".

In some embodiments, a structure and/or a position of each layer of the transistors T and the storage capacitor Cst are/is not limited to the embodiment shown in FIGS. 9A-9C, and may be variously changed according to some embodiments. In some embodiments, the transistors T configuring each pixel circuit PXC may have substantially the same or similar structures to each other, but are not limited thereto. For example, in another embodiment, at least one of the transistors T configuring the pixel circuit PXC may have a cross-sectional structure different from that of other transistors T, and/or may be disposed on a layer different from that of other transistors T.

Referring to FIGS. 5-9C, the pixel PXL and the display device having the same according to some embodiments of the disclosure may include a circuit layer PCL and a display layer DPL disposed to overlap each other on one surface of the base layer BSL. For example, the display area DA may include the circuit layer PCL disposed on one surface of the base layer BSL, and the display layer DPL disposed on the circuit layer PCL.

The circuit layer PCL is interposed between the base layer BSL and the display layer DPL. For example, the circuit layer PCL may be interposed between the base layer BSL and the first and second electrodes ELT1 and ELT2 of the display layer DPL. However, a position of the circuit layer PCL may be variously changed according to some embodiments. For example, in another embodiment, the display layer DPL may be first disposed on one surface of the base layer BSL, and the circuit layer PCL may be disposed on the display layer DPL. In still another embodiment, electrodes of the display layer DPL and/or the light emitting elements LD may be disposed at the same layer as circuit elements and/or lines of the circuit layer PCL.

According to some embodiments, the circuit elements configuring the pixel circuit PXC of each pixel PXL and various lines connected to the circuit elements may be disposed in the circuit layer PCL. In some embodiments, electrodes (for example, the first and second electrodes ELT1 and ELT2 and/or the first and second contact electrodes CNE1 and CNE2) configuring the light source unit LSU of each pixel PXL, and the light emitting elements LD may be disposed in the display layer DPL. In addition, the light control layer LCL positioned in an intermediate layer between the first and second electrodes ELT1 and ELT2 and the light emitting elements LD may be disposed in the display layer DPL. As described above, when the light control layer LCL is disposed in the display layer DPL to be positioned closer to the light emitting elements LD (e.g., below the light emitting element LD on a first insulating layer INS1), light efficiency of the pixel PXL may be significantly improved or maximized by the light control layer LCL.

The circuit layer PCL may include at least one circuit element electrically connected to the light emitting elements LD of each pixel PXL. For example, the circuit layer PCL may include the plurality of transistors T and the storage capacitor Cst disposed in each pixel area PXA and configuring the pixel circuit PXC of a corresponding pixel PXL. In addition, the circuit layer PCL may further include at least one power line and/or signal line connected to each pixel circuit PXC and/or the light source unit LSU. For example, the circuit layer PCL may include the first power line PL1, the second power line PL2, and the scan line Si and the data line Dj of each pixel PXL. In some embodiments, when the pixel circuit PXC is omitted and the light source unit LSU of each pixel PXL is directly connected to the first and second power lines PL1 and PL2 (or predetermined signal lines), the circuit layer PCL may be omitted.

In some embodiments, the circuit layer PCL may include a plurality of insulating layers. For example, the circuit layer PCL may include a buffer layer BFL, a gate insulating layer GI, a first interlayer insulating layer ILD1, a second interlayer insulating layer ILD2, and/or a passivation layer PSV sequentially stacked on one surface of the base layer BSL. In addition, the circuit layer PCL may further include at least one light blocking pattern (not shown) or the like disposed under the transistor T.

The buffer layer BFL may prevent an impurity from diffusing into each circuit element. The buffer layer BFL may be configured of a single layer, or may be configured of multiple layers of at least two or more layers. When the buffer layer BFL is provided in multiple layers, each layer may be formed of the same material or may be formed of different materials. Various circuit elements such as the transistors T and the storage capacitor Cst, and various lines connected to the circuit elements may be disposed on the buffer layer BFL. According to some embodiments, the buffer layer BFL may be omitted, and in this case, at least one circuit element and/or line may be directly disposed on one surface of the base layer BSL.

Each transistor T includes a semiconductor pattern SCP (also referred to as a "semiconductor layer" or an "active layer"), a gate electrode GE, and first and second transistor electrodes TE1 and TE2. FIGS. 9A-9C show an embodiment in which each transistor T includes the first and second transistor electrodes TE1 and TE2 formed separately from the semiconductor pattern SCP, but the disclosure is not limited thereto. For example, in another embodiment, the first and/or second transistor electrodes TE1 and/or TE2 included in the at least one transistor T may be configured integrally with each semiconductor pattern SCP.

The semiconductor pattern SCP may be disposed on the buffer layer BFL. For example, the semiconductor pattern SCP may be disposed between the base layer BSL on which the buffer layer BFL is formed and the gate insulating layer GI. The semiconductor pattern SCP may include a first region contacting a first transistor electrode TE1, a second region contacting a second transistor electrode TE2, and a channel region positioned between the first and second regions. According to some embodiments, one of the first and second regions may be a source region and the other may be a drain region.

According to some embodiments, the semiconductor pattern SCP may be a semiconductor pattern formed of poly silicon, amorphous silicon, oxide semiconductor, or the like. In some embodiments, the channel region of the semiconductor pattern SCP may be an intrinsic semiconductor as a semiconductor pattern that is not doped with an impurity, and each of the first and second regions of the semiconductor pattern SCP may be a semiconductor pattern doped with an impurity (e.g., a predetermined impurity).

In some embodiments, the semiconductor patterns SCP of the transistors T configuring each pixel circuit PXC may be formed of substantially the same or similar material. For example, the semiconductor pattern SCP of the transistors T may be formed of any one of the same material from among polysilicon, amorphous silicon, and oxide semiconductor.

In another embodiment, some transistors T and remaining transistors T may include semiconductor patterns SCP formed of different materials. For example, the semiconductor pattern SCP of some transistors T may be formed of poly silicon or amorphous silicon, and the semiconductor pattern SCP of the remaining transistors T may be formed of an oxide semiconductor.

The gate insulating layer GI may be disposed on the semiconductor pattern SCP. For example, the gate insulating layer GI may be disposed between the semiconductor pattern SCP and the gate electrode GE. The gate insulating layer GI may be configured of a single layer or multiple layers, and may include at least one inorganic insulating material and/or organic insulating material. For example, the gate insulating layer GI may include various types of organic/inorganic insulating materials including silicon nitride (SiNx) or silicon oxide (SiOx).

The gate electrode GE may be disposed on the gate insulating layer GI. For example, the gate electrode GE may be disposed with the gate insulating layer GI interposed therebetween and may be disposed to overlap the semiconductor pattern SCP. FIGS. 9A-9C show a transistor T of a top-gate structure, but in another embodiment, the transistor T may have a bottom-gate structure. In this case, the gate electrode GE may be disposed under the semiconductor pattern SCP to overlap the semiconductor pattern SCP.

The first interlayer insulating layer ILD1 may be disposed on the gate electrode GE. For example, the first interlayer insulating layer ILD1 may be disposed between the gate electrode GE and the first and second transistor electrodes TE1 and TE2. The first interlayer insulating layer ILD1 may be configured of a single layer or multiple layers, and may include at least one inorganic insulating material and/or organic insulating material. For example, the first interlayer insulating layer ILD1 may include various types of organic/inorganic insulating materials including silicon nitride (SiNx) or silicon oxide (SiOx), and a configuration material of the first interlayer insulating layer ILD1 is not particularly limited.

The first and second transistor electrodes TE1 and TE2 may be disposed on each semiconductor pattern SCP with the first interlayer insulating layer ILD1 of at least one layer interposed therebetween. For example, the first and second transistor electrodes TE1 and TE2 may be disposed on the semiconductor pattern SCP with the gate insulating layer GI and the first interlayer insulating layer ILD1 interposed therebetween, and may be disposed on (or connected to) different end portions (or different end regions) of the semiconductor pattern SCP. The first and second transistor electrodes TE1 and TE2 may be electrically connected to respective semiconductor patterns SCP (or respective regions of a same semiconductor pattern SCP). For example, the first and second transistor electrodes TE1 and TE2 may be connected to the first and second regions of the semiconductor pattern SCP through respective contact holes passing through the gate insulating layer GI and the first interlayer insulating layer ILD1. According to some embodiments, one of the first and second transistor electrodes TE1 and TE2 may be a source electrode and the other one may be a drain electrode.

At least one transistor T included in the pixel circuit PXC may be connected to at least one pixel electrode. For example, the first transistor T1 shown in FIGS. 6A-6C or the sixth and seventh transistors T6 and T7 shown in FIG. 6D may be electrically connected to the first electrode ELT1 of a corresponding pixel PXL through a contact hole (for example, the first contact hole CH1) passing through the passivation layer PSV, and/or a bridge pattern BRP (see, for example, FIG. 9C).

The storage capacitor Cst includes a first capacitor electrode CE1 and a second capacitor electrode CE2 overlapping each other. Each of the first and second capacitor electrodes CE1 and CE2 may be configured as a single layer or multiple layers. In addition, at least one of the first and second capacitor electrodes CE1 and CE2 may be disposed at the same layer as at least one electrode or semiconductor pattern SCP configuring the first transistor T1.

For example, the first capacitor electrode CE1 may be configured as an electrode of multiple layers including a lower electrode LE disposed at the same layer as the semiconductor pattern SCP of the first transistor T1, and an upper electrode UE disposed at the same layer as the first and second transistor electrodes TE1 and TE2 of the first transistor T1 and electrically connected to the lower electrode LE. In addition, the second capacitor electrode CE2 may be configured as an electrode of a single layer disposed at the same layer as the gate electrode of the first transistor T1 and disposed between the lower electrode LE and the upper electrode UE of the first capacitor electrode CE1.

However, a structure and/or a position of each of the first and second capacitor electrodes CE1 and CE2 may be variously changed. For example, in another embodiment, any one of the first and second capacitor electrodes CE1 and CE2 may include a conductive pattern disposed on a layer different from that of electrodes configuring the first transistor T1 (for example, the gate electrode GE and the first and second transistor electrodes TE1 and TE2) and the semiconductor pattern SCP. For example, the first capacitor electrode CE1 or the second capacitor electrode CE2 may have a single layer or multi-layer structure including a conductive pattern disposed on the second interlayer insulating layer ILD2.

In some embodiments, at least one signal line and/or power line connected to each pixel PXL may be disposed at the same layer as one electrode of the circuit elements configuring the pixel circuit PXC. For example, the scan line Si of each pixel PXL may be disposed at the same layer as the gate electrodes GE of the transistors T, and the data line Dj of each pixel PXL may be disposed at the same layer as the first and second transistor electrodes TE1 and TE2 of the transistors T.

The first and/or second power lines PL1 and/or PL2 may be disposed at the same layer as the gate electrodes GE or the first and second transistor electrodes TE1 and TE2 of the transistors T, or may be disposed on a layer different from that of the gate electrodes GE or the first and second transistor electrodes TE1 and TE2 of the transistors T. For example, the second power line PL2 for supplying the second power VSS may be disposed on the second interlayer insulating layer ILD2 and may be at least partially covered by the passivation layer PSV. The second power line PL2 may be electrically connected to the second electrode ELT2 of the light source unit LSU disposed on the passivation layer PSV through the second contact hole CH2 passing through the passivation layer PSV. However, a position and/or a structure of the first and/or second power lines PL1 and/or PL2 may be variously changed. For example, in another embodiment, the second power line PL2 may be disposed at the same layer as the gate electrodes GE or the first and second transistor electrodes TE1 and TE2 of the transistors T, and may be electrically connected to the second electrode ELT2 through at least one bridge pattern (which is not shown) and/or the second contact hole CH2.

The second interlayer insulating layer ILD2 may be disposed on the first interlayer insulating layer ILD1, and may cover the first and second transistor electrodes TE1 and TE2 positioned on the first interlayer insulating layer ILD1, the storage capacitor Cst, and/or the like. The second interlayer insulating layer ILD2 may be configured of a single layer or multiple layers, and may include at least one inorganic insulating material and/or organic insulating material. For example, the second interlayer insulating layer ILD2 may include various types of organic/inorganic insulating materials such as silicon nitride (SiNx) or silicon oxide (SiOx), and a configuration material of the second interlayer insulating layer ILD2 is not particularly limited. The bridge pattern BRP for connecting at least one circuit element (for example, the first transistor T1) included in the pixel circuit PXC to the first electrode ELT1, and/or at least one line (for example, the first power line PL1 and/or the second power line PL2) may be disposed on the second interlayer insulating layer ILD2.

However, according to some embodiments, the second interlayer insulating layer ILD2 may be omitted. In this case, the bridge pattern BRP of FIG. 9C may be omitted, and the second power line PL2 may be disposed on a layer (e.g., the first interlayer insulating layer ILD1) on which one electrode of the transistor T is disposed.

The passivation layer PSV may be disposed on the circuit elements including the transistors T and the storage capacitor Cst and/or the first and second power lines PL1 and PL2. The passivation layer PSV may be configured of a single layer or multiple layers, and may include at least one inorganic insulating material and/or organic insulating material. For example, the passivation layer PSV may include at least an organic insulating layer and may substantially planarize a surface of the circuit layer PCL. The display layer DPL may be disposed on the passivation layer PSV.

The display layer DPL may include the light source unit LSU of each pixel PXL. For example, the display layer DPL may include at least one pair of the first electrode ELT1 and the second electrode ELT2 disposed in the emission area EMA of each pixel PXL and configuring the each light source unit LSU, at least one light emitting element LD connected between the first electrode ELT1 and the second electrode ELT2, and the light control layer LCL disposed under the light emitting element LD and on the first insulating layer INS1.

FIGS. 9A-9C show each of the light emitting elements LD, as in the embodiments of FIGS. 6A-8B, each pixel PXL may include a plurality of light emitting elements LD connected in the forward direction between the first and second electrodes ELT1 and ELT2. Therefore, in describing the embodiments of FIGS. 9A-9C and other embodiments to be described later, each embodiment will be described by assuming that the pixel PXL includes the plurality of light emitting elements LD. However, it should be noted that the pixel PXL may include only a single light emitting element LD.

In addition, the display layer DPL may selectively further include the first and second contact electrodes CNE1 and CNE2 for more stably connecting the light emitting elements LD between the first and second electrodes ELT1 and ELT2, the first bank BNK1 for protruding one area of each of the first and second electrodes ELT1 and ELT2 in the upward direction, and/or the second bank BNK2 surrounding each emission area EMA. In addition, the display layer DPL may further include at least one conductive layer, an insulating layer, and/or the like.

For example, the display layer DPL may include the first bank BNK1, the first and second electrodes ELT1, ELT2, the first insulating layer INS1, the light control layer LCL, the second insulating layer INS2, the light emitting elements LD, a third insulating layer INS3, the first and second contact electrodes CNE1, CNE2, a fifth insulating layer INS5, and an overcoat layer OC sequentially disposed and/or formed on the circuit layer PCL. In some embodiments, the first and second contact electrodes CNE1 and CNE2 may be disposed separately on different layers, and in this case, the display layer DPL may further include a fourth insulating layer INS4 interposed between the first and second contact electrodes CNE1 and CNE2 (see, for example, FIG. 10A).

In a case of the second bank BNK2, a position on the cross section may be variously changed. In some embodiments, the second bank BNK2 may be formed on the second insulating layer INS2, but is not limited thereto. For example, in another embodiment, the second bank BNK2 may be disposed at the same layer as the first bank BNK1. In some embodiments, the second bank BNK2 may or may not overlap the first bank BNK1.

The first bank BNK1 may be disposed on one surface of the base layer BSL on which the circuit layer PCL is selectively formed. The first bank BNK1 may be formed in a separate or integral pattern. The first bank BNK1 may protrude in a height direction (for example, a third direction DR3) on one surface of the base layer BSL.

The first bank BNK1 may include first and second sidewalls SDW1 and SDW2 (also referred to as "first and second inclined surfaces") facing the both end portions of the light emitting elements LD. For example, the first bank BNK1 may include a first sidewall SDW1 positioned at a distance adjacent to the first end portions EP1 of the light emitting elements LD and facing the first end portions EP1 of the light emitting elements LD, a second sidewall SDW2 positioned at a distance adjacent to the second end portions EP2 of the light emitting elements LD and facing the second end portions EP2 of the light emitting elements LD.

The first bank BNK1 may have various suitable shapes according to some embodiments. In some embodiments, the first bank BNK1 may be formed to have an inclined surface inclined at an angle of a range (e.g., a predetermined range) with respect to the base layer BSL, as shown in FIGS. 9A-9C. For example, the first bank BNK1 may have an inclined surface inclined at an angle (for example, a predetermined angle of about 40° to 45°) of a range of about 20° to 89° with respect to the base layer BSL.

However, the disclosure is not limited thereto. For example, in another embodiment, the first bank BNK1 may have first and second sidewalls SDW1 and SDW2 of a curved or stepped shape, or the like. For example, the first bank BNK1 may have a cross section of a semicircle or semi-ellipse shape, or the like.

Electrodes and/or insulating layers disposed on the first bank BNK1 may have a shape corresponding to the first bank BNK1. For example, the first electrode ELT1 may include an inclined surface or a curved surface disposed on the first sidewall SDW1 of the first bank BNK1 and may have a shape corresponding to a shape of the first sidewall SDW1. The second electrode ELT2 may include an inclined surface or a curved surface disposed on the second sidewall SDW2 of the first bank BNK1 and may have a shape corresponding to a shape of the second sidewall SDW2. Similarly, the first, second, fourth and/or fifth insulating layers INS1, INS2, INS4, and/or INS5 may include an inclined surface or a curved surface disposed on the first sidewall SDW1 and/or the second sidewall SDW2 of the first bank BNK1 and may have a shape corresponding to the shape of the first sidewall SDW1 and/or the second sidewall SDW2.

However, in the disclosure, the shapes of the first bank BNK1 and the electrodes (e.g., predetermined electrodes) formed thereon are not particularly limited. According to another embodiment, the pixel PXL may not include the first bank BNK1.

The first bank BNK1 may include an insulating material including at least one inorganic material and/or organic material. For example, the first bank BNK1 may include an inorganic layer of at least one layer including various inorganic insulating materials such as silicon nitride (SiNx) or silicon oxide (SiOx). In some embodiments, the first bank BNK1 may include an organic film of at least one layer, a photoresist film, and/or the like including various types of organic insulating materials, or may be configured of an insulator of a single layer or multiple layers including complex organic/inorganic materials. That is, a configuration material and/or a pattern shape of the first bank BNK1 may be variously changed.

In some embodiments, the first bank BNK1 may function as a reflective member. For example, the first bank BNK1 may function as the reflective member that directs the light emitted from each light emitting element LD to a desired direction (for example, an upper direction of the pixel PXL, including the third direction DR3) together with the first and second electrodes ELT1 and ELT2 provided on the first bank BNK1 to improve the light efficiency of the pixel PXL.

The first and second electrodes ELT1 and ELT2 configuring the pixel electrodes of each pixel PXL may be disposed on the first bank BNK1. For example, the first and second electrodes ELT1 and ELT2 may be spaced from each other on one surface of the base layer BSL on which the circuit layer PCL, the first bank BNK1, and/or the like are/is selectively formed. For example, the first and second electrodes ELT1 and ELT2 may be spaced from each other on the upper surface of the passivation layer PSV on which the first bank BNK1 is formed.

According to some embodiments, the first and second electrodes ELT1 and ELT2 may have a shape corresponding to the first bank BNK1. For example, the first and second electrodes ELT1 and ELT2 may protrude in a height direction of the base layer BSL while having respective inclined surfaces or curved surfaces corresponding to the first bank BNK1. When the first bank BNK1 is not formed, the first and second electrodes ELT1 and ELT2 may be formed to be substantially flat on the passivation layer PSV, or may be formed to have different thicknesses for each area and thus one area may protrude in the height direction of the base layer BSL.

Each of the first and second electrodes ELT1 and ELT2 may include at least one conductive material. For example, each of the first and second electrodes ELT1 and ELT2 may include at least one metal from among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and conductive polymers such as PEDOT, but is not limited thereto. For example, each of the first and second electrodes ELT1 and ELT2 may include other conductive materials such as carbon nanotube or graphene. As such, each of the first and second electrodes ELT1 and ELT2 may have conductivity by including at least one of various conductive materials, and a configuration material thereof is not particularly limited. In some embodiments, the first and second electrodes ELT1 and ELT2 may include the same conductive material or different conductive materials.

In some embodiments, each of the first and second electrodes ELT1 and ELT2 may be configured of a single layer or multiple layers. For example, each of the first and second electrodes ELT1 and ELT2 may include a reflective electrode layer including a reflective conductive material. In some embodiments, each of the first and second electrodes ELT1 and ELT2 may selectively further include at least one of a transparent electrode layer of at least one layer disposed on and/or under the reflective electrode layer, and a conductive capping layer of at least one layer covering an upper portion of the reflective electrode layer and/or the transparent electrode layer.

According to some embodiments, the reflective electrode layer may be configured of a conductive material having a uniform reflectance. For example, the reflective electrode layer may be configured of at least one metal from among silver (Ag), magnesium (Mg), aluminum (Al), platinum (Pt), palladium (Pd), gold (Au), nickel (Ni), neodymium (Nd), iridium (Ir), chromium (Cr), titanium (T1), molybdenum (Mo), copper (Cu), and the like, or an alloy thereof, but is not limited thereto. That is, the reflective electrode layers included in each of the first and second electrodes ELT1 and ELT2 may be configured of various reflective conductive materials.

When each of the first and second electrodes ELT1 and ELT2 includes a reflective electrode layer, a ratio of light that propagates in a direction in which the image is displayed (e.g., the front direction of the display panel PNL) from among the light emitted from the both ends (i.e., the first and second end portions EP1 and EP2 of each of the light emitting elements LD) may be increased. For example, when the first and second electrodes ELT1 and ELT2 have the inclined surface or the curved surface corresponding to the first and second sidewalls SDW1 and SDW2 of the first bank BNK1 and disposed to face the first and second end portions EP1 and EP2 of the light emitting elements LD, the light emitted from the first and second end portions EP1 and EP2 of each of the light emitting elements LD may be reflected by adjacent one of the first and second electrodes ELT1 and ELT2 and may further be propagated in the front direction (for example, a direction of a predetermined viewing angle range, including the third direction DR3) of the display panel PNL. Accordingly, a utilization rate of the light generated in the light emitting elements LD may be increased.

In some embodiments, the transparent electrode layer may be configured of various transparent conductive materials. For example, the transparent electrode layer may include at least one of ITO, IZO, ITZO, ZnO, AZO, GZO, ZTO, GTO, and FTO, but is not limited thereto. In some embodiments, each of the first and second electrodes ELT1 and ELT2 may be configured of triple layers having a stacked structure of ITO/Ag/ITO. When each of the first and second electrodes ELT1 and ELT2 is configured of multiple layers, a voltage drop due to a signal delay (RC delay) may be reduced or minimized. Accordingly, a desired voltage may be effectively transferred to the light emitting elements LD.

Additionally, each of the first and second electrodes ELT1 and ELT2 may include the conductive capping layer covering the reflective electrode layer and/or the transparent electrode layer. In this case, the reflective electrode layer or the like of the first and second electrodes ELT1 and ELT2 may be prevented from being damaged caused by a defect occurring in a manufacturing process or the like of the pixel PXL. However, the conductive capping layer may be selectively included in each of the first and second electrodes ELT1 and ELT2, and may be omitted according to some embodiments. In addition, the conductive capping layer may be regarded as a component of each of the first and second electrodes ELT1 and ELT2, or may be regarded as a separate component disposed on the first and second electrodes ELT1 and ELT2.

The first insulating layer INS1 may be disposed on one area of the first and second electrodes ELT1 and ELT2, and the second insulating layer INS2 may be disposed on the first insulating layer INS1. For example, the first and second insulating layers INS1 and INS2 may be sequentially stacked on the first and second electrodes ELT1 and ELT2 to cover one area of each of the first and second electrodes ELT1 and ELT2.

The first and second insulating layers INS1 and INS2 may include an opening exposing different areas of each of the first and second electrodes ELT1 and ELT2. In the area where the first and second insulating layers INS1 and INS2 are opened, the first and second electrodes ELT1 and ELT2 may be electrically connected to the first and second contact electrodes CNE1 and CNE2, respectively.

For example, the first and second insulating layers INS1 and INS2 may expose one area of each of the first and second electrodes ELT1 and ELT2 in one area on the first bank BNK1, and cover remaining areas of each of the first and second electrodes ELT1 and ELT2. A size and/or a position of the first and second insulating layers INS1 and INS2 may be changed. For example, the first and second insulating layers INS1 and INS2 may be locally disposed only in an area between the first and second electrodes ELT1 and ELT2 and the light emitting elements LD.

In some embodiments, the first and second insulating layers INS1 and INS2 may be firstly formed to entirely cover the first and second electrodes ELT1 and ELT2. After the light emitting elements LD are supplied and aligned on the first and second insulating layers INS1 and INS2, the first and second insulating layers INS1 and INS2 may be partially opened to expose one area of the first and second electrodes ELT1 and ELT2. For example, the first and second insulating layers INS1 and INS2 may have the opening exposing one area of the first and second electrodes ELT1 and ELT2 on an upper surface of the first bank BNK1 and may at least partially cover the inclined surface or the curved surface of the first and second electrodes ELT1 and ELT2. As the first and second electrodes ELT1 and ELT2 are covered by the first insulating layer INS1 and the like after the first and second electrodes ELT1 and ELT2 are formed, the first and second electrodes may be prevented from being damaged in a subsequent process.

Each of the first and second insulating layers INS1 and INS2 may be configured of a single layer or multiple layers, and may include at least one inorganic insulating material and/or organic insulating material. For example, each of the first and second insulating layers INS1 and INS2 may include various types of organic/inorganic insulating materials including silicon nitride (SiNx), silicon oxide (SiOx), or aluminum oxide ($Al_2O_3$).

In some embodiments of the disclosure, the light control layer LCL may be disposed between the first and second insulating layers INS1 and INS2. For example, after the first insulating layer INS1 is formed to cover the first and second electrodes ELT1 and ELT2, the light control layer LCL and the second insulating layer INS2 may be sequentially formed on the first insulating layer INS1. In some embodiments, when a separation space is present between the first insulating layer INS1 and the light control layer LCL due to a step formed by the first and second electrodes ELT1 and ELT2, the separation space may be filled with an insulating material introduced in a process of forming the second insulating layer INS2.

The light control layer LCL may be formed at a position corresponding to the area AR in which the light emitting elements LD are to be arranged in a subsequent process, that is, an area between the first and second electrodes ELT1 and ELT2. In some embodiments, the light control layer LCL may be patterned in a size and/or shape (e.g., a predetermined size and/or shape) so as not to overlap or overlap the first and/or second electrodes ELT1 and ELT2. For example, the light control layer LCL may be formed to have the width w1 at which the light control layer LCL may overlap at least active layer of each of the light emitting elements LD.

In some embodiments, each light emitting element LD may be at least one micro light emitting element LD having a size as small as nano scale to micro scale as in the embodiments of FIGS. 1A-4B, and the active layer 12 of the light emitting element LD may be a multiple quantum well layer MQW. In this case, the light control layer LCL may be formed in the area AR in which the light emitting elements LD are to be arranged such that the light control layer LCL has the area sufficient to cover at least a lower portion of the multiple quantum well layer MQW of each of the light emitting elements LD.

The light emitting elements LD may be supplied and aligned in the emission area EMA in which the first and second insulating layers INS1 and INS2 and the light control layer LCL are formed. Prior to the supply of the light emitting elements LD, the second bank BNK2 may be formed around the emission area EMA. For example, the second bank BNK2 may be formed in the display area DA to surround each emission area EMA of each pixel PXL.

The light emitting elements LD may be supplied in the pixel area PXA in which the first bank BNK1, the first and second electrodes ELT1 and ELT2, the first and second insulating layers INS1 and INS2, the light control layer LCL, the second bank BNK2, and the like are formed, and may be aligned between the first and second electrodes ELT1 and ELT2. For example, the plurality of light emitting elements LD may be supplied to the emission area EMA of each pixel PXL through an inkjet method, a slit coating method, or various other methods, and the light emitting elements LD may be aligned applied with directionality between the first and second electrodes ELT1 and ELT2 by an alignment signal (or a predetermined alignment signal or an alignment voltage) applied to each of the first and second electrodes ELT1 and ELT2.

In some embodiments, at least some of the light emitting elements LD may be disposed in a horizontal direction, a diagonal direction, or the like between a pair of first and second electrodes ELT1 and ELT2 so that both end portions (that is, the first and second end portions EP1 and EP2) of the light emitting element LD in a longitudinal direction thereof overlap the neighboring pair of first and second electrodes ELT1 and ELT2. In another embodiment, at least some of the light emitting elements LD may be disposed between the neighboring pair of first and second electrodes ELT1 and ELT2 so as not to overlap the first and second electrodes ELT1 and ELT2, and may be electrically connected to the pair of first and second electrodes ELT1 and ELT2 through the first and second contact electrodes CNE1 and CNE2, respectively. According to another embodiment, the light emitting elements LD may or may not overlap the first and/or second electrodes ELT1 and ELT2, and may be electrically connected between the first and second electrodes ELT1 and ELT2 through the first and second contact electrodes CNE1 and CNE2.

The third insulating layer INS3 may be disposed on one area of the light emitting elements LD. For example, the third insulating layer INS3 may be disposed on one area of each of the light emitting elements LD to expose the first and second end portions EP1 and EP2 of each of the light emitting elements LD. For example, the third insulating layer INS3 may be locally disposed only on one area including a center area of each of the light emitting elements LD.

The third insulating layer INS3 may be formed in an independent pattern in the emission area EMA of each pixel PXL, but is not limited thereto. According to some embodiments, the third insulating layer INS3 may be omitted, and in such a case, one end of each of the first and second contact electrodes CNE1 and CNE2 may be directly positioned on an upper surface of the light emitting elements LD.

The third insulating layer INS3 may be configured of a single layer or multiple layers, and may include at least one inorganic insulating material and/or organic insulating material. For example, the third insulating layer INS3 may include various types of organic/inorganic insulating materials including silicon nitride (SiNx), silicon oxide (SiOx), aluminum oxide ($Al_2O_3$), a photoresist (PR) material, and the like. When the third insulating layer INS3 is formed on the light emitting elements LD after the alignment of the light emitting elements LD is completed, the light emitting elements LD may be prevented from deviating from an aligned position.

The both end portions of the light emitting elements LD, which are not covered by the third insulating layer INS3, that is, the first and second end portions EP1 and EP2, may be covered by the first and second contact electrodes CNE1 and CNE2, respectively. The first and second contact electrodes CNE2 and CNE2 are formed to be spaced from each other. For example, the adjacent first and second contact electrodes CNE1 and CNE2 may be disposed with the third insulating layer INS3 interposed therebetween, and may be disposed to be spaced from each other on the first and second end portions EP1 and EP2 of at least one light emitting element LD.

In some embodiments, the first and second contact electrodes CNE1 and CNE2 may be disposed on the first and second electrodes ELT1 and ELT2 to cover exposed areas of the first and second electrodes ELT1 and ELT2. For example, the first and second contact electrodes CNE1 and CNE2 may be disposed at least one area of each of the first and second electrodes ELT1 and ELT2 to be in contact with each of the first and second electrodes ELT1 and ELT2 on the first bank BNK1 or around the first bank BNK1.

Accordingly, the first and second contact electrodes CNE1 and CNE2 may be electrically connected to the first and second electrodes ELT1 and ELT2, respectively. In addition, each of the first and second electrodes ELT1 and ELT2 may be electrically connected to the first end portion EP1 or the second end portion of at least one adjacent light emitting element LD through the first and second contact electrodes CNE1 and CNE2.

In some embodiments, the first and second contact electrodes CNE1 and CNE2 may be sequentially formed in different layers on one surface of the base layer BSL as shown in FIG. 9A. In this case, the fourth insulating layer INS4 may be additionally disposed between the first contact electrode CNE1 and the second contact electrode CNE2.

The fourth insulating layer INS4 may be disposed on the second contact electrode CNE2 to cover the second contact electrode CNE2. For example, the fourth insulating layer INS4 may be disposed on the third insulating layer INS3 and the second contact electrode CNE2 so that one end portion is interposed between the first contact electrode CNE1 and the second contact electrode CNE2. One end portion of the first contact electrode CNE1 may be disposed on the one end portion of the fourth insulating layer INS4.

A formation sequence of the first and second contact electrodes CNE1 and CNE2 may vary. For example, in another embodiment, the first contact electrode CNE1 may be first formed before the second contact electrode CNE2 is formed, and the second contact electrode CNE2 may be formed on the one end portion of the fourth insulating layer INS4 after the fourth insulating layer INS4 is formed to cover the first contact electrode CNE1 and the third insulating layer INS3.

As described above, when the third and fourth insulating layers INS3 and INS4 are formed on the light emitting elements LD, electrical stability between the first and second end portions EP1 and EP2 of the light emitting elements LD may be secured. For example, the first and second contact electrodes CNE1 and CNE2 may be stably separated by the third and fourth insulating layers INS3 and INS4. Accordingly, a short defect may be effectively prevented from occurring between the first and second end portions EP1 and EP2 of the light emitting elements LD.

The fourth insulating layer INS4 may be configured of a single layer or multiple layers, and may include at least one inorganic insulating material and/or organic insulating material. For example, the fourth insulating layer INS4 may include various types of organic/inorganic insulating materials including silicon nitride (SiNx), silicon oxide (SiOx), aluminum oxide ($Al_2O_3$), a photoresist (PR) material, and the like.

According to some embodiments, the first and second contact electrodes CNE1 and CNE2 may be formed at the same layer. For example, as shown in FIGS. 9B and 9C, the first and second contact electrodes CNE1 and CNE2 may be formed at the same layer on one surface of the base layer BSL. In this case, the first and second contact electrodes CNE1 and CNE2 may be formed concurrently (or simultaneously) in the same process or formed sequentially, and the fourth insulating layer INS4 may be omitted. In this case, a manufacturing process of the pixel PXL and the display device having the same may be simplified.

The first and second contact electrodes CNE1 and CNE2 may be formed of various transparent conductive materials. For example, the first and second contact electrodes CNE1 and CNE2 may include at least one of various transparent conductive materials including ITO, IZO, ITZO, ZnO, AZO, GZO, ZTO, GTO, and FTO, and may be implemented to be substantially transparent or translucent to satisfy a transmittance (e.g., a predetermined transmittance). Accordingly, the light emitted from the light emitting elements LD through each of the first and second end portions EP1 and EP2 may pass through the first and second contact electrodes CNE1 and CNE2 and may be emitted to the outside the display panel PNL.

The fifth insulating layer INS5 may be disposed on the first and second contact electrodes CNE1 and CNE2 and/or the fourth insulating layer INS4. For example, the fifth insulating layer INS5 may be entirely formed and/or disposed on the display area DA to cover the first and second banks BNK1 and BNK2, the first and second electrodes ELT1 and ELT2, the first, second, third and/or fourth insulating layers INS1, INS2, INS3, and INS4, the light emitting elements LD, and the first and second contact electrodes CNE1 and CNE2. The fifth insulating layer INS5 may include an inorganic film and/or organic film of at least one layer.

The fifth insulating layer INS5 may be configured of a single layer or multiple layers, and may include at least one inorganic insulating material and/or organic insulating material. For example, the fifth insulating layer INS5 may include various types of organic/inorganic insulating materials including silicon nitride (SiNx), silicon oxide (SiOx), or aluminum oxide ($Al_2O_3$).

In some embodiments, the fifth insulating layer INS5 may include a thin film encapsulation layer having a multi-layer structure. For example, the fifth insulating layer INS5 may be configured of a thin film encapsulation layer of a multi-layer structure including inorganic insulating layers of at least two layers and an organic insulating layer of at least one layer interposed between the inorganic insulating layers of at least two layers. However, the configuration material and/or the structure of the fifth insulating layer INS5 may be variously changed. According to some embodiments, the overcoat layer OC of at least one layer, an upper substrate, and/or the like may be further disposed on the fifth insulating layer INS5.

The overcoat layer OC may include an epoxy or siloxane-based filler, but is not limited thereto. For example, the overcoat layer OC may be a filler layer including at least one type of filler.

The overcoat layer OC may include a material having a relatively small refractive index so that the light emitted from the light emitting elements LD may be smoothly emitted in the front direction of the display panel PNL including the third direction DR3 or the like. For example, the overcoat layer OC may have a refractive index (for example, about 1.5 to 1.6) smaller than that of the first and second electrodes ELT1 and ELT2 and the first and second contact electrodes CNE1 and CNE2.

Similarly, the first, second, and fifth insulating layers INS1, INS2, and INS5 may also be configured of a material having a relatively small refractive index to allow the light emitted from the light emitting elements LD to be smoothly emitted in the front direction of the display panel PNL. For example, each of the first, second, and fifth insulating layers INS1, INS2, and INS5 may include a low refractive material having a refractive index (for example, about 1.4 to 1.6) similar or identical to that of the overcoat layer OC. For example, each of the first, second, and fifth insulating layers INS1, INS2, and INS5 may include a silicon oxide (SiOx) having a refractive index of 1.52.

For example, the light efficiency of the pixel PXL may be improved by controlling the light emitted from the light emitting elements LD to be directed towards the front direction of the display panel PNL by matching refractive index of at least some of the insulating layers and/or the overcoat layer OC formed in the display layer DPL.

The third and fourth insulating layers INS3 and INS4 may include a low refractive material having a refractive index similar or identical to that of the first, second, and fifth insulating layers INS1, INS2, and INS5, for example, silicon oxide (SiOx), but is not limited thereto. For example, in some embodiments, the third and fourth insulating layers INS3 and INS4 may be formed to have a thickness (e.g., a predetermined thickness) or more to secure electrical stability between the first and second end portions EP1 and EP2 of the light emitting elements LD, and may be concurrently (or simultaneously) etched for simplification of a process. For example, after the third insulating layer INS3 is entirely formed in the display area DA in which the light emitting elements LD are arranged, the third insulating layer INS3 may be firstly etched to expose the second end portions EP2 of the light emitting elements LD. Thereafter, the third insulating layer INS3 may be etched once again after the fourth insulating layer INS4 is formed. For example, after the fourth insulating layer INS4 is first formed entirely to cover the second contact electrode CNE2 and the like, the third and fourth insulating layers INS3 and INS4 may be concurrently (or simultaneously) etched to expose the first end portion EP1 of the light emitting elements LD.

In this case, in order to smoothly and concurrently (or simultaneously) etch the third and fourth insulating layers INS3 and INS4 and prevent damage of the light emitting elements LD positioned thereunder, the third and fourth insulating layers INS3 and INS4 may be formed of a material having a good etching ratio. For example, the third and fourth insulating layers INS3 and INS4 may be formed of the same material, for example, silicon nitride (SiNx) having a good etching ratio.

The pixel PXL according to the above-described embodiments emits light of a desired luminance by using the light emitting elements LD as a light source. For example, a driving current corresponding to a grayscale to be expressed in the pixel PXL may be supplied to the light emitting elements LD using the pixel circuit PXC. Light is generated in the inside of the light emitting elements LD, for example, in the multiple quantum well layer MQW, by the driving current, and the generated light may be emitted to the outside of the pixel PXL via at least one electrode, insulating layer and/or overcoat layer OC disposed in the display layer DPL. In FIG. 9A, a dotted arrow indicates that the light generated in each light emitting element LD may be emitted in a plurality of unspecified directions and the light emitted from each light emitting element LD downwardly may be recirculated by the light control layer LCL or the like.

For example, some of the light generated in the light emitting elements LD may be emitted in an upper direction including the third direction DR3 or the like. The light emitted in the upper direction may be emitted in the front direction of the display panel PNL via the third, fourth, and/or fifth insulating layer INS3, INS4, and/or INS5, the first or second contact electrodes CNE1 or CNE2, and/or the overcoat layer OC.

The other light generated in the light emitting elements LD may be first emitted in a side direction including the first direction DR1 or the like from the light emitting elements LD through the first and second end portions EP1 and EP2, and then may progress in the front direction or the like of the display panel PNL. For example, some of the light emitted from the first and second end portions EP1 and EP2 of the light emitting elements LD may be first progress toward the first and second sidewalls SDW1 and SDW2 of the first bank BNK1, may be reflected by the first and second electrodes ELT1 and ELT2 disposed on the first and second sidewalls SDW1 and SDW2, and may be emitted in the front direction of the display panel PNL via the first and second insulating layers INS1 and INS2, the first contact electrode CNE1 or the second contact electrode CNE2, the fourth insulating layer INS4 and/or the fifth insulating layer INS5, and/or the overcoat layer OC.

The other light generated in the light emitting elements LD may be emitted in the lower direction of the light emitting elements LD. The light emitted in the lower direction may be recirculated by the light control layer LCL, the first electrode ELT1 and/or the second electrode ELT2. Therefore, at least some of the light may be emitted in the front direction of the display panel PNL while progressing in the upper direction of the pixel PXL.

In the above-described embodiments, the light control layer LCL may be a floating pattern interposed between the first insulating layer INS1 and the second insulating layer INS2 and may be electrically isolated. In addition, the first and second insulating layers INS1 and INS2 may have a thickness sufficient to insulate the light control layer LCL from the first and second electrodes ELT1 and ELT2 and the light emitting elements LD. For example, the first insulating layer INS1 may have a thickness sufficient to stably insulate the first and second electrodes ELT1 and ELT2 from the light control layer LCL, and the second insulating layer INS2 may have a thickness sufficient to stably insulate the light control layer LCL from the light emitting elements LD. For example, the second insulating layer INS2 may completely cover the light control layer LCL while having a thickness equal to or greater than that of the light control layer LCL. Accordingly, even though the light control layer LCL has conductivity, a short defect due to the light control layer LCL may be prevented from occurring.

In some embodiments, the light control layer LCL may include a reflective layer LRL of at least one layer. The reflective layer LRL may be configured of metal having high reflectance in a visible wavelength band, for example a metal pattern including at least one of various metal materials, such as aluminum (Al), gold (Au), and silver (Ag). In addition, the reflective layer LRL may have a thickness sufficient to ensure sufficient reflectance (e.g., a predetermined reflectance). For example, sufficient reflectance may be secured by forming the reflective layer LRL to have a thickness of 40 nm or more.

According to the above-described embodiments, the light emitted from the light emitting elements LD downwardly may be reflected in the upper direction of the pixel PXL by disposing the reflective layer LRL under the light emitting elements LD. In addition, a short defect due to the reflective layer LRL may be prevented by disposing double insulating layers, for example, the first and second insulating layers INS1 and INS2 between the first and second electrodes ELT1 and ELT2 and the light emitting elements LD and disposing the reflective layer LRL between the first and second insulating layers INS1 and INS2. In some embodiments, the light efficiency of the pixel PXL may be improved more effectively by disposing the reflective layer LRL in the display layer DPL to be positioned closer to the light emitting elements LD.

Figure 10A:
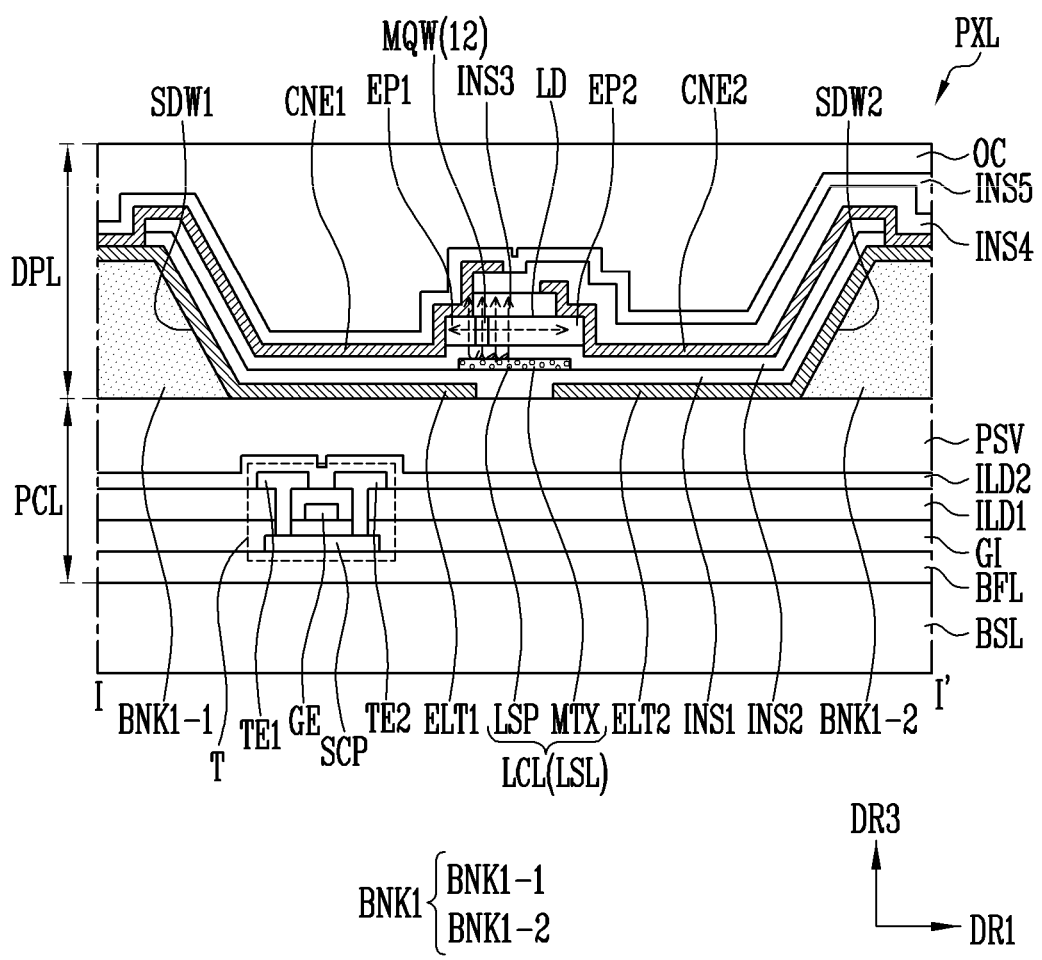
FIGS. 10A-10C are cross-sectional views illustrating a pixel according to one or more example embodiments of the present disclosure.
Figure 10B:
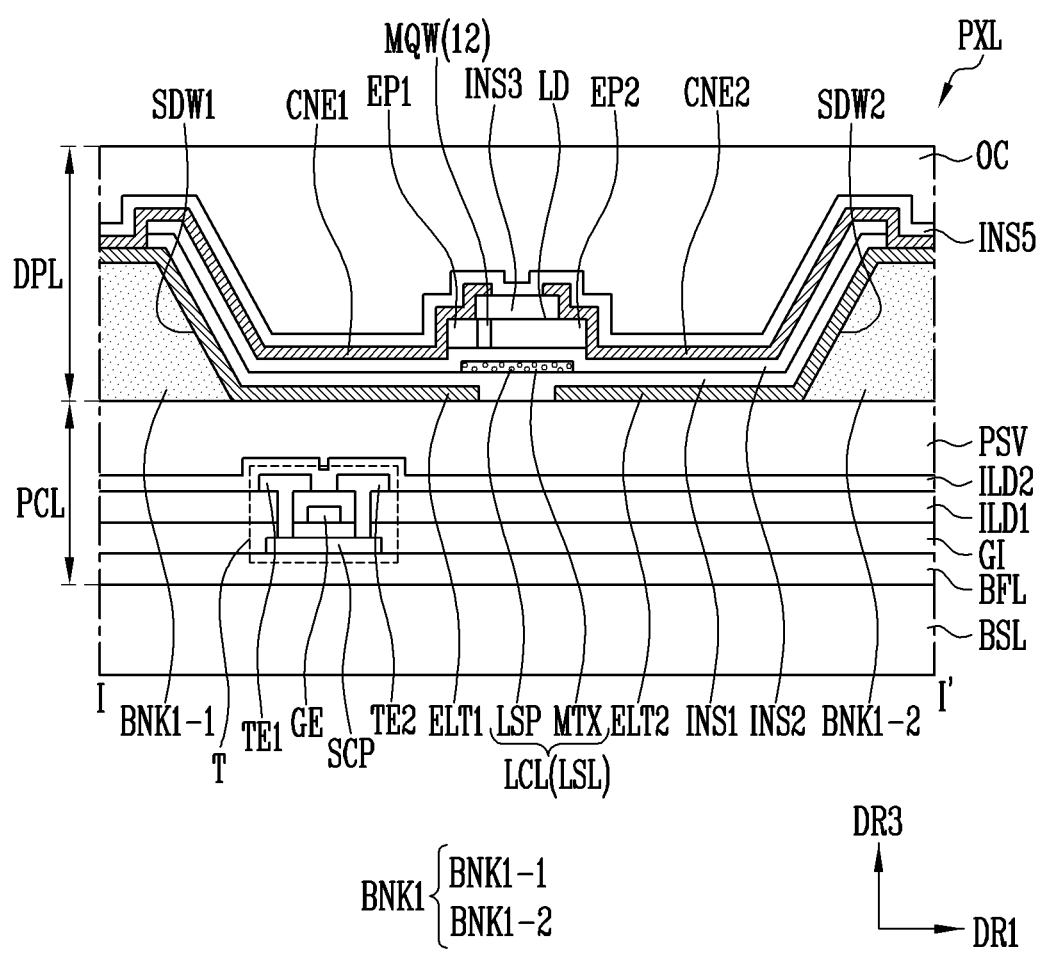
Figure 10C:
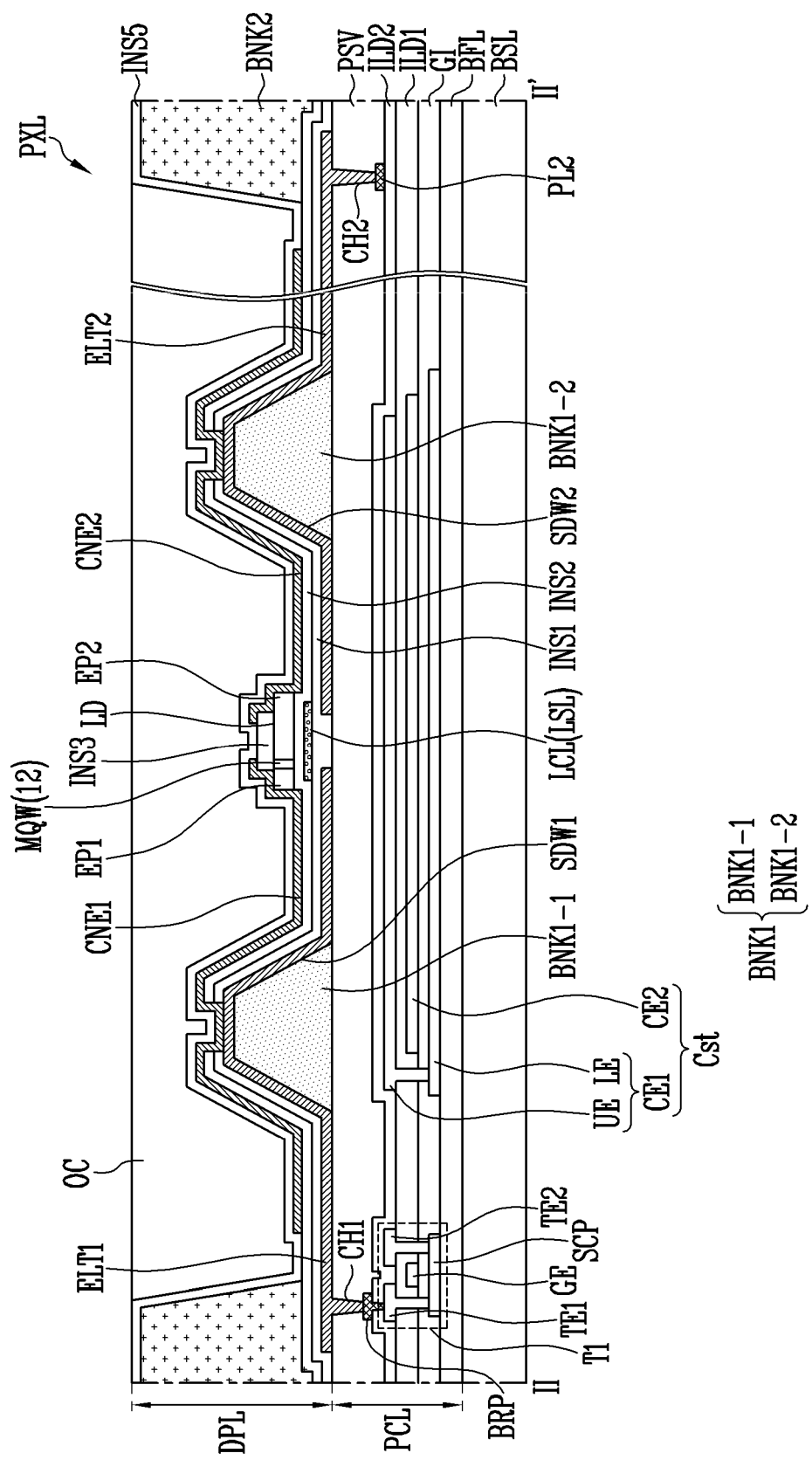
Figure 11A:
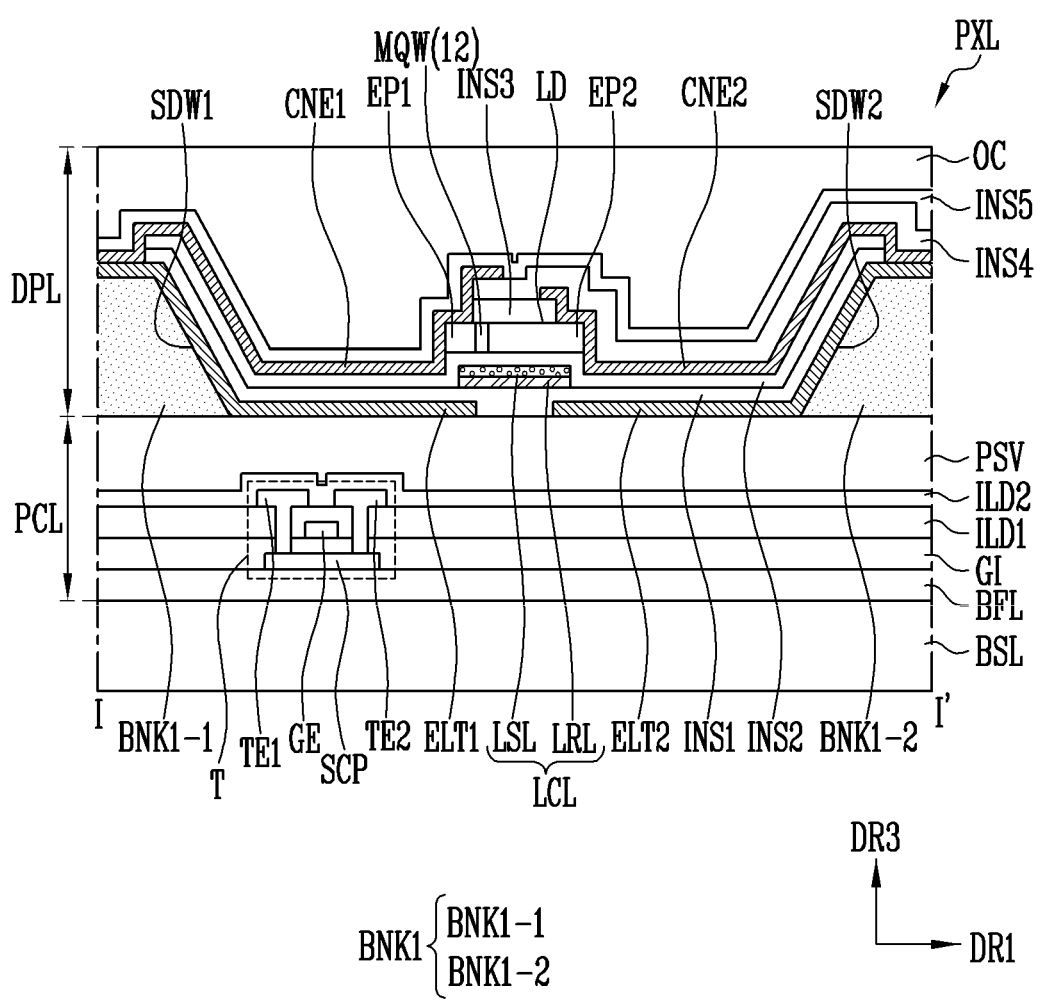
FIGS. 11A-11C are cross-sectional views illustrating a pixel according to one or more example embodiments of the present disclosure.
Figure 11B:
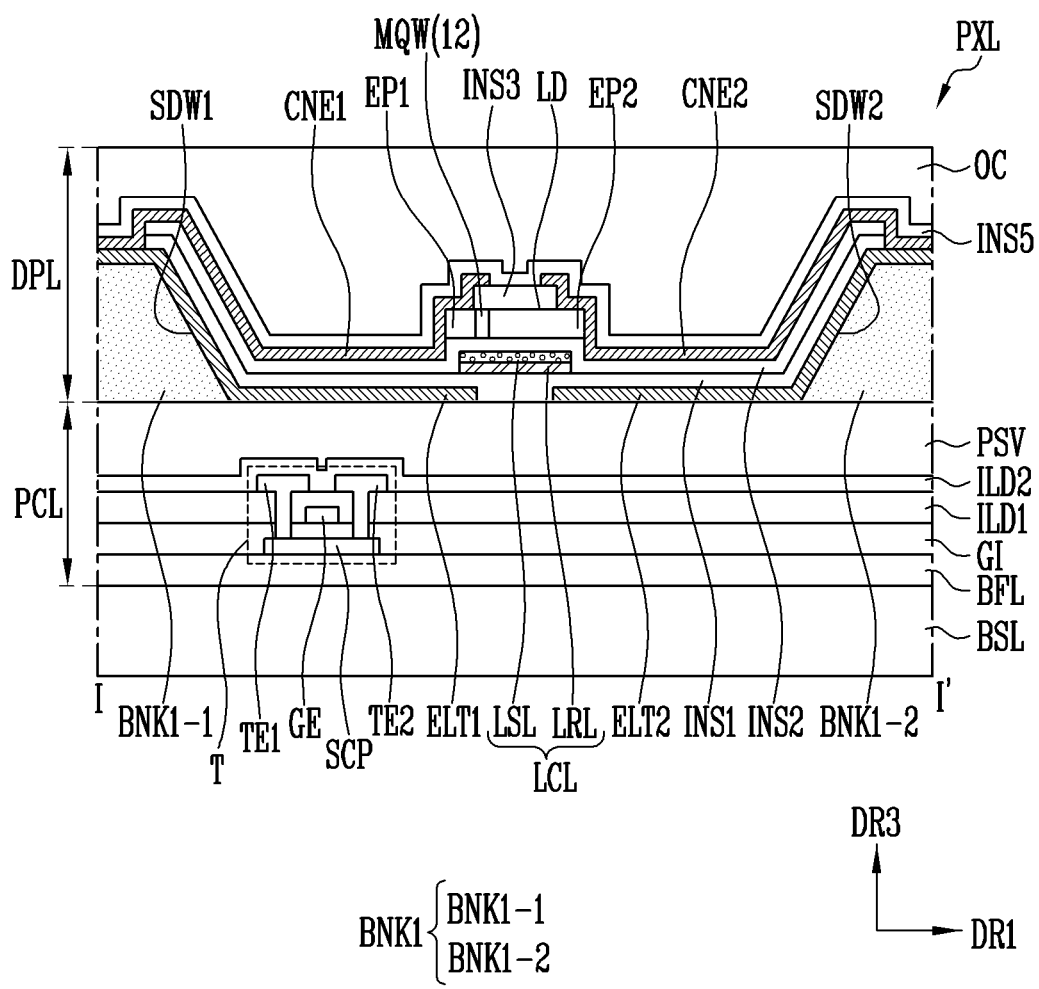
Figure 11C:
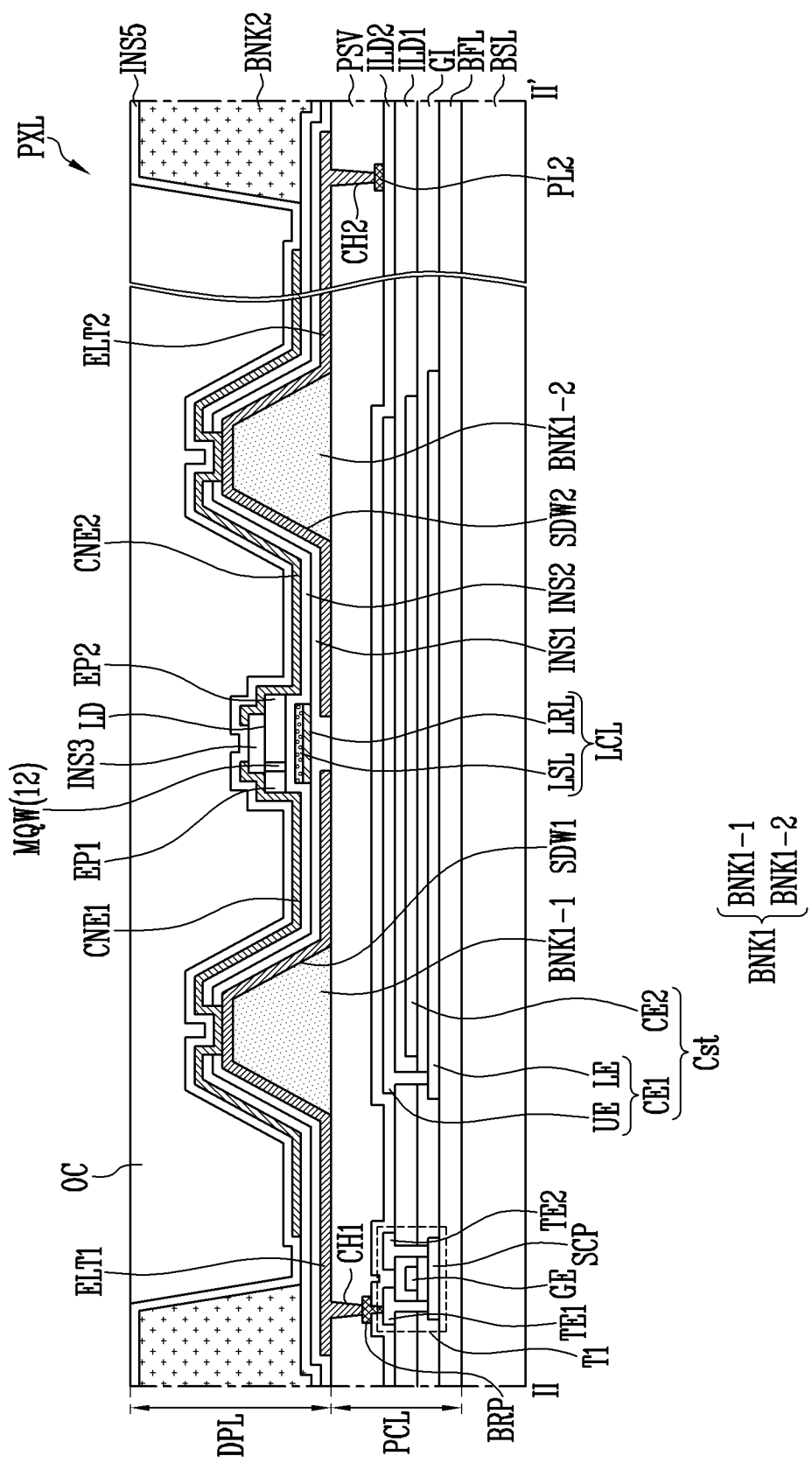

FIGS. 10A-10C, and FIGS. 11A to-11C are cross-sectional views illustrating a pixel PXL according to one or more example embodiments of the disclosure, respectively, and particularly illustrate different embodiments in relation to the light control layer LCL. For example, FIGS. 10A-10C illustrate a change embodiment of the pixel PXL according to the embodiments of FIGS. 9A-9C, respectively. FIGS. 11A-11C illustrate another change embodiment of the pixel PXL according to the embodiments of FIGS. 9A-9C, respectively. In the embodiments of FIGS. 10A-10C and FIGS. 11A-11C, the same reference numerals are assigned to components similar or identical to those of the embodiments described above, and detailed description thereof will be omitted.

First, referring to FIGS. 10A-10C, the light control layer LCL may include a scattering layer LSL of at least one layer. The scattering layer LSL may include at least one type of light scattering particles LSP dispersed in a matrix (e.g., predetermined matrix) material MTX, such as a transparent resin. For example, the scattering layer LSL may include the light scattering particles LSP such as titanium dioxide ($TiO_2$) and/or silica. In some embodiments, the scattering layer LSL may include various types of light scattering particles LSP.

According to the above-described embodiment, by disposing the scattering layer LSL under the light emitting elements LD, the light emitted from the light emitting elements LD downwardly may be recirculated to induce the light to be emitted in the upper direction of the pixel PXL. In the above-described embodiment, the light efficiency of the pixel PXL may be improved more effectively by disposing the scattering layer LSL in the display layer DPL to be positioned closer to the light emitting elements LD.

Referring to FIGS. 11A-11C, the light control layer LCL may be configured of multiple layers including the reflective layer LRL and the scattering layer LSL. For example, the light control layer LCL may include the reflective layer LRL disposed on the first insulating layer INS1, and the scattering layer LSL disposed on the reflective layer LRL.

According to the above-described embodiment, the light emitted from the light emitting elements LD downwardly may be effectively emitted in the upper direction of the pixel PXL by disposing the light control layer LCL including the reflective layer LRL and the scattering layer LSL under the light emitting elements LD.

Figure 12A:
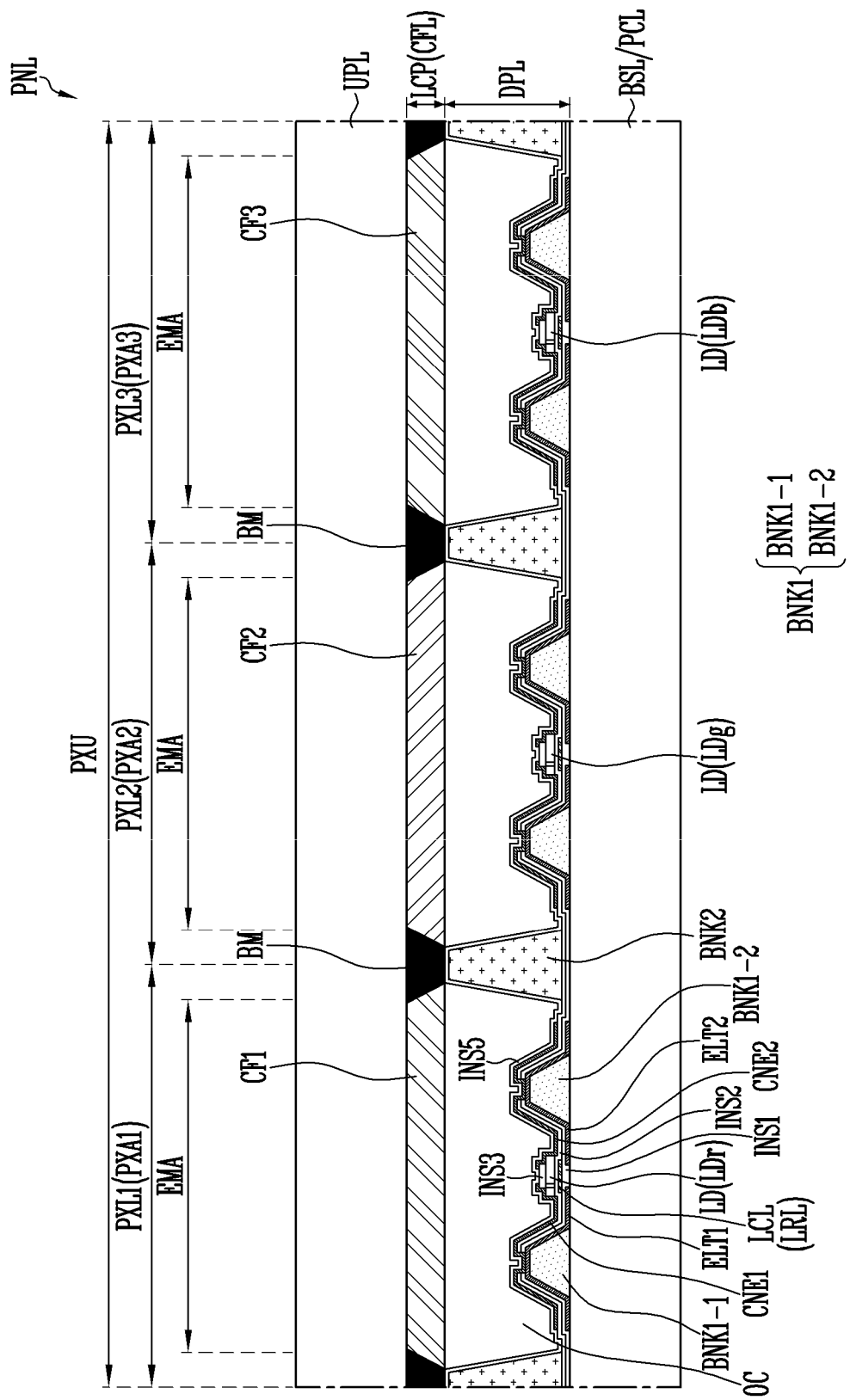
FIGS. 12A and 12B are cross-sectional views illustrating a display device according to one or more example embodiments of the present disclosure.
Figure 12B:
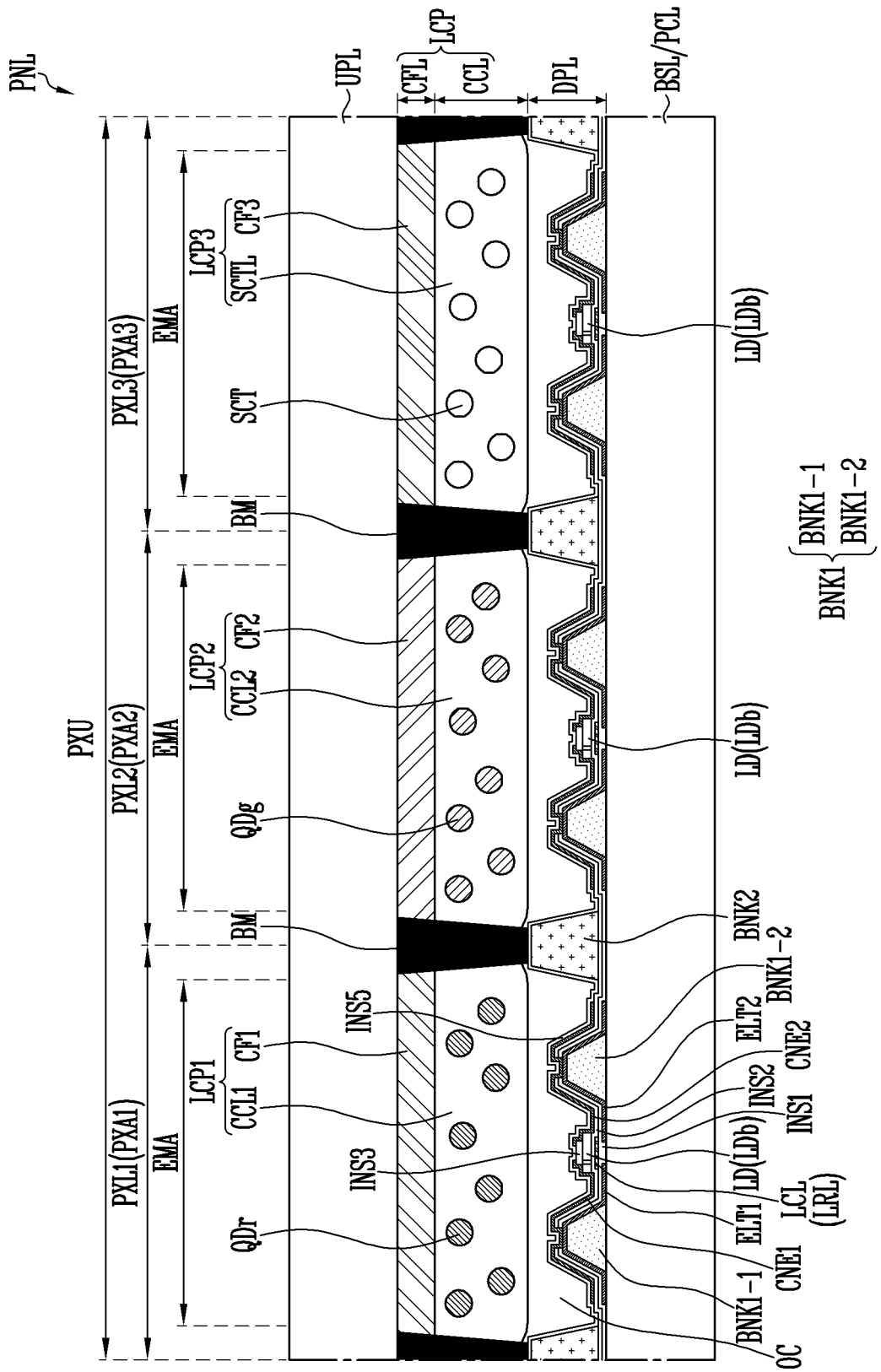

FIGS. 12A and 12B are cross-sectional views illustrating a display device according to one or more example embodiments of the disclosure, respectively. For example, FIGS. 12A and 12B illustrate different embodiments of a cross section of one area of the display panel PNL including the pixel PXL according to the embodiment of FIG. 9B. For example, FIG. 12A discloses an embodiment of the display panel PNL that does not include color conversion particles (for example, red and green quantum dots QDr and QDg), and FIG. 12B discloses an embodiment of the display panel PNL including the color conversion particles. That is, the display device according to the disclosure may selectively include color conversion particles disposed on the pixels PXL.

According to some embodiments, FIG. 12A and FIG. 12B show the cross section of the display panel PNL centering on an area in which any one pixel unit PXU configured of adjacent first color pixel PXL1, second color pixel PXL2, and third color pixel PXL3 is disposed. Because the example structure of each pixel PXL has been described in detail through the above-described embodiments, the structure of each pixel PXL is schematically shown centering on one light emitting element LD in FIGS. 12A and 12B, respectively. In addition, in the embodiments of FIGS. 12A and 12B, the same reference numerals are assigned to components similar or identical to those of the embodiments described above, and detailed description thereof will be omitted.

First, referring to FIGS. 5-12A, the light source unit LSU of each pixel PXL may be disposed in the display layer DPL on the base layer BSL and/or the circuit layer PCL. For example, the light source unit LSU of a corresponding pixel PXL may be disposed in each emission area EMA of the display layer DPL. In some embodiments, the second bank BNK2 partitioning each emission area EMA may be disposed between adjacent emission areas EMA.

The light source unit LSU that may be configured variously according to an one or more example embodiments may be formed in the emission area EMA of each pixel PXL. For example, in each emission area EMA, the first bank BNK1, the first and second electrodes ELT1 and ELT2, the light emitting elements LD, the first and second contacts electrodes CNE1 and CNE2, the first, second, third, and fifth insulating layers INS1, INS2, INS3, and INS5, and light control layer LCL, which are shown in FIG. 9B may be disposed. In addition, the overcoat layer OC may be positioned on the fifth insulating layer INS5.

The first, second, and third color pixels PXL1, PXL2, and PXL3 may include light emitting elements LD that emit light of different colors. For example, each first color pixel PXL1 may include a first color light emitting element LDr, each second color pixel PXL2 may include a second color light emitting element LDg, and each third color pixel PXL3 may include a third color light emitting element LDb. According to some embodiments, the first color light emitting element LDr, the second color light emitting element LDg, and the third color light emitting element LDb may be a red light emitting element, a green light emitting element, and a blue light emitting elements, respectively, but are not limited thereto.

The second bank BNK2 may be disposed in a boundary area of first color, second color, and third color pixel areas PXA1, PXA2, and PXA3 provided with first, second, and third color pixels PXL1, PXL2, and PXL3, respectively, so as to surround the emission area EMA of each pixel PXL. In some embodiments, the second bank BNK2 may be disposed at an edge of the display area DA to surround the display area DA in which the pixels PXL are disposed. Hereinafter, when any pixel area from among the first, second, and third color pixel areas PXA1, PXA2, and PXA3 is referred to or when two or more types of pixel areas are collectively referred to, the pixel area or the two or more types of pixel areas will be referred to as a "pixel area PXA or "pixel areas PXA".

A position (for example, a position of each layer on the cross-section) of the second bank BNK2 or a forming step may be variously changed according to some embodiments. In addition, a shape, a size, a configuration material and/or the like of the second bank BNK2 may be variously changed according to design condition or the like of the display panel PNL. For example, the second bank BNK2 may be a pattern of a single layer or multiple layers having a cross section of various shapes including a trapezoid, a semicircle, a semi-ellipse, or the like, and the size (for example, a width and/or a height) thereof or the configuration material may be variously changed.

According to some embodiments, an upper substrate UPL may be disposed on the pixels PXL. For example, the upper substrate UPL (also referred to as an "encapsulation substrate" or a "color filter substrate") encapsulating at least the display area DA may be disposed on one surface of the base layer BSL on which the pixels PXL are disposed.

The upper substrate UPL may selectively include a light conversion layer LCP overlapping the pixels PXL. For example, a light conversion layer LCP including a color filter layer CFL may be disposed on one surface of the upper substrate UPL facing the pixels PXL.

The color filter layer CFL may include a color filter matching a color of each pixel PXL. For example, the color filter layer CFL may include a first color filter CF1 disposed on the first color pixel PXL1 to selectively transmit light generated in the first color pixel PXL1, a second color filter CF2 disposed on the second color pixel PXL2 to selectively transmit light generated in the second color pixel PXL2, and a third color filter CF3 disposed on the third color pixel PXL3 to selectively transmit light generated in the third color pixel PXL3. In some embodiments, the first color filter CF1, the second color filter CF2, and the third color filter CF3 may be a red color filter, a green color filter, a and blue color filter, respectively, but are not limited thereto. Hereinafter, when any color filter from among the first color filter CF1, the second color filter CF2, and the third color filter CF3 is referred to or when two or more types of color filters are collectively referred to, any color filter or the two or more types of color filters will be referred to as a "color filter CF" or "color filters CF".

The first color filter CF1 may include a color filter material disposed between the first color pixel PXL1 and the upper substrate UPL and selectively transmitting light of a first color generated in the first color pixel PXL1. For example, when the first color pixel PXL1 is a red pixel, the first color filter CF1 may include a red color filter material.

The second color filter CF2 may include a color filter material disposed between the second color pixel PXL2 and the upper substrate UPL and selectively transmitting light of a second color generated in the second color pixel PXL2. For example, when the second color pixel PXL2 is a green pixel, the second color filter CF2 may include a green color filter material.

The third color filter CF3 may include a color filter material disposed between the third color pixel PXL3 and the upper substrate UPL and selectively transmitting light of a third color generated in the third color pixel PXL3. For example, when the third color pixel PXL3 is a blue pixel, the third color filter CF3 may include a blue color filter material.

A black matrix BM may be disposed between the color filters CF (e.g., adjacent color filters from among CF1, CF2, and CF3). For example, the black matrix BM may be disposed on one surface of the upper substrate UPL to face the second bank BNK2. The black matrix BM may be disposed in a boundary area of the pixel areas PXA so as not to cover each emission area EMA.

The black matrix BM may include at least one black matrix material (for example, currently known at least one light-blocking material) from among various suitable types of black matrix materials, a color filter material of a specific color, and/or the like. In some embodiments, the black matrix BM may be formed of the same material as the second bank BNK2, but is not limited thereto. The black matrix BM and the second bank BNK2 may include the same or different materials.

In some embodiments, a space between a lower panel of the display panel PNL including the base layer BSL, the display layer DPL, and the like, and an upper panel of the display panel PNL including the upper substrate UPL, the light conversion layer LCP, and the like may be filled with the overcoat layer OC having a relatively low refractive index of a range of about 1 to 1.6. In another embodiment, the space between the lower panel and the upper panel of the display panel PNL may be filled with an air layer.

FIG. 12A discloses an embodiment in which the upper substrate UPL is disposed on the base layer BSL on which the pixels PXL are disposed, but the disclosure is not limited thereto. For example, the pixels PXL may be sealed using a thin film encapsulation layer or the like. In this case, the color filters CF and/or the black matrix BM may be selectively included in a window (not shown) or the line disposed on the display panel PNL.

Referring to FIG. 12B, the upper substrate UPL may include the light conversion layer LCP overlapping the pixels PXL. The light conversion layer LCP may include the color filter layer CFL and/or a color conversion layer CCL disposed on the upper substrate UPL to face the pixels PXL. The color conversion layer CCL may be disposed between the color filter layer CFL and the pixels PXL, and may include respective color conversion particles.

The light conversion layer LCP may include a first light conversion layer LCP1 disposed on the first color pixel PXL1, a second light conversion layer LCP2 disposed on the second color pixel PXL2, and a third light conversion layer LCP3 disposed on the third color pixel PXL3. Hereinafter, when any light conversion layer from among the first light conversion layer LCP1, the second light conversion layer LCP2, and the third light conversion layer LCP3 is referred to or two or more types of light conversion layers are comprehensively referred to, any light conversion layer or the two or more types of light conversion layers will be referred to as a "light conversion layer LCP" or "light conversion layers LCP".

At least some of the first, second, and third light conversion layers LCP1, LCP2, and LCP3 may include the color conversion layer CCL and/or the color filter layer CFL corresponding to a color (e.g., a predetermined color). For example, the first light conversion layer LCP1 may include at least one of a first color conversion layer CCL1 including first color conversion particles corresponding to the first color, and a first color filter CF1 selectively transmitting light of the first color. Similarly, the second light conversion layer LCP2 may include at least one of a second color conversion layer CCL2 including second color conversion particles corresponding to the second color, and a second color filter CF2 selectively transmitting light of the second color. The third light conversion layer LCP3 may include at least one of a scattering layer SCTL including light scattering particles SCT, and a third color filter CF3 selectively transmitting light of the third color.

In some embodiments, an insulating layer of at least one layer, which is not shown, may be disposed on a surface of each of the first color conversion layer CCL1, the second color conversion layer CCL2, and/or the scattering layer SCTL. For example, each insulating layer (for example, a capping layer, a buffer layer, and/or a barrier layer) for protecting the first color conversion layer CCL1, the second color conversion layer CCL2, and/or the scattering layer SCTL may be disposed between the first color conversion layer CCL1, the second color conversion layer CCL2 and/or the scattering layer SCTL, and each color filter CF (e.g., CF1, CF2, CF3), and/or on the surface of each of the first color conversion layer CCL1, the second color conversion layer CCL2, and/or the scattering layer SCTL.

In some embodiments, the first, second, and third color pixels PXL1, PXL2, and PXL3 may include light emitting elements LD that emit light of the same color. For example, the first color, second color, and third color pixels PXL1, PXL2, and PXL3 may include third color light emitting elements LDb that emit blue light belonging to a wavelength band of about 400 nm to 500 nm. In some embodiments, the color conversion layer CCL including at least one type of color conversion particles may be disposed on at least some of the pixels PXL from among the first color, second color, and third color pixels PXL1, PXL2, and PXL3. Therefore, the display device according to some embodiments of the disclosure may display a full-color image.

The first color conversion layer CCL1 may include first color conversion particles disposed on one surface of the upper substrate UPL to face the first color pixel PXL1 and converting the light of the third color emitted from the third color light emitting element LDb disposed in the first color pixel PXL1 into the light of the first color. For example, when the third color light emitting element LDb disposed in the first color pixel PXL1 is a blue light emitting element emitting the blue light and the first color pixel PXL1 is the red pixel, the first color conversion layer CCL1 may include a red quantum dot QDr that converts the blue light emitted from the blue light emitting element into the red light.

For example, the first color conversion layer CCL1 may include a plurality of red quantum dots QDr dispersed in a matrix material (e.g., a predetermined matrix material) such as a transparent resin. The red quantum dot QDr may absorb blue light and shift a wavelength according to an energy transition to emit red light of a wavelength band of about 620 nm to 780 nm. When the first color pixel PXL1 is a pixel of another color, the first color conversion layer CCL1 may include a first quantum dot corresponding to the color of the first color pixel PXL1.

According to some embodiments, the second color conversion layer CCL2 may include second color conversion particles disposed on one surface of the upper substrate UPL to face the second color pixel PXL2 and converting the light of the third color emitted from the light emitting element LDb disposed in the second color pixel PXL2 into the light of the second color. For example, when the third color light emitting element LDb disposed on the second color pixel PXL2 is the blue light emitting element that emits the blue light and the second color pixel PXL2 is the green pixel, the second color conversion layer CCL2 may include a green quantum dot QDg that converts the blue light emitted from the blue light emitting element into the green light.

For example, the second color conversion layer CCL2 may include a plurality of green quantum dots QDg dispersed in a matrix material (e.g., a predetermined matrix material) such as a transparent resin. The green quantum dot QDg may absorb blue light and shift a wavelength according to an energy transition to emit green light of a wavelength band of about 500 nm to 570 nm. When the second color pixel PXL2 is a pixel of another color, the second color conversion layer CCL2 may include a second quantum dot corresponding to the color of the second color pixel PXL2.

Each of the first quantum dot and the second quantum dot (for example, the red quantum dot QDr and the green quantum dot QDg) may be selected from Group II-IV compound, Group IV-VI compound, an Group IV element, Group IV compound, and a combination thereof, but is not limited thereto.

The first quantum dot and the second quantum dot may have a full width of half maximum (FWHM) of an emission wavelength spectrum of about 45 nm or less, and light emitted through the first quantum dot and the second quantum dot may be emitted in all directions. Accordingly, a viewing angle of the display device may be improved.

The first quantum dot and the second quantum dot may have a shape such as a spherical, pyramidal, multi-arm, or cubic nano particle, nano tube, nano wire, nano fiber, and nano plate-like particle, but is not limited thereto. That is, the shape of the first quantum dot and the second quantum dot may be variously changed.

In some embodiments of the disclosure, the blue light having a relatively short wavelength in a visible region is incident on each of the red quantum dot QDr and the green quantum dot QDg, and thus an absorption coefficient of the red quantum dot QDr and the green quantum dot QDg may be increased. Accordingly, finally, efficiency of light emitted from the first color pixel PXL1 and the second color pixel PXL2 may be increased, and excellent color reproducibility may be secured. In some embodiments, manufacturing efficiency of the display device may be increased by configuring the light source unit LSU of the first color, second color, and third color pixels PXL1, PXL2, and PXL3 using the light emitting elements LD (for example, the third color light emitting elements LDb) of the same color.

According to some embodiments, the scattering layer SCTL may be disposed on one surface of the upper substrate UPL to face the third color pixel PXL3. For example, the scattering layer SCTL may be disposed between the third color pixel PXL3 and the third color filter CF3.

According to some embodiments, when the third color light emitting element LDb disposed in the third color pixel PXL3 is the blue light emitting element emitting the blue light and the third color pixel PXL3 is the blue pixel, the scattering layer SCTL may be selectively provided to efficiently use the light emitted from the third color light emitting element LDb. The scattering layer SCTL may include at least one type of light scattering particles SCT.

For example, the scattering layer SCTL may include a plurality of light scattering particles SCT dispersed in a matrix material (e.g., predetermined matrix material). In some embodiments, when the light control layer LCL includes the scattering layer LSL of FIGS. 10A-11C, the scattering layer SCTL may include light scattering particles SCT of a type identical to or different from that of the scattering layer LSL of the light control layer LCL. For example, the scattering layer SCTL may include the light scattering particles SCT such as titanium dioxide ($TiO_2$) or silica, but is not limited thereto. Meanwhile, the light scattering particles SCT may not be required to be disposed only in the third pixel area PXA3. For example, the light scattering particles SCT may be selectively included in the first color conversion layer CCL1 and/or the second color conversion layer CCL2.

In some embodiments, the black matrix BM may be extended at least in a thickness (or height) direction so as to be disposed between the first color conversion layer CCL1, the second color conversion layer CCL2, and the scattering layer SCTL. For example, the black matrix BM may be a pattern of a single layer or multiple layers having a thickness (for example, a thickness substantially identical or similar to a total thickness of the light conversion layer LCP) corresponding to the total thickness of the light conversion layer LCP including the color filter layer CFL and the color conversion layer CCL. When the black matrix BM is disposed between the first color conversion layer CCL1, the second color conversion layer CCL2, and the scattering layer SCTL in a shape capable of partitioning an area in which the first color conversion layer CCL1, the second color conversion layer CCL2, and the scattering layer SCTL are formed, the first color conversion layer CCL1, the second color conversion layer CCL2, and/or the scattering layer SCTL may be formed through an inkjet method or the like.

According to the embodiment of FIG. 12B, the pixels PXL and the display device having the same may be easily manufactured using the light emitting elements LD (for example, the third color light emitting elements LDb) of a single color. In some embodiments, the color conversion layer CCL is disposed on at least some of the pixels PXL, and thus the pixel unit PXU of a full-color and the display device having the same may be manufactured.

Although the technical spirit of the disclosure has been described in detail in accordance with the above-described embodiments, it should be noted that the above-described embodiments are for the purpose of description and not of limitation. In addition, those skilled in the art may understand that various modifications are possible within the scope of the technical spirit of the disclosure.

The scope of the disclosure is not limited to the details described in the detailed description of the specification, but should be defined by the claims and their equivalents. In addition, it is to be construed that all changes or modifications derived from the meaning and scope of the claims and equivalent concepts thereof are included in the scope of the disclosure.

What is claimed is:

1. A display device comprising a pixel located in a display area, the pixel comprising:
   a first electrode and a second electrode spaced from each other above a base layer;
   a first insulating layer above the first electrode and the second electrode;
   a light control layer above the first insulating layer;
   a second insulating layer above the light control layer; and
   a light emitting element above the second insulating layer, overlapping the light control layer, and overlapping an area between the first electrode and the second electrode.

2. The display device according to claim 1, wherein the light control layer is located under the light emitting element and overlapping at least an active layer of the light emitting element.

3. The display device according to claim 1, wherein the light control layer has a width greater than a distance between the first electrode and the second electrode.

4. The display device according to claim 1, wherein the second insulating layer has a thickness equal to or greater than a thickness of the light control layer, the second insulating layer completely covering the light control layer.

5. The display device according to claim 1, wherein the light control layer comprises a reflective layer.

6. The display device according to claim 5, wherein the reflective layer comprises a floated metal pattern.

7. The display device according to claim 5, wherein the reflective layer comprises at least one of aluminum (Al), gold (Au), and silver (Ag).

8. The display device according to claim 1, wherein the light control layer comprises a scattering layer comprising at least one type of light scattering particles.

9. The display device according to claim 1, wherein the light control layer comprises:
   a reflective layer on the first insulating layer; and
   a scattering layer on the reflective layer.

10. The display device according to claim 1, wherein the light emitting element comprises a first end portion adjacent to the first electrode and a second end portion adjacent to the second electrode, and
    wherein the pixel further comprises a third electrode connecting the first end portion of the light emitting element to the first electrode, and a fourth electrode connecting the second end portion of the light emitting element to the second electrode.

11. The display device according to claim 10, further comprising at least one of:
    a third insulating layer locally placed on one area of the light emitting element to expose the first end portion and the second end portion of the light emitting element;
    a fourth insulating layer on the third insulating layer and the fourth electrode; and
    a fifth insulating layer on the first to fourth electrodes and the light emitting element.

12. The display device according to claim 1, further comprising at least one of:
    a first bank under one area of each of the first electrode and the second electrode; and
    a second bank surrounding an emission area of the pixel, the light emitting element being in the emission area.

13. The display device according to claim 1, further comprising a circuit layer interposed between the base layer and the first and second electrodes, the circuit layer comprising a circuit element connected to the light emitting element.

14. A pixel comprising:
    a first electrode and a second electrode spaced from each other;
    a first insulating layer above the first electrode and the second electrode;
    a light control layer above the first insulating layer;
    a second insulating layer above the light control layer; and
    a light emitting element above the second insulating layer, overlapping the light control layer, and overlapping an area between the first electrode and the second electrode.

15. The pixel according to claim 14, wherein the light control layer comprises a reflective layer.

16. The pixel according to claim 14, wherein the light control layer comprises a scattering layer comprising at least one type of light scattering particles.

17. The pixel according to claim 14, wherein the light control layer comprises:
    a reflective layer on the first insulating layer; and
    a scattering layer on the reflective layer.

* * * * *